(12) United States Patent
Murai et al.

(10) Patent No.: US 11,217,641 B2
(45) Date of Patent: Jan. 4, 2022

(54) DISPLAY UNIT AND LIGHT EMISSION UNIT

(71) Applicant: JOLED INC., Tokyo (JP)

(72) Inventors: Atsuhito Murai, Tokyo (JP); Jiro Yamada, Tokyo (JP); Yasuhiro Terai, Tokyo (JP); Masahiko Kondo, Tokyo (JP); Noriteru Maeda, Tokyo (JP)

(73) Assignee: JOLED INC., Tokyo (JP)

( * ) Notice: Subject to any disclaimer, the term of this patent is extended or adjusted under 35 U.S.C. 154(b) by 234 days.

(21) Appl. No.: 16/209,968

(22) Filed: Dec. 5, 2018

(65) Prior Publication Data

US 2019/0229163 A1 Jul. 25, 2019

(30) Foreign Application Priority Data

Jan. 24, 2018 (JP) .............................. JP2018-009713
Apr. 10, 2018 (JP) .............................. JP2018-075472
Apr. 10, 2018 (JP) .............................. JP2018-075473

(51) Int. Cl.
*H01L 27/32* (2006.01)
*H01L 51/52* (2006.01)
(Continued)

(52) U.S. Cl.
CPC ........ *H01L 27/3246* (2013.01); *H01L 27/326* (2013.01); *H01L 27/3216* (2013.01); *H01L 27/3218* (2013.01); *H01L 27/3248* (2013.01); *H01L 27/3258* (2013.01); *H01L 51/52* (2013.01); *H01L 51/5209* (2013.01); *H01L 51/56* (2013.01); *H01L 27/1244* (2013.01);
(Continued)

(58) Field of Classification Search
None
See application file for complete search history.

(56) References Cited

U.S. PATENT DOCUMENTS 6,366,025 B1 4/2002 Yamada
7,842,974 B2 * 11/2010 Zhu .......................... H01L 29/08
257/201

(Continued)

FOREIGN PATENT DOCUMENTS

EP 2840611 A2 2/2015
EP 3026725 A1 6/2016
(Continued)

OTHER PUBLICATIONS

Extended European Search Report in EP Application No. 18210054.5, dated Oct. 4, 2019. 22pp.

*Primary Examiner* — Nishath Yasmeen
(74) *Attorney, Agent, or Firm* — Hauptman Ham, LLP

(57) ABSTRACT

A display unit includes multiple pixels, a first electrode, a partition wall, a light emission layer, and a second electrode. The multiple pixels each have a light emission region and a non-light emission region along a first direction. The first electrode is provided in the light emission region in each of the multiple pixels. The partition wall is provided between each two of the pixels that are adjacent to each other in a second direction. The second direction intersects the first direction. The light emission layer covers the first electrode and is provided in the light emission region and the non-light emission region in a continuous manner. The second electrode faces the first electrode across the light emission layer.

20 Claims, 45 Drawing Sheets

(51) Int. Cl.
*H01L 51/56* (2006.01)
*H01L 27/12* (2006.01)

(52) U.S. Cl.
CPC .... *H01L 27/1248* (2013.01); *H01L 2227/323* (2013.01); *H01L 2251/5392* (2013.01)

(56) References Cited

U.S. PATENT DOCUMENTS

| | | |
|---|---|---|
| 2003/0132927 A1 | 7/2003 | Ouchi et al. |
| 2011/0215329 A1 | 9/2011 | Chung |
| 2011/0272675 A1* | 11/2011 | Chung ............... H01L 27/3246 257/40 |
| 2012/0267611 A1 | 10/2012 | Chung et al. |
| 2014/0225078 A1 | 8/2014 | Jeung et al. |
| 2014/0225815 A1* | 8/2014 | Jung ..................... G09G 5/02 345/83 |
| 2014/0307430 A1 | 10/2014 | Lo et al. |
| 2015/0028298 A1 | 1/2015 | Chung et al. |
| 2015/0108455 A1* | 4/2015 | Jung .................... H01L 27/326 257/40 |
| 2015/0357384 A1 | 12/2015 | Li et al. |
| 2016/0172424 A1* | 6/2016 | Hosono ............... H01L 27/3246 257/40 |
| 2016/0315133 A1 | 10/2016 | Sato |
| 2017/0005154 A1 | 1/2017 | You et al. |
| 2017/0047385 A1* | 2/2017 | Teng ................... H01L 27/3246 |
| 2017/0301889 A1 | 10/2017 | Hayashida et al. |
| 2018/0012942 A1 | 1/2018 | Adachi |

FOREIGN PATENT DOCUMENTS

| | | |
|---|---|---|
| JP | 2001290441 A | 10/2001 |
| JP | 2011-49028 A | 3/2011 |
| JP | 2011-60592 A | 3/2011 |
| JP | 2015-79758 A | 4/2015 |
| JP | 2016115472 A | 6/2016 |
| JP | 2016207486 A | 12/2016 |
| JP | 20185111 A | 1/2018 |
| KR | 10-2011-0100956 A | 9/2011 |
| KR | 10-2014-0087914 A | 7/2014 |
| KR | 1020140082090 A | 7/2014 |
| KR | 10-2014-0148181 A | 12/2014 |
| KR | 1020150061920 A | 6/2015 |
| KR | 10-2017-0022587 A | 3/2017 |
| KR | 10-2017-0031273 A | 3/2017 |
| WO | 2016047021 A1 | 3/2016 |

* cited by examiner

DISPLAY UNIT AND LIGHT EMISSION UNIT

CROSS REFERENCE TO RELATED APPLICATIONS

This application claims the benefit of Japanese Priority Patent Application Nos. 2018-009713 filed on Jan. 24, 2018, 2018-075472 filed on Apr. 10, 2018, and 2018-075473 filed on Apr. 10, 2018, the entire contents of each of which are incorporated herein by reference.

BACKGROUND

The technology relates to a display unit and a light emission unit that include a light emission element, such as an organic electro luminescence (EL) element.

Various types of light emission units using an organic electro luminescence element have been developed. Such a light emission unit is disclosed in, for example, Japanese Unexamined Patent Applications Publication Nos. 2011-049028 and 2011-060592. Meanwhile, a display unit that includes pixels each having a light emission region and a non-light emission region has also been developed. Such a display unit is disclosed in, for example, Japanese Unexamined Patent Application Publication No. 2015-079758. The non-light emission region has a visible-light transmissivity that is higher than that of the light emission region. Light that is generated by the light emission element is extracted from the light emission region, whereas, for example, outside light is extracted from the non-light emission region.

SUMMARY

The display unit is requested to provide a sufficient amount of light from the light emission region of each pixel. In view of this, it is desirable to provide a display unit that provides a sufficient amount of light from a light emission region of each pixel.

Meanwhile, the light emission unit is requested to have decreased display unevenness such as luminance unevenness and color reproduction unevenness. In view of this, it is also desirable to provide a light emission unit having decreased display unevenness.

The light emission unit may have a light transmission region that is provided in a display region to transmit light entering from a back of a display. In this case, an optical diffraction failure tends to occur in a light emission unit having high definition. From this point of view, it is also desirable to provide a light emission unit that is less prone to optical diffraction failure.

A display unit according to an embodiment of the disclosure includes multiple pixels, a first electrode, a partition wall, a light emission layer, and a second electrode. The multiple pixels each have a light emission region and a non-light emission region along a first direction. The first electrode is provided in the light emission region in each of the multiple pixels. The partition wall is provided between each two of the pixels that are adjacent in a second direction. The second direction intersects the first direction. The light emission layer covers the first electrode and is provided in the light emission region and the non-light emission region in a continuous manner. The second electrode faces the first electrode across the light emission layer.

A light emission unit according to an embodiment of the disclosure includes multiple display pixels that are arranged in a matrix on a substrate. Each of the display pixels includes multiple subpixels that emit light of colors different from one another. Each of the subpixels has a light emission region, a visible-light transmission region, and a light emission layer. The light emission region faces a pixel electrode. The visible-light transmission region is provided in a periphery of the light emission region. The light emission layer is provided across the light emission region and the visible-light transmission region. The visible-light transmission region is located relative to the light emission region in a first array direction of the multiple display pixels, in each of the subpixels.

A light emission unit according to an embodiment of the disclosure includes multiple color pixels that are arranged in a matrix on a substrate. Each of the color pixels includes multiple subpixels and includes multiple non-light emission pixels. The multiple subpixels emit light of colors different from one another. The multiple non-light emission pixels each have a visible-light transmission region. One or more of the subpixels and one or more of the non-light emission pixels are alternately arranged on a color pixel basis in a first array direction of the multiple color pixels. One or more of the subpixels and one or more of the non-light emission pixels are alternately arranged in a unit of two color pixels in a second array direction of the multiple color pixels.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

FIG. 8 is a flowchart illustrating a process procedure of an example manufacturing method of the display unit illustrated in FIG. 1, for example, in.

DETAILED DESCRIPTION

Figure 1:
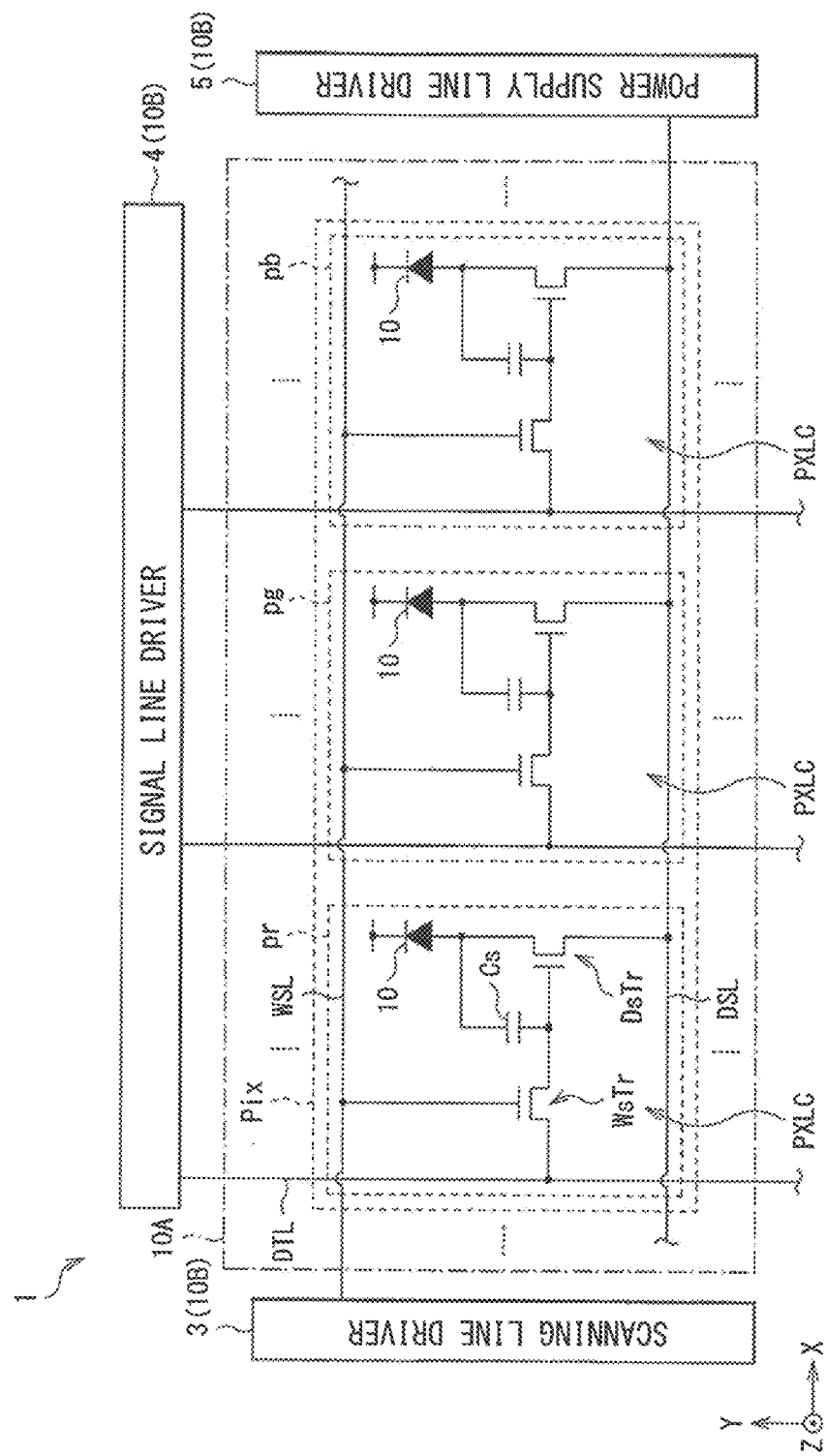
FIG. 1 is a block diagram illustrating an overall configuration of a display unit according to one embodiment of the disclosure.

Some example embodiments of the disclosure are described below in detail with reference to the accompanying drawings. It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail.

1. First Example Embodiment

First, a display unit 1 according to a first example embodiment of the disclosure will now be described in detail with reference to the drawings. Note that the description is given in the following order.

1. Example Embodiment (Display unit including a light emission layer that is provided in a light emission region and a non-light emission region in a continuous manner)
2. Modification Example (Example having a short-circuit prevention layer in the vicinity of a boundary between the light emission region and the non-light emission region)
3. Application Example (Example electronic apparatus)

[Configuration]

FIG. 1 schematically illustrates an overall configuration of the display unit 1 according to an embodiment of the technology. The display unit 1 may be, for example, an organic electroluminescence (EL) display using an organic EL element 10. The display unit 1 may be of a top emission type that outputs, for example, light of any of R (red), G (green), and B (blue) through a top face side. The display unit 1 may include a display region 10A in the middle and a peripheral region 10B outside the display region 10A.

The display region 10A may include multiple pixels pr, pg, and pb that are arranged two-dimensionally. The display region 10A may display an image, by means of, for example, an active matrix scheme, on the basis of an external image signal. The peripheral region 10B may include a circuit section that drives the display region 10A, for example. The circuit section may include a scanning line driver 3, a signal line driver 4, and a power supply line driver 5. There may be provided, across from the display region 10A to the peripheral region 10B, multiple scanning lines WSL each extending in a row direction of pixel arrangement, multiple signal lines DTL each extending in a column direction, and multiple power supply lines DSL each extending in the row direction. Each of the pixels pr, pg, and pb may be electrically coupled to the scanning line driver 3, the signal line driver 4, and the power supply line driver 5 via, respectively, the scanning line WSL, the signal line DTL, and the power supply line DSL. The pixels pr, pg, and pb may each correspond to a subpixel, for example. A set of the pixels pr, pg, and pb may configure one pixel Pix in the embodiment of the technology.

Figure 2:
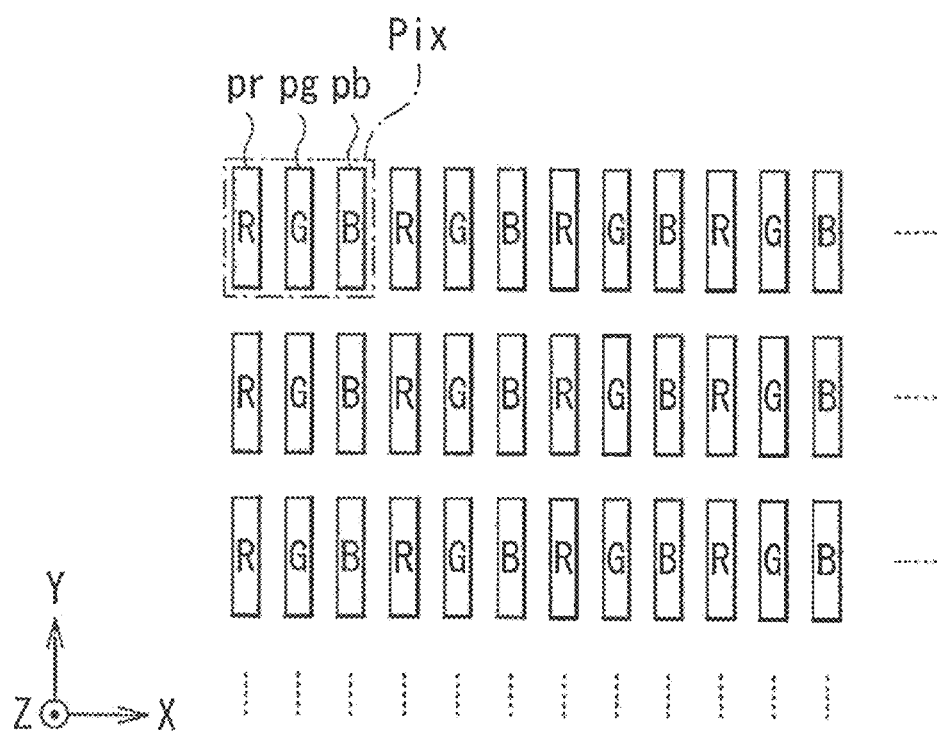
FIG. 2 is a schematic diagram illustrating arrangement of pixels illustrated in FIG. 1.

FIG. 2 illustrates an example planar configuration of the pixel Pix, which includes the pixels pr, pg, and pb, illustrated in FIG. 1. The pixels pr, pg, and pb may each have a rectangular surface, for example, and may be arranged in a stripe form as a whole. Pixels of the same emission color may be arranged in a direction along a long side of each of the rectangular pixels pr, pg, and pb. The direction along the long side may be a column direction along a Y-axis in FIG. 2. The pixel pr may display a red color (R), for example. The pixel pg may display a green color (G), for example. The pixel pb may display a blue color (B), for example. The pixels pr, pg, and pb may each include a pixel circuit PXLC that includes the organic EL element 10, as illustrated in FIG. 1.

Hereinafter, the pixels pr, pg, and pb are each referred as a "pixel P" for description in a case where no distinction is necessary.

The pixel circuit PXLC may control light emission and light extinction in each of the pixels pr, pg, and pb. The pixel circuit PXLC may include the organic EL element 10, a storage capacitor Cs, a switching transistor WsTr, and a drive transistor DsTr, for example. Note that, in the embodiment of the technology, the pixel circuit PXLC includes a circuit configuration of 2Tr1C; however, the configuration of the pixel circuit PXLC is not limited thereto. The pixel circuit PXLC may have a circuit configuration that includes components such as various capacitors and transistors in addition to the 2Tr1C circuit.

The switching transistor WsTr may control application of an image signal or a signal voltage to a gate electrode of the drive transistor DsTr. In one embodiment of the technology, the switching transistor WsTr may sample a signal voltage of the signal line DTL in response to a voltage applied to the scanning line WSL and may write the signal voltage into the gate electrode of the drive transistor DsTr. The drive transistor DsTr may be coupled in series to the organic EL element 10 to control a current that flows to the organic EL element 10 in response to the magnitude of the signal voltage sampled by the switching transistor WsTr. The drive transistor DsTr and the switching transistor WsTr may be each an n-channel MOS or p-channel MOS thin film transistor (TFT), for example. The drive transistor DsTr and the switching transistor WsTr may be each a single-gate transistor or a dual-gate transistor. The storage capacitor Cs may hold a predetermined voltage between the gate electrode and a source electrode of the drive transistor DsTr.

The switching transistor WsTr may have a gate electrode that is coupled to the scanning line WSL. The switching transistor WsTr may have a source electrode and a drain electrode; one of the source electrode and the drain electrode may be coupled to the signal line DTL, and the other may be coupled to the gate electrode of the drive transistor DsTr. The drive transistor DsTr has the source electrode and a drain electrode; one of the source electrode and the drain electrode may be coupled to the power supply line DSL, and the other may be coupled to an anode of the organic EL element 10. The anode of the organic EL element 10 may correspond to a "first electrode 14" described below. The storage capacitor Cs may be interposed between the gate electrode of the drive transistor DsTr and an electrode adjacent to the organic EL element 10.

The scanning line WSL may supply a selection pulse to each of the pixels P. The selection pulse may serve to select, on a row basis, multiple pixels P arranged in the display region 10A. The scanning line WSL may be coupled to an unillustrated output terminal of the scanning line driver 3 and to the gate electrode of the switching transistor WsTr described below. The signal line DTL may supply, to each of the pixels P, a signal pulse in response to the image signal. The signal pulse may include a signal potential Vsig and a reference potential Vofs. The signal line DTL may be coupled to an unillustrated output terminal of the signal line driver 4 and to the source electrode or the drain electrode of the switching transistor WsTr described below. The power supply line DSL may supply, to each of the pixels P, a fixed potential (Vcc) as power. The power supply line DSL may be coupled to an unillustrated output terminal of the power supply line driver 5 and to the source electrode or the drain electrode of the drive transistor DsTr described below. The organic EL element 10 has a cathode, which corresponds to a second electrode 17 described below in the embodiment of the technology, and the cathode may be coupled to a common potential line, which corresponds to a cathode line.

The scanning line driver 3 may output a predetermined selection pulse to each of the scanning lines WSL line-sequentially, thereby causing each of the pixels P to execute each of operations such as anode reset, Vth compensation, writing of the signal potential Vsig, mobility compensation, and light emission operation at predetermined timings. The signal line driver 4 may generate an analog image signal corresponding to the external digital image signal and may output the generated analog image signal to each of the signal lines DTL. The power supply line driver 5 may output a fixed potential to each of the power supply lines DSL. The scanning line driver 3, the signal line driver 4, and the power supply line driver 5 may be controlled to operate in conjunction with one another, on the basis of a timing control signal transmitted from an unillustrated timing controller. A digital image signal transmitted from an external device may be corrected by an unillustrated image signal receiver, and the resultant digital image signal may be transmitted to the signal line driver 4.

Description is given below of an example structure of the display unit 1.

Figure 3:
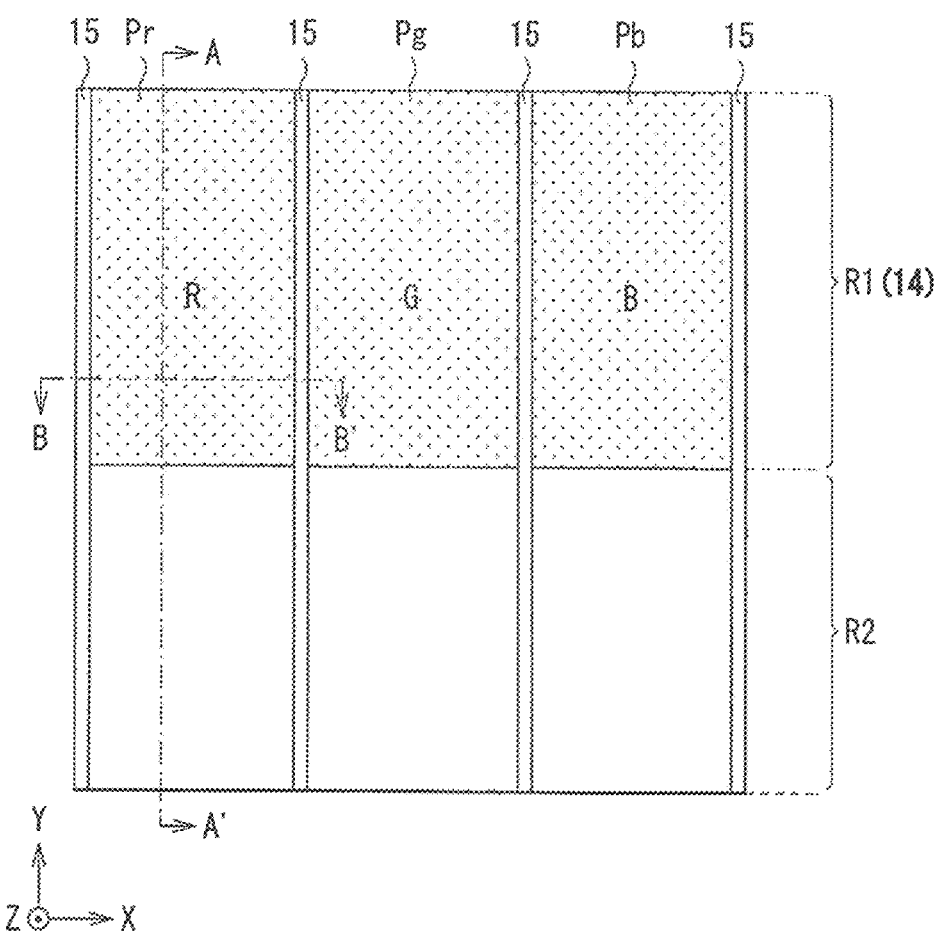
FIG. 3 is a schematic plan view illustrating an example detailed structure of the pixel illustrated in FIG. 2.
Figure 4A:
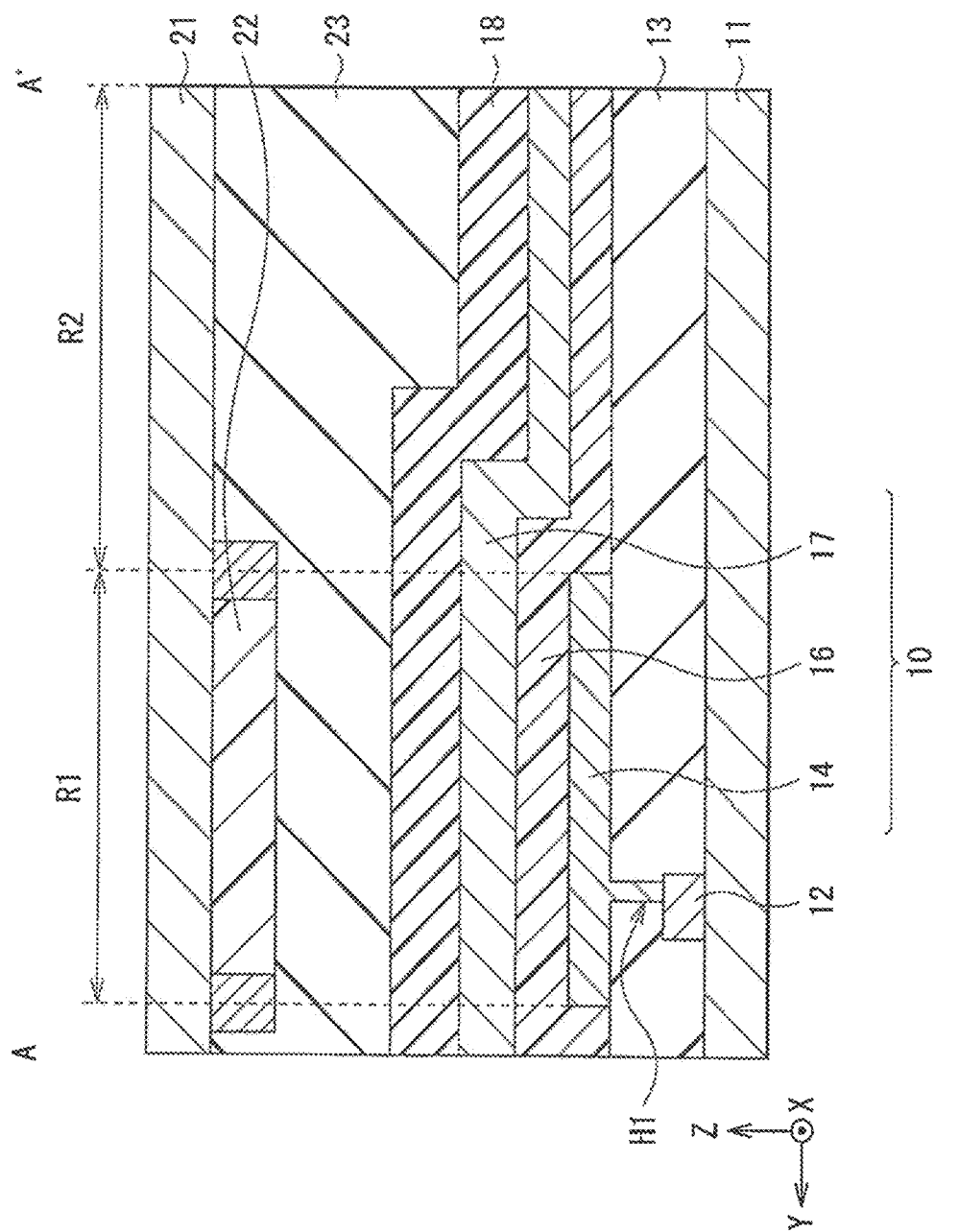
FIG. 4A is a schematic diagram illustrating a cross-sectional structure of the pixel taken along a line A-A' illustrated in FIG. 3.

FIG. 3 illustrates an example detailed structure of the pixel P including the pixels pr, pg, and pb of the display unit 1 illustrated in FIG. 2. FIG. 4A illustrates a cross-sectional structure of the pixel P taken along the line A-A' in FIG. 3.

Figure 4B:
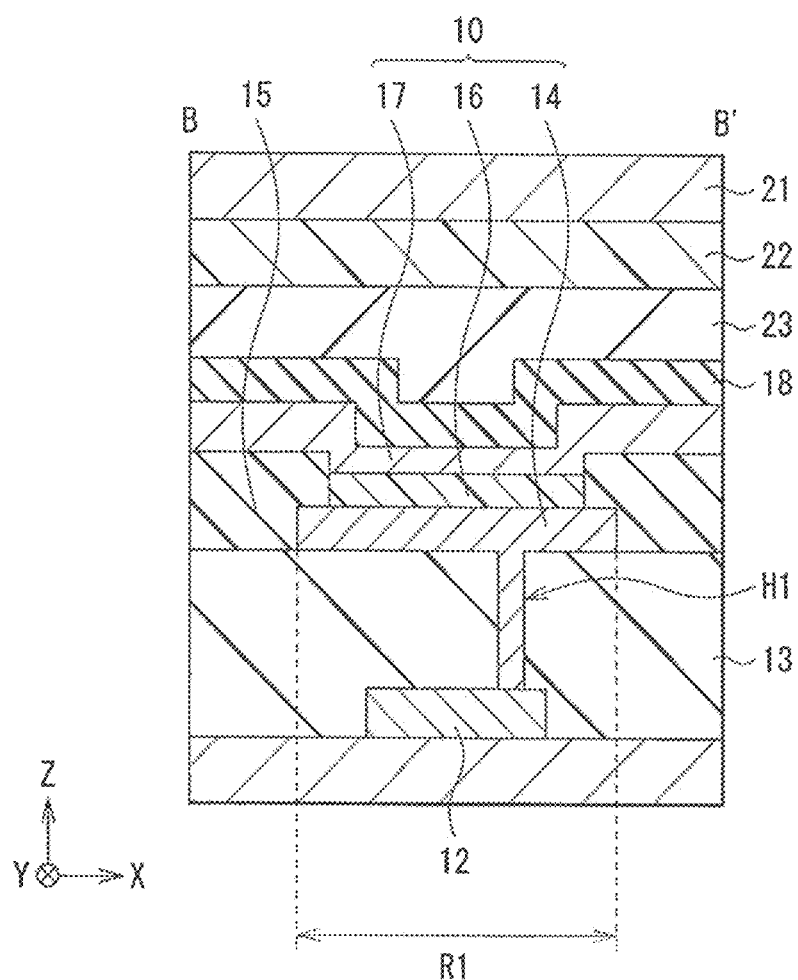
FIG. 4B is a schematic diagram illustrating a cross-sectional structure of the pixel taken along a line B-B' illustrated in FIG. 3.

FIG. 4B illustrates a cross-sectional structure of the pixel P taken along the line B-B' in FIG. 3. FIGS. 4A and 4B illustrate cross-sectional structures of the pixel pr. The pixels pg and pb may also have a cross-sectional structure similar to that of the pixel pr.

The pixels pr, pg, and pb may each have a light emission region R1 and a non-light emission region R2 along its long side direction. The long side direction may correspond to a column direction along a Y-axis in FIG. 3, which is also referred as a "first direction". In other words, the pair of the light emission region R1 and the non-light emission region R2 may serve as each of the pixels pr, pg, and pb. A partition wall 15 may be provided between each of the adjacent pixels pr, pg, and pb in their short side direction, which is perpendicular to the long side direction. The short side direction may correspond to a row direction along an X-axis in FIG. 3, which is also referred as a "second direction". That is, the partition wall 15 may be provided between the pixels pr and pg, between the pixels pg and pb, and between the pixels pb and pr. The light emission region R1 may be provided with the organic EL element 10 to enable extraction of light generated at the organic EL element 10 therefrom. The non-light emission region R2 may have a light transmittance that is higher than that of the light transmission region R1 to enable extraction of, for example, outside light, therefrom. The non-light emission region R2 may be intentionally provided to extract outside light or other light and may have an area that is, for example, approximately the same as that of the light emission region R1. The area of the non-light emission region R2 may be smaller than that of the light emission region R1 on the condition that the non-light emission region R2 does not include a non-light emission region that is unintentionally formed.

The display unit 1 may include the organic EL element 10 in the light emission region R1 of each of the pixels pr, pg, and pb. The organic EL element 10 may be sealed between a first substrate 11 and a second substrate 21 that face each other. The display unit 1 may include a thin film transistor (TFT) 12 and an insulation layer 13 covering the TFT 12, on the first substrate 11. The organic EL element 10 may be provided on the insulation layer 13 and may include a first electrode 14, an organic layer 16, and a second electrode 17, in the order from the insulation layer 13. The organic layer 16 may contain an organic luminescent material, and correspond to a light emission layer 163 described below. The partition wall 15 may be provided between the first electrode 14 and the second electrode 17, as illustrated in FIG. 4B. A protective layer 18, for example, may be provided on the organic EL element 10. The second substrate 21 may be joined onto the protective layer 18, with a sealing layer 23 being interposed therebetween. For example, a color filter layer 22 may be provided on a surface of the second substrate 21 to face the first substrate 11.

The non-light emission region R2 of each of the pixels pr, pg, and pb may be provided with the first substrate 11, the insulation layer 13, the organic layer 16, the second electrode 17, the protective layer 18, the sealing layer 23, and the second substrate 21, in this order.

The first substrate 11 may include, for example, a material such as glass, quartz, silicon, or a resin material, or a metal plate. Non-limiting examples of the resin material may include polyethylene terephthalate (PET), polyimide (PI), polycarbonate (PC), and polyethylene naphthalate (PEN).

The TFT 12 may correspond to, for example, the drive transistor DsTr illustrated in FIG. 1. For example, the TFT 12 may be provided in the light emission region R1 of each of the pixels pr, pg, and pb. The TFT 12 may include a semiconductor layer, a gate insulation film, and a gate electrode, in this order in a selected region on the first substrate 11, for example. The semiconductor layer may include an oxide semiconductor material, for example. An interlayer insulation film may be provided to cover the semiconductor layer, the gate insulation film, and the gate electrode. The TFT 12 may include a pair of source and drain electrodes on the interlayer insulation film. The source and drain electrodes may be electrically coupled to the semiconductor layer via unillustrated contact holes that are provided in the interlayer insulation film. One of the source and drain electrodes may be electrically coupled to the first electrode 14 via a contact hole H1 provided in the insulation layer 13. In the embodiment of the technology, the TFT 12 may have a so-called top-gate structure; however, the structure is not limited thereto, and the TFT 12 may have a so-called bottom-gate structure. The semiconductor layer may include a silicon-based semiconductor, such as amorphous silicon, polycrystalline silicon, or microcrystalline silicon.

An under coat (UC) film may be provided between the first substrate 11 and the TFT 12 (i.e., the semiconductor layer). The UC film may be provided to suppress or prevent moving of a substance such as a sodium ion from the first substrate 11 to an upper layer, and may include an insulating material such as a silicon nitride (SiN) or a silicon oxide ($SiO_2$).

The insulation layer 13 may be provided in the light emission region R1 and the non-light emission region R2 to cover the TFT 12. The insulation layer 13 may be a laminate of an inorganic insulation layer and an organic insulation layer that are stacked in this order from the first substrate 11, for example. The inorganic insulation layer may be, for example, a silicon oxide ($SiO_2$) film having a thickness of 200 nm. Alternatively or additionally, the inorganic insulation layer may be a silicon nitride (SiN) film, a silicon oxynitride (SiON) film, or other film, or may be a laminate thereof. In an example embodiment of the technology, the organic insulation layer may include a material having a high light transmissivity with respect to light with a wavelength in a visible-light region. For example, the organic insulation layer may be a transparent polyimide resin film having visible-light transmissivity. The polyimide resin film may have a thickness of 3000 nm, for example. Alternatively or additionally, the organic insulation layer may include a material having visible-light transmissivity such as an epoxy resin, a novolak resin, or an acrylic resin.

The organic EL element 10 may be provided in each of the pixels pr, pg, and pb on the insulation layer 13. The first electrodes 14 of the organic EL elements 10 may be respectively provided at the pixels pr, pg, and pb in a separated manner.

The first electrode 14 may be selectively provided in the light emission region R1, out of the light emission region R1 and the non-light emission region R2 of each of the pixels pr, pg, and pb. In other words, the region that is provided with the first electrode 14 in each of the pixels pr, pg, and pb may serve as the light emission region R1. The first electrode 14 may be, for example, a reflective electrode that serves as an anode. The first electrode 14 may have a rectangular planar shape and may be provided at each of the pixels pr, pg, and pb. Each long side of the first electrode 14 may be covered with the partition wall 15. These long sides may extend along the Y-axis in FIGS. 3 and 4B.

Figure 5:
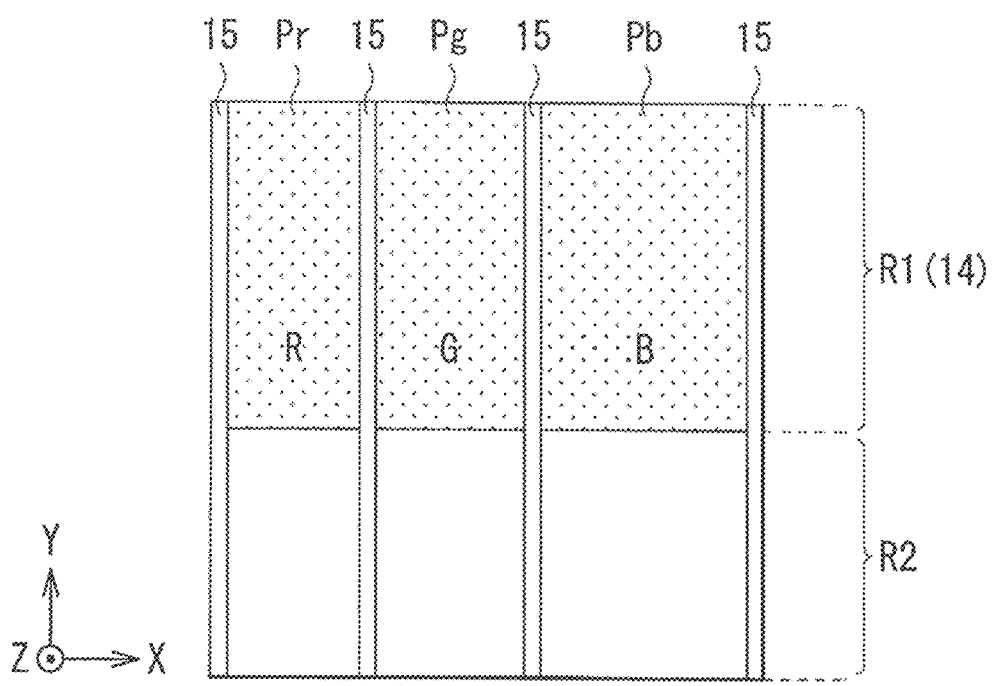
FIG. 5 is a schematic plan view illustrating another example of the structure of the pixel illustrated in FIG. 3.
Figure 6:
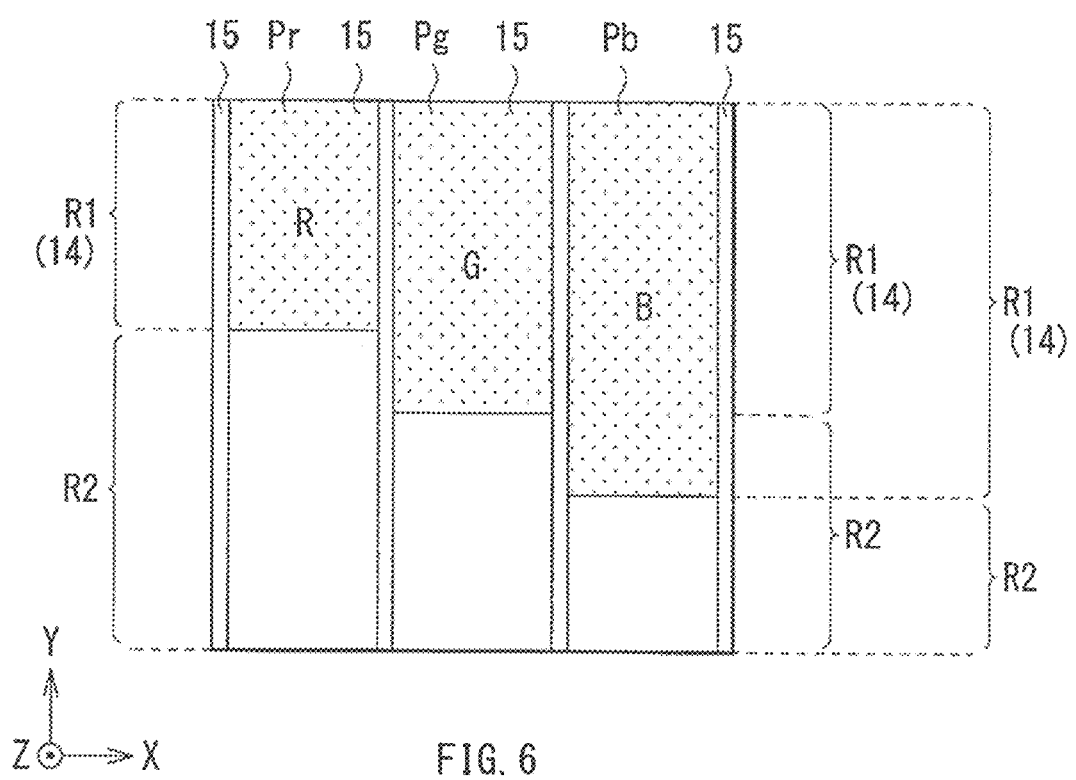
FIG. 6 is a schematic plan view illustrating yet another example of the structure of the pixel illustrated in FIG. 3.

FIGS. 5 and 6 illustrate example planar shapes of the pixels pr, pg, and pb. As illustrated in FIGS. 5 and 6, the shapes and the dimensions of the pixels pr, pg, and pb may be different from each other on a color basis: red, green, or blue. In other words, the shapes and the dimensions of the first electrodes 14 that are respectively provided in the pixels pr, pg, and pb may be different from each other. The display unit 1 may include first electrodes 14 that have different lengths in the short side direction or may include first electrodes 14 that have different lengths in the long side direction. The short side direction may correspond to a row direction along an X-axis in FIG. 5. The long side direction may correspond to a column direction along a Y-axis in FIG. 6.

Non-limiting examples of a constituent material of the first electrode 14 may include a simple substance and an alloy of a metal element such as aluminum (Al), chromium (Cr), gold (Au), platinum (Pt), nickel (Ni), copper (Cu), tungsten (W), and silver (Ag). Further, the first electrode 14 may include a laminate of a metal film and a transparent conductive film. The metal film may include a simple substance or an alloy of the above-mentioned metal elements. The transparent conductive film may include an electrically-conductive material having visible-light transmissivity. Non-limiting examples of the transparent conductive film may include an indium-tin oxide (ITO) film, an indium-zinc oxide (IZO) film, and a zinc oxide (ZnO)-based film. Non-limiting examples of the zinc oxide-based material may include aluminum (Al)-doped zinc oxide (AZO) and gallium-doped zinc oxide (GZO).

The partition wall 15 that is provided between each two adjacent ones of the first electrodes 14 in the row direction along the X-axis in FIG. 3 may extend in the column direction along the Y-axis in FIG. 3. In the display unit 1, each of the partition walls 15 provided between each two adjacent ones of the first electrodes 14 of the pixels pr, pg, and pb in the row direction may be arranged in a stripe form. The planar shape of the partition wall 15 may not necessarily have a linear shape. The partition walls 15 may have different widths from each other or a curved shape in plane (X-Y plane) view, for example. The partition wall 15 may separate adjacent columns of the pixels P, that is, the column of the pixels pr, the column of the pixels pg, and the column of the pixels pb, from each other. The partition wall 15 may have a liquid-repellent surface, and the organic layer 16 may be provided in the column of the pixels pr, the column of the pixels pg, and the column of the pixels pb, which are partitioned by the partition walls 15. The partition wall 15 may also serve to secure insulation between the first electrode 14 and the second electrode 17.

In an example embodiment of the technology, the partition wall 15 may include a material having a high light transmissivity with respect to light with a wavelength in a visible-light region. The partition wall 15 may include, for example, a resin material having visible-light transmissivity. Specific but non-limiting examples of the material of the partition wall 15 may include a photosensitive resin having visible-light transmissivity, such as an acrylic resin, a polyimide resin (e.g., a transparent polyimide), a fluorine resin, a silicone resin, a fluorine polymer, a silicon polymer, a novolak resin, an epoxy resin, and a norbornene resin. In an alternative embodiment, any of these resin materials with a pigment dispersed therein may also be used. The liquid repellency may be provided by the resin material of the partition wall 15 or may be imparted to the partition wall 15 by a surface treatment such as a fluorine plasma treatment. The thickness or length, in a Z-direction in FIG. 4B, of the partition wall 15 may be 1.5 to 2 µm, for example.

In the embodiment of the technology, the organic layers 16 are partitioned for each column of the pixels P by the partition walls 15 in the stripe form and each of the organic layers 16 is provided in a continuous manner in the light emission region R1 and the non-light emission region R2 of the corresponding pixel pr, pg, or pb, as illustrated in FIG. 4A. In other words, the light emission region R1 and the non-light emission region R2 in each of the pixels pr, pg, and pb are not partitioned by the partition wall, for example. The organic layer 16 may also be provided in a continuous manner between each two adjacent ones of the pixels pr in the column direction, between each two adjacent ones of the pixels pg in the column direction, and between each two adjacent ones of the pixels pb in the column direction. This structure suppresses variation in the thickness of the organic layers 16 in the light emission regions R1 in the pixels pr, pg, and pb. Details of this structure is described below. It is sufficient that at least the light emission layer (e.g., the light emission layer 163 described below) of the organic layer 16 is provided in a continuous manner in the light emission region R1 and the non-light emission region R2 of each of the pixels pr, pg, and pb. The organic layer 16 may be provided between the first electrode 14 and the second electrode 17 in the light emission region R1 and may also be provided between the insulation layer 13 and the second electrode 17 in the non-light emission region R2, as illustrated in FIG. 4A.

Figure 7:
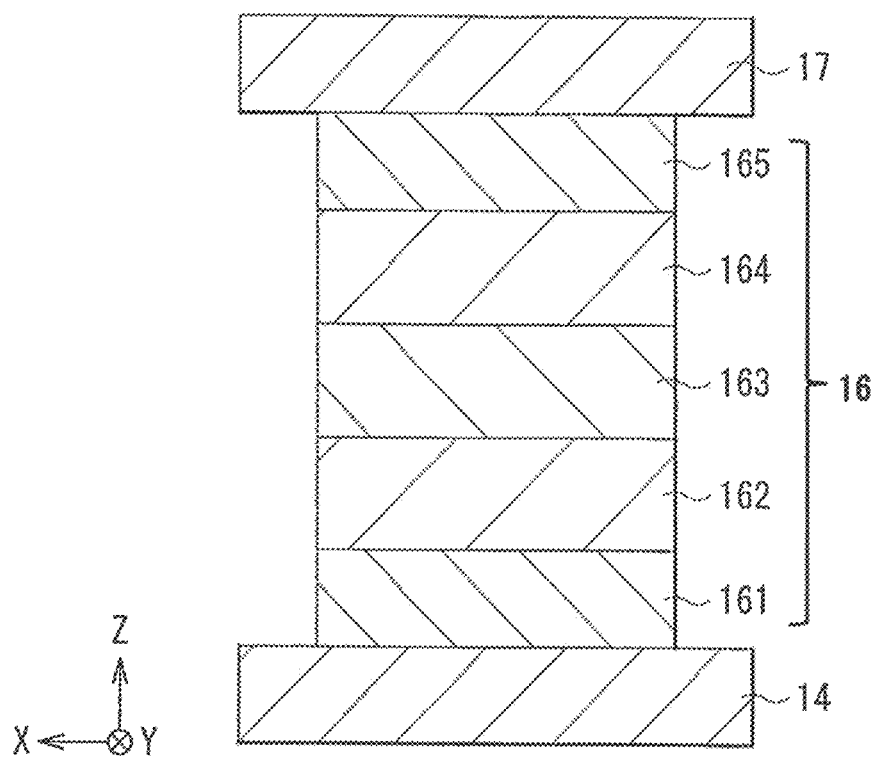
FIG. 7 is a schematic cross-sectional view illustrating an example structure of an organic layer illustrated in FIGS. 4A and 4B.

FIG. 7 illustrates an example detailed structure of the organic layer 16. The organic layer 16 that covers the first electrode 14 may include, for example, a hole injection layer 161, a hole transport layer 162, a light emission layer 163, an electron transport layer 164, and an electron injection layer 165, in this order from the first electrode 14. The organic layer 16 may be formed, for example, by coating and may be provided between the first electrode 14 and the second electrode 17 in each column of the pixels pr, each column of the pixels pg, and each column of the pixels pb, as described below. The organic layer 16 may have a thickness of 100 to 200 nm along the Z-direction in FIGS. 4A and 4B, for example. The light emission layers 163 may have different colors from each other for each pixels pr, pg, and pb. For example, the light emission layer 163 of the pixel pr, the light emission layer 163 of the pixel pg, and the light emission layer 163 of the pixel pb may generate a red color, a green color, and a blue color, respectively.

The hole injection layer 161 may suppress or prevent leakage and may include hexaazatriphenylene (HAT), for example. The hole injection layer 161 may have a thickness of 1 to 20 nm, for example. The hole transport layer 162 may include, for example, α-NPD[N,N'-di(1-naphthyl)-N,N'-diphenyl-[1,1'-biphenyl]-4,4'-diamine]. The hole transport layer 162 may have a thickness of 15 to 100 nm, for example.

The light emission layer 163 may emit light of a predetermined color by means of coupling between holes and electrons. The light emission layer 163 may have a thickness of 5 to 50 nm, for example. The light emission layer 163 that emits light in a red wavelength region may include rubrene doped with a pyrromethene-boron complex, for example. In this case, rubrene may be used as a host material. The light emission layer 163 that emits light in a green wavelength region may include $Alq^3$ (trisquinolinol-aluminum complex), for example. The light emission layer 163 that emits light in a blue wavelength region may include AND (9,10-di(2-naphthyl)anthracene) doped with a diaminochrysene derivative, for example. In this case, ADN may be used as a host material, and may be vapor-deposited into a film having a thickness of 20 nm, for example, on the hole transport layer 162. The diaminochrysene derivative may be used as a dopant and may be doped at a relative film thickness ratio of 5%.

The electron transport layer 164 may include BCP (2,9-dimethyl-4,7-diphenyl-1,10-phenanthroline). The electron transport layer 164 may have a thickness of 15 to 200 nm, for example. The electron injection layer 165 may include lithium fluoride (LiF), for example. The electron injection layer 165 may have a thickness of 15 to 270 nm, for example.

The second electrode 17 may face the first electrode 14 across the organic layer 16, which includes the light emission layer 163, and may serve as a cathode, for example. The second electrode 17 may be formed throughout the entire display region 10A to serve as an electrode shared by all pixels P. The second electrode 17 may be provided in the light emission region R1 and the non-light emission region R2 of each of the pixels pr, pg, and pb. The second electrode 17 may include a transparent conductive film, for example. Non-limiting examples of the transparent conductive film may include an indium-tin oxide (ITO) film, an indium-zinc oxide (IZO) film, and a zinc oxide (ZnO)-based film. Non-limiting examples of the zinc oxide-based material may include aluminum (Al)-doped zinc oxide (AZO) and gallium (Ga)-doped zinc oxide (GZO). Although the thickness of the second electrode 17 is not limited to a particular thickness, the thickness may be determined in consideration of electrical conductivity and visible-light transmissivity. In addition to these materials, an alloy of magnesium and silver (a Mg—Ag alloy) may also be used for the second electrode 17.

The protective layer 18 may be provided to cover the second electrode 17 and may include silicon nitride, for example. The protective film 18 may serve as a protective film that suppresses or prevents moisture ingress into the organic EL element 10 as well as variation in characteristics such as light emission efficiency.

The sealing layer 23 may join the protective film 18 and the second substrate 21 together and may seal the organic EL element 10. Non-limiting examples of the material of the sealing layer 23 may include an acrylic resin, a polyimide resin, a fluorine resin, a silicone resin, a fluorine polymer, a silicon polymer, a novolak resin, an epoxy resin, and a norbornene resin. In an alternative embodiment, any of these resin materials with a pigment dispersed therein may also be used.

A color filter layer 22 may include a red filter, a green filter, and a blue filter, for example. The color filter layer 22 may be provided, for example, on a part of a surface of the second substrate 21, for example, a surface, adjacent to the sealing layer 23, of the second substrate 21. The red filter, the green filter, and the blue filter may be provided in regions facing the organic EL elements 10 for the pixels pr, pg, and pb, respectively. These red filters, green filters, and blue filters may each include a resin with a pigment mixed therein.

A black matrix layer may also be provided in a region between the red filter, the green filter, and the blue filter, that is, a region between pixels. The black matrix layer may include, for example, a resin film with a black colorant mixed therein or a thin film filter utilizing interference of a thin film. The thin film filter may be, for example, a laminate of one or more thin films including a metal, a metal nitride, or a metal oxide, and may attenuate light by utilizing the interference of a thin film. Specific but non-limiting examples of the thin film filter may include a laminate of a filter that includes chromium (Cr) and a filter that includes chromium (III) oxide ($Cr_2O_3$) that are stacked alternately.

The second substrate 21, together with the sealing layer 23, may seal the organic EL element 10. The second substrate 21 may include, for example, a material, such as glass or plastic, that is transparent to light generated in the organic EL element 10.

[Manufacturing Method]

Figure 8:
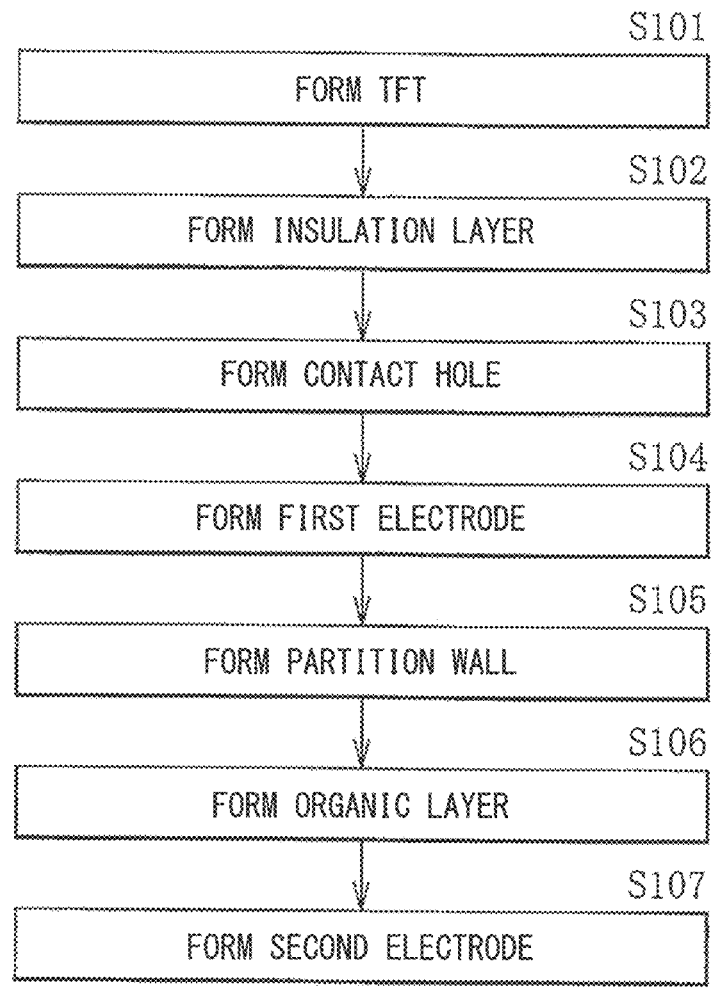

FIG. 8 is a flowchart of a process procedure of an example manufacturing method of the display unit 1. The display unit 1 may be manufactured as described below, for example.

First, the TFT 12 may be formed on the first substrate 11 (step S101). Thereafter, a silicon oxide film may be deposited to cover the TFT 12 by chemical vapor deposition (CVD), and then an organic insulation layer including a photosensitive material may be formed thereon, for example, by spin-coating or slit-coating. Thus, the insulation layer 13 may be formed (step S102). The contact hole H1 that reaches the source and drain electrodes of the TFT 12 may be formed in the insulation layer 13 (step S103).

Thereafter, the first electrode 14 may be formed on the insulation layer 13 (step S104). The first electrode 14 may be formed by forming a film of an electrically-conductive material by sputtering, for example, so as to bury the contact hole H1 formed in the insulation layer 13, followed by patterning the film by photolithography and etching.

The formation of the first electrode 14 may be followed by formation of the partition walls 15 in the strip form along the long side direction of the first electrode 14 in the column direction (step S105). Thereafter, the organic layer 16 may be formed in the light emission region R1 and the non-light emission region R2 of each of the pixels pr, pg, and pb in a continuous manner in the region partitioned by the partition wall 15 (i.e., the column of the pixel pr, the column of the pixel pg, or the column of the pixel pb) (step S106). The organic layer 16 may be formed, for example, by applying a constitutional material of the organic layer 16 by ink-jetting or other method. Alternatively, the organic layer 16 may be formed by coating using a dispenser, for example. In an example embodiment of the technology, the light emission layer 163 of the organic layer 16 (illustrated in FIG. 7) may be formed by coating. That is, the light emission layer 163 may be a coated layer, for example.

After the organic layer 16 is formed, the second electrode 17 including the above-described material may be formed on the organic layer 16, for example, by sputtering (step S107). Thereafter, the protective layer 18 may be deposited on the second electrode 17, for example, by CVD, and then the second substrate 21 may be joined to the protective layer 18 via the sealing layer 23. For example, the color filter layer 22 may be formed on the second substrate 21 in advance. In this manner, the display unit 1 is manufactured.

[Workings and Effects]

In the display unit 1 according to any example embodiment of the technology, a selection pulse is supplied to the switching transistor WsTr of each of the pixels P from the scanning line driver 3 to select a pixel P. A signal voltage corresponding to an image signal supplied from the signal line driver 4 is supplied to the selected pixel P, and the supplied signal voltage is stored in the storage capacitor Cs. The drive transistor DsTr is subjected to ON/OFF control in response to the signal stored in the storage capacitor Cs, and a drive current is injected into the organic EL element 10. The injected drive current triggers recombination of holes and electrons to cause the organic EL element 10 (i.e., the light emission layer 163) to emit light. This light is extracted from the light transmission region R1 of each of the pixels pr, pg, and pb, for example, through the second electrode 17, the protective layer 18, the sealing layer 23, the color filter layer 22, and the second substrate 21. As a result, red light, green light, and blue light are emitted from the respective pixels P: the pixels pr, pg, and pb, and an additive color mixture thereof allows color image display. Outside light is extracted from the non-light emission region R2 of each of the pixels pr, pg, and pb through the first substrate 11, the insulation layer 13, the organic layer 16, the second electrode 17, the protective layer 18, the sealing layer 23, and the second substrate 21. The display unit 1 may be a generally called "see-through display unit".

In the embodiment of the technology, the light emission layer 163 is continuously provided in the light emission region R1 and the non-light emission region R2 of each of the pixels pr, pg, and pb. This structure suppresses variation in the thickness of the light emission layer 163 in each of the light emission regions R1. This is to be described hereinafter.

Figure 9:
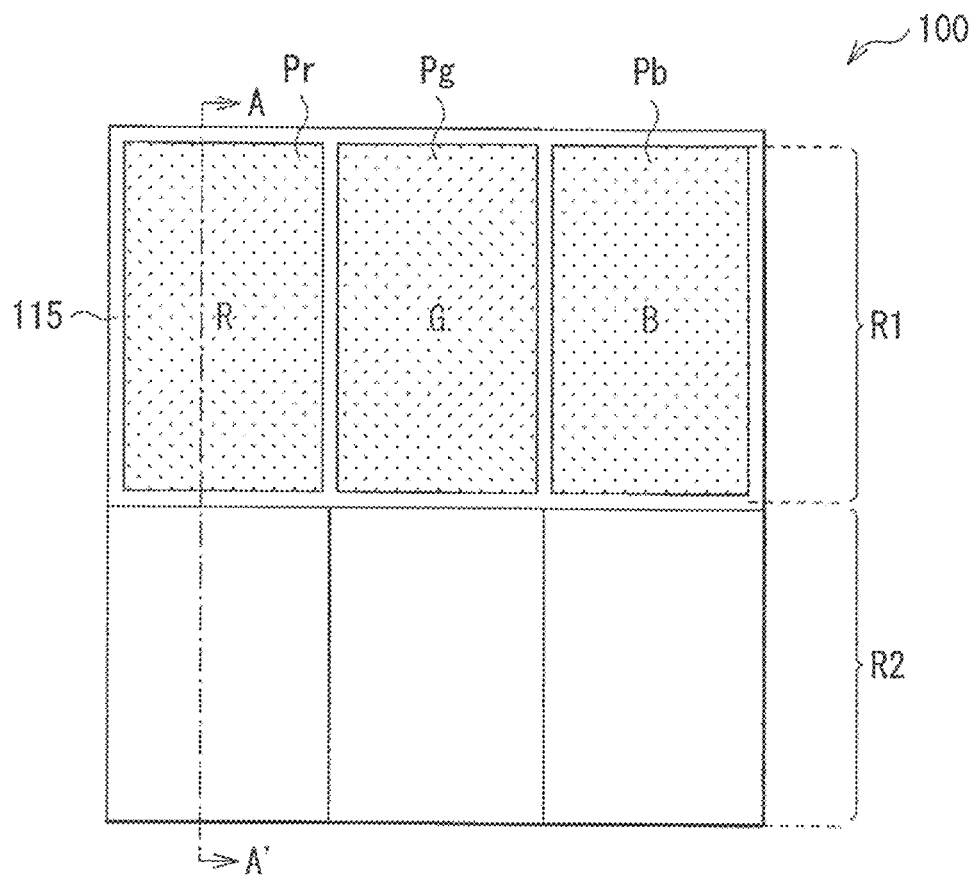
FIG. 9 is a schematic plan view illustrating a structure of a display unit according to a comparative example.
Figure 10:
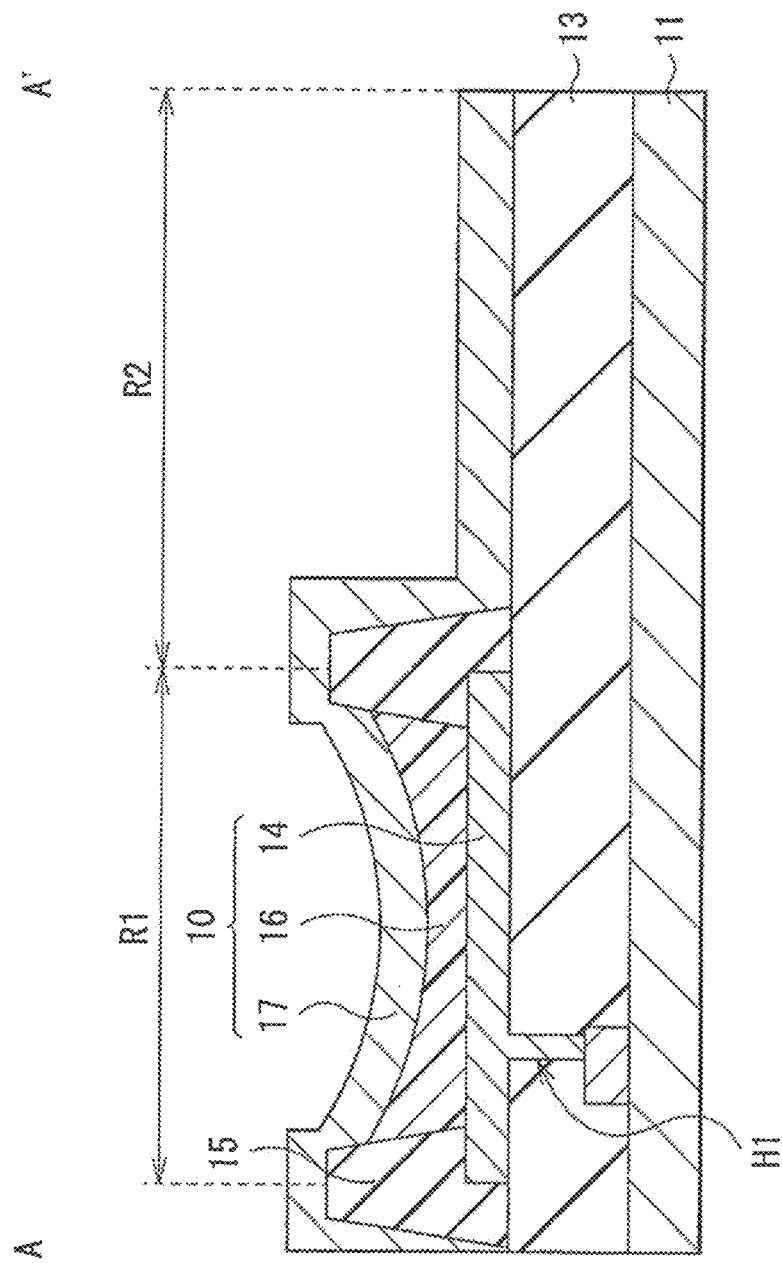
FIG. 10 is a schematic view illustrating a cross-sectional structure of a pixel taken along a line A-A' illustrated in FIG. 9.

FIG. 9 illustrates a schematic planar configuration of the pixels pr, pg, and pb of the display unit 100 according to a comparative example. FIG. 10 illustrates a cross-sectional structure of the pixel taken along a line A-A' illustrated in FIG. 9. This display unit 100 may be provided with a partition wall 115 that surrounds the light emission region R1 of each of the pixels pr, pg, and pb. In an example embodiment, the partition wall 115 may be provided between each of the adjacent pixels pr, pg, and pb in the row direction while also being provided between the light emission region R1 and the non-light emission region R2 of each of the pixels pr, pg, and pb. The organic layer 16 may be provided only in the light emission region R1 of each of the pixels pr, pg, and pb and may not be provided in the non-light emission region R2. That is, the organic layer 16 may be separated by the non-light emission region R2 between each of the adjacent pixels pr, pg, and pb in the column direction.

Thus, the organic layer 16, which includes the light emission layer, has a thickness that tends to vary because the organic layer 16 is disposed only in the light emission region R1 of each of the pixels pr, pg, and pb. The variation in the thickness of the light emission layer in the light emission region R1 limits the region where the light emission layer exhibits its function in the light emission region R1, that is, limits an effective light emission region.

Additionally, the light emission layer of the display unit 100 may be formed in a dot shape for each of the pixels pr, pg, and pb by coating and may thereby have a thickness that tends to vary with respect to each of the pixels pr, pg, and pb.

In a case where the display unit 100 has the pixels pr, pg, and pb of which the respective first electrodes 14 have shapes or dimensions different from each other, as illustrated in FIGS. 5 and 6, it may be necessary to optimize a printing condition for each of the pixels pr, pg, and pb. Such a complicated manufacturing process may possibly be difficult to be achieved in practical use.

On the other hand, in the embodiment of the technology, the partition wall 115 is not provided between the light emission region R1 and the non-light emission region R2 in each of the pixels pr, pg, and pb. Thus, the light emission layer 163 is provided in the light emission region R1 and the non-light emission region R2 in a continuous manner in each of the pixels pr, pg, and pb. This structure reduces and suppresses variation in the thickness of the light emission layer 163 in the light emission region R1 of each of the pixels pr, pg, and pb.

The light emission layer 163 is provided in a continuous manner, also between each of the adjacent pixels pr, pg, and pb in the column direction, which enables forming the light emission layer 163 in a stripe form in each column of the pixels pr, pg, and pb. This facilitates formation of the light emission layer 163 having an even thickness and eliminates the need for a high printing accuracy compared with a case of providing a light emission layer in a dot shape in each of the pixels pr, pg, and pb, as in the display unit 100 illustrated in FIGS. 9 and 10.

Also in the case where the display unit 100 has the pixels pr, pg, and pb of which the respective first electrodes 14 have shapes and dimensions different from each other, as illustrated in FIGS. 5 and 6, it is possible to form the light emission layer 163 in a stripe form in each column of the pixels pr, pg, and pb. Thus, compared with the display unit 100, the display unit 1 provides easiness in optimizing a printing condition and in manufacturing.

As described above, the light emission layer 163 of the display unit 1 is provided in the light emission region R1 and the non-light emission region R2 in a continuous manner, thereby suppressing a decrease in an effective light emission region, which occurs due to variation in the thickness of the light emission layer 163. Thus, a sufficient amount of light is extracted from the light emission region R1 of each of the pixels pr, pg, and pb. The technology is suitable to the display unit 1 having high definition, for example. One reason for this is improving a light extraction efficiency is important for an increase in a region shaded by wiring and other components.

Description is given below of modification examples of the foregoing example embodiment. In the following description, the same reference numerals are assigned to the same components as those of the foregoing example embodiment, and descriptions thereof are omitted where appropriate.

2. Modification Example of First Example Embodiment

Figure 11:
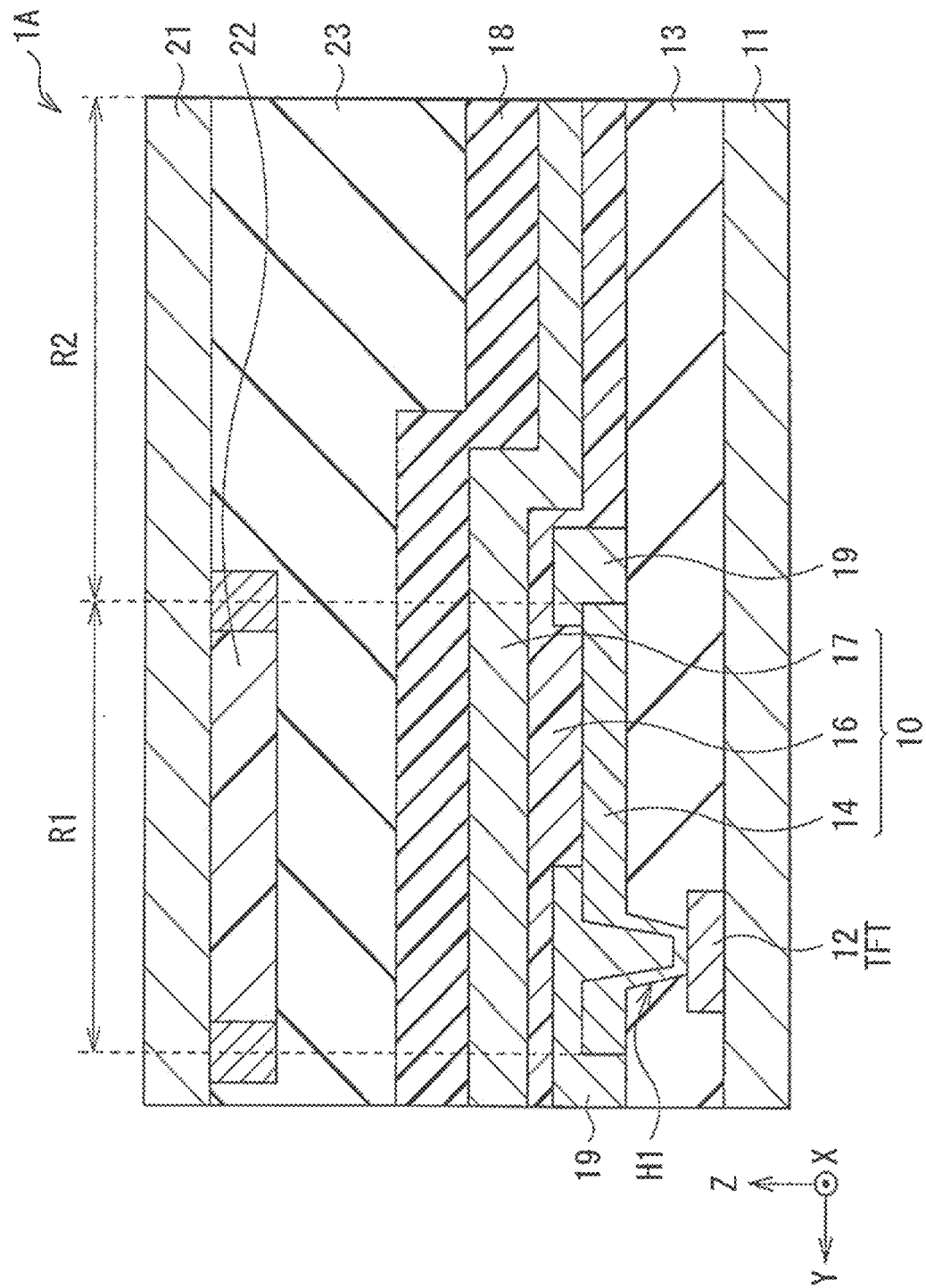
FIG. 11 is a schematic cross-sectional view illustrating a structure of a main part of a display unit according to a modification example.

FIG. 11 schematically illustrates a cross-sectional structure in Y-Z plane of a display unit 1A according to a modification example of the first example embodiment. The display unit 1A may include a short-circuit prevention layer that covers an end of each of the short sides of the first electrode 14. The short-circuit prevention layer may be a short-circuit prevention layer 19 in this modification example. Except this point, the display unit 1A has configurations similar to those of the display unit 1 of the foregoing example embodiment, and workings and effects thereof are also similar.

The short-circuit prevention layer 19 may be provided in the vicinity of the boundary between the light emission region R1 and the non-light emission region R2 in each of the pixels pr, pg, and pb, which is illustrated on the right side in FIG. 11. The short-circuit prevention layer 19 may also be provided in the vicinity of the boundary between the light emission region R1 and the non-light emission region R2 in each of the adjacent pixels pr, pg, and pb in the column direction, which is illustrated on the left side in FIG. 11. The short-circuit prevention layer 19 may be provided in only one of the vicinity within each of the pixels pr, pg, and pb and the vicinity between each of the adjacent pixels pr, pg, and pb in the column direction. The short-circuit prevention layer 19 may be provided between the first electrode 14 and the organic layer 16, which includes the light emission layer 163, on the insulation layer 13 to cover the end of the short side from a top surface of the first electrode 14. In an example embodiment of the technology, a part of the short-circuit prevention layer 19 may be provided at a part that faces the contact hole H1 provided in the insulation layer 13.

The short-circuit prevention layer 19 may include an insulating material having visible-light transmissivity such as a polyimide resin, a silicone resin, a silicon polymer, a novolak resin, an epoxy resin, or a norbornene resin. The short-circuit prevention layer 19 may have a height of, for example, 500 nm to 1 µm in a Z-direction in FIG. 11. The short-circuit prevention layer 19 may be provided to prevent generation of a short circuit between the first electrode 14 and the second electrode 17 in the vicinity of the end of the first electrode 14. In general, the organic layer 16 tends to be thin or be cut in a step shape due to a level difference at the end of the first electrode 14a and at a region immediately above the contact hole H1. The organic layer 16 that is thinned or is cut in a step shape may possibly cause a short circuit between the first electrode 14 and the second electrode 17, but which is able to be prevented by providing the short-circuit prevention layer 19. On the other hand, generation of a short circuit between the first electrode 14 and the second electrode 17 in the vicinity of an end of each of the long sides of the first electrode 14 is prevented by the partition wall 15.

Figure 12:
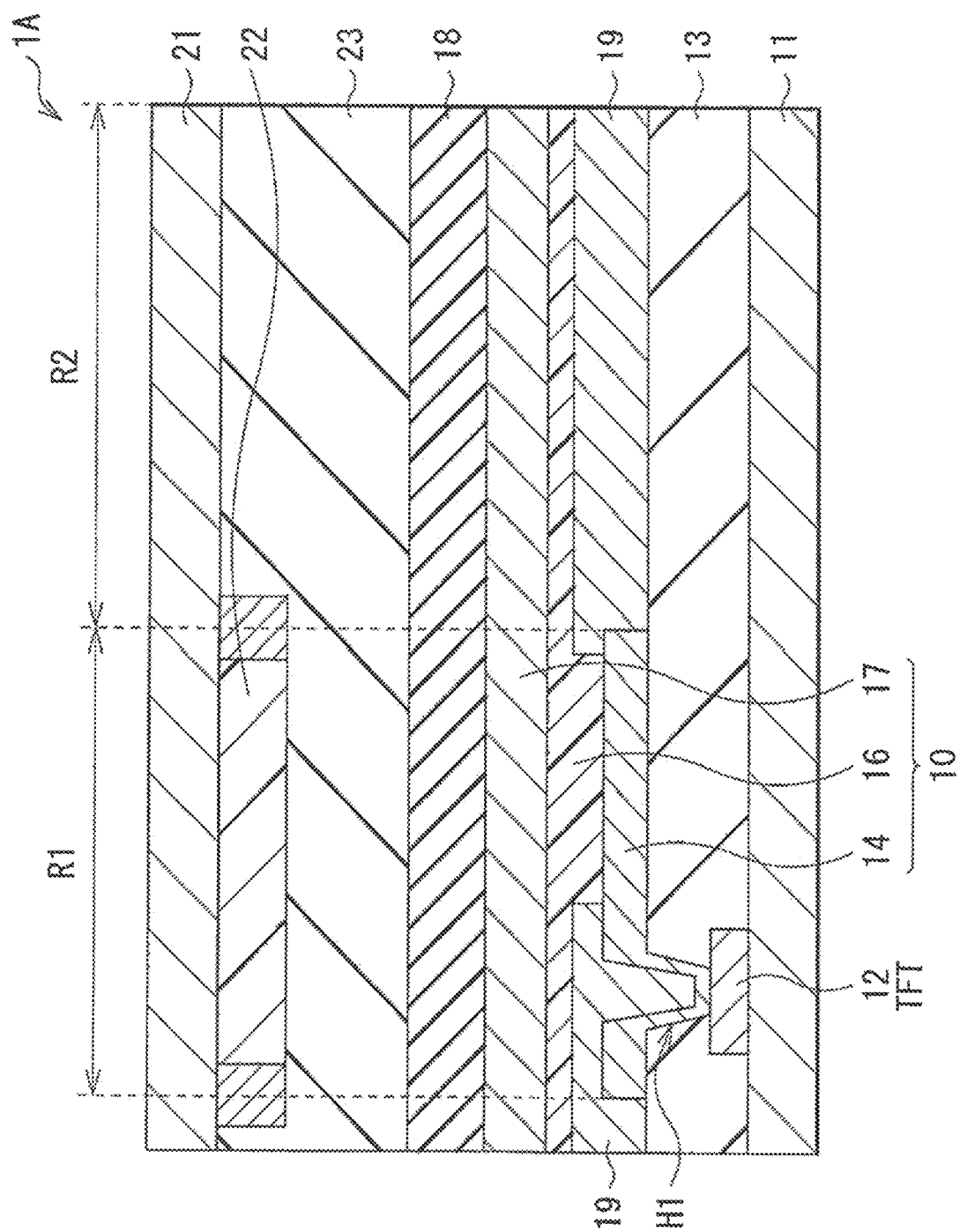
FIG. 12 is a schematic cross-sectional view of another example of the structure of a short-circuit prevention layer illustrated in FIG. 11.

As illustrated in FIG. 12, the short-circuit prevention layer 19 may be provided extending from the vicinity of the boundary between the light emission region R1 and the non-light emission region R2 to the non-light emission region R2.

As in the display unit 1, the display unit 1A is also provided with the organic layer 16, which includes the light emission layer 163, in the light emission region R1 and the non-light emission region R2 in a continuous manner, thereby suppressing a decrease in an effective light emission region due to variation in the thickness of the organic layer 16. Moreover, the short-circuit prevention layer 19 prevents generation of a short circuit in the vicinity of the end of each of the short sides of the first electrode 14.

3. Application Example (Example of Electronic Apparatus)

Figure 13:
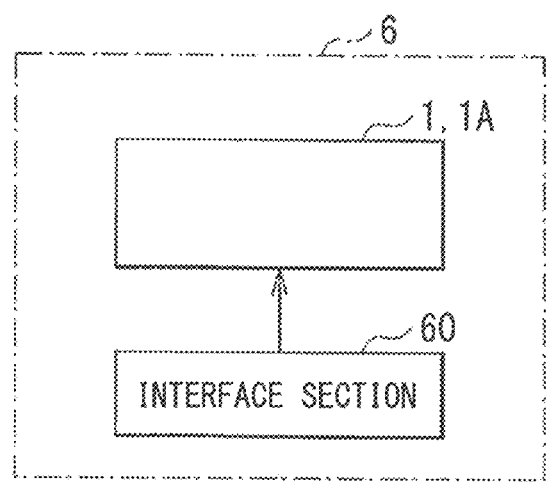
FIG. 13 is a block diagram illustrating a configuration of an electronic apparatus.

Each of the display units 1 and 1A described in the forgoing example embodiments may be applied to various types of electronic apparatuses. FIG. 13 illustrates a block configuration of an electronic apparatus 6. Specific but non-limiting examples of the electronic apparatus 6 may include a television, a personal computer (PC), a smartphone, a tablet PC, a mobile phone, a digital still camera, and a digital video camera.

The electronic apparatus 6 may include, for example, the above-described display unit 1 or 1A and an interface section 60. The interface section 60 may be an input section that receives various signals and power supply from an external device. The interface section 60 may include a user interface such as a touch panel, a keyboard, and an operation button.

Although description has been given hereinabove with reference to the first example embodiment and the modification examples of the first example embodiment, the technology is not limited thereto, but may be modified in a wide variety of ways. For example, factors such as a material and a thickness of each layer, a film-forming method, and a film-forming condition exemplified in the foregoing example embodiments are illustrative and non-limiting. Any other material, any other thickness, any other film-forming method, any other film-forming condition, and any other factor may be adopted besides those described above.

It is only required that the organic layer 16 include at least the light emission layer 163. For example, the organic layer 16 may include only the light emission layer 163. The light emission layer 163 may emit white light, for example. The light emission layer 163 may include a light emission layer 173 in which all of the pixels pr, pg, and pb emit light of the same color.

Although the display unit according to the forgoing example embodiments of the technology is of an active matrix type, the display unit may be of a passive matrix type in another example embodiment of the technology. Further, the configuration of the pixel circuit PXLC for active matrix driving is not limited to that described in the foregoing example embodiments. A capacitor element or a transistor may be added as necessary. In this case, any other necessary drive circuit may be added in response to change in the pixel circuit PXLC, besides the scanning line driver 3, the signal line driver 4, and the power supply line driver 5.

The display unit 1 and 1A each include the color filter layer 22 (illustrated in, for example, FIG. 4A) in the forgoing example embodiments of the technology; however, the color filter layer 22 may not be included in the display unit according to another example embodiment of the technology.

The first electrode 14 may include an electrically-conductive material having visible-light transmissivity, whereas the second electrode 17 may include an electrically-conductive material having light reflectivity. In this case, light that is generated in the light emission layer 163 may be extracted from the first substrate 11 side.

FIG. 3 illustrates an example of arranging the light emission region R1 and the non-light emission region R2, in this order, along the column direction of each of the pixels pr, pg, and pb. However, the light emission region R1 and the non-light emission region R2 may be arranged as desired. For example, the non-light emission region R2, the light emission region R1, and the non-light emission region 2 may be arranged, in this order, along the column direction of each of the pixels pr, pg, and pb.

The effects described in the foregoing example embodiments are mere examples. The effects according to an embodiment of the disclosure may be other effects, or may further include other effects in addition to the effects described hereinabove.

4. Second Example Embodiment

[Configuration]

Figure 14:
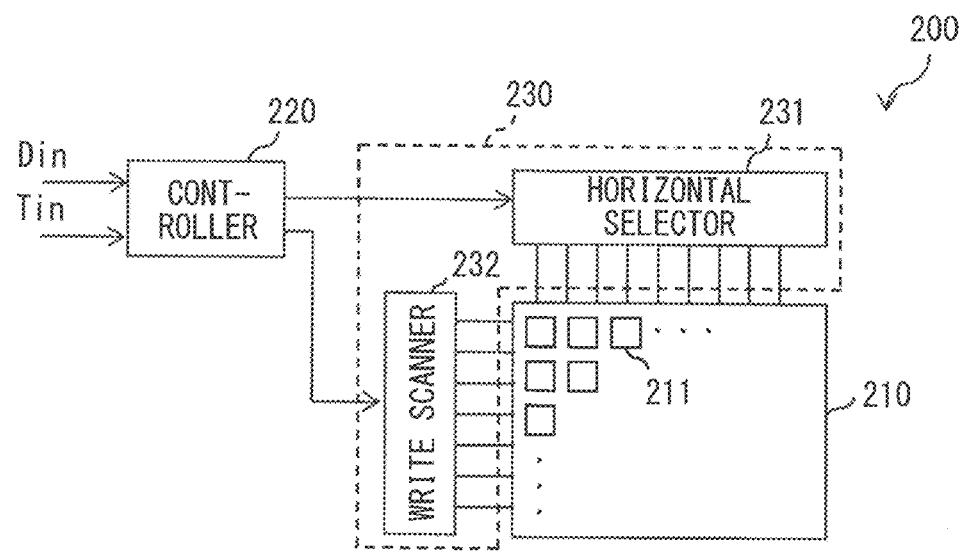
FIG. 14 illustrates an example outline configuration of a light emission unit according to one embodiment of the disclosure.
Figure 15:
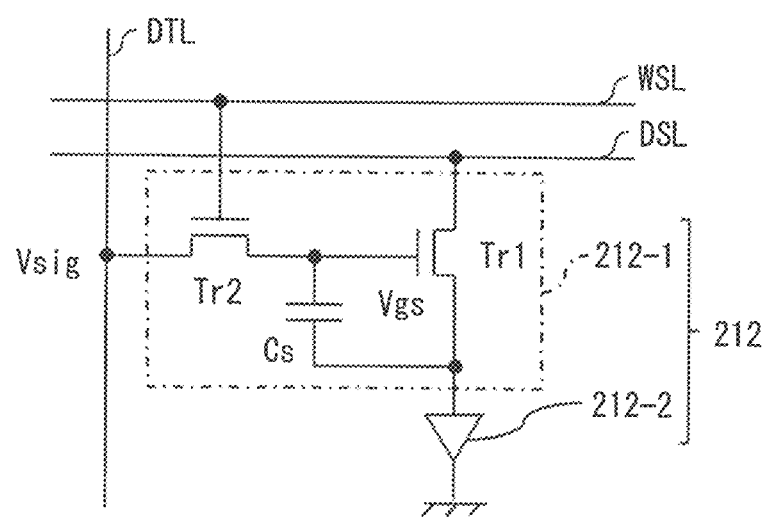
FIG. 15 illustrates an example circuit configuration of a subpixel included in each pixel illustrated in FIG. 14.

FIG. 14 illustrates an example outline configuration of a light emission unit 200 according to the second example embodiment of the disclosure. FIG. 15 illustrates an example circuit configuration of a subpixel 212 included in each of pixels 211 that are provided to the light emission unit 200. The light emission unit 200 may include, for example, a light emission panel 210, a controller 220, and a driver 230. The driver 230 may be mounted, for example, at an outer periphery of the light emission panel 210. The light emission panel 210 may include the multiple pixels 211 that are arranged in a matrix. The controller 220 and the driver 230 may drive the light emission panel 210 (i.e., the multiple pixels 211) on the basis of an image signal Din and a synchronous signal Tin that are received from an external device.

[Light Emission Panel 210]

In response to active matrix driving of each of the pixels 211 by the controller 220 and the driver 230, the light emission panel 210 may display an image on the basis of the image signal Din and the synchronous signal Tin received from an external device. The light emission panel 210 may include multiple scanning lines WSL each extending in a row direction, multiple signal lines DTL each extending in a column direction, multiple power supply lines DSL each extending in the row direction, and the multiple pixels 211 arranged in the matrix.

The scanning line WSL may be provided to select each of the pixels 211 and may supply a selection pulse to each of the pixels 211. The selection pulse may be used to select each of the pixels 211 on a predetermined unit basis, for example, on a pixel row basis. The signal line DTL may be provided to supply, to each of the pixels 211, a signal voltage Vsig in response to the image signal Din and may supply a data pulse including the signal voltage Vsig to each of the pixels 211. The power supply line DSL may be provided to supply electric power to each of the pixels 211.

Each of the pixels 211 may include, for example, a subpixel 212 that emits red light, a subpixel 212 that emits green light, and a subpixel 212 that emits blue light. That is, the multiple subpixels 212 may be grouped into multiple display pixels, that is, the pixels 211, by a predetermined number. Each of the pixels 211 may further include, for example, a subpixel 212 that emits other color, such as white color or yellow color. Each of the pixels 211 may include the multiple subpixels 212 that are lined in a predetermined direction, for example.

Each of the signal lines DTL may be coupled to an output terminal of a horizontal selector 231 described below. For example, the multiple signal lines DTL may be respectively allocated to the pixel columns, one by one. Each of the scanning lines WSL may be coupled to an output terminal of a write scanner 232 described below. For example, the multiple scanning lines WSL may be respectively allocated to the pixel rows, one by one. Each of the power supply lines DSL may be coupled to an output terminal of a power supply. For example, the multiple power supply lines DSL may be respectively allocated to the pixel rows, one by one.

Each of the subpixels 212 may include a pixel circuit 212-1 and a light emission element 212-2. Details of the light emission element 212-2 are described below.

The pixel circuit 212-1 may control light emission and light extinction of the light emission element 212-2. The pixel circuit 212-1 may hold a voltage that is written in each of the subpixels 212 by means of write scanning described below. The pixel circuit 212-1 may include, for example, a drive transistor Tr1, a switching transistor Tr2, and a storage capacitor Cs.

The switching transistor Tr2 may control application of a signal voltage Vsig corresponding to the image signal Din, to a gate of the drive transistor Tr1. In an example embodiment, the switching transistor Tr2 may sample a voltage of the signal line DTL and may write the sampled voltage into a gate of the drive transistor Tr1. The drive transistor Tr1 may be serially coupled to the light emission element 212-2. The drive transistor Tr1 may drive the light emission element 212-2. The drive transistor Tr1 may control a current that flows in the light emission element 212-2 in accordance with the magnitude of the voltage sampled by the switching transistor Tr2. The storage capacitor Cs may hold a predetermined voltage between the gate and a source of the drive transistor Tr1. The storage capacitor Cs may hold the voltage Vgs constant between the gate and the source of the drive transistor Tr1 during a predetermined period. The pixel circuit 212-1 may have a circuit configuration further including various types of capacitors and transistors that are added to the 2Tr1C circuit or may have a circuit configuration different from that of the 2Tr1C circuit.

Each of the signal lines DTL may be coupled to the output terminal of the horizontal selector 231 and a source or a drain of the switching transistor Tr2. The horizontal selector 231 is described below. Each of the scanning lines WSL may be coupled to an output terminal of the write scanner 232 and a gate of the switching transistor Tr2. The write scanner 232 is described below. Each of the power supply lines DSL may be coupled to a power supply circuit and a source or the drain of the drive transistor Tr1.

The gate of the switching transistor Tr2 may be coupled to the scanning line WSL. The source or the drain of the switching transistor Tr2 may be coupled to the signal line DTL. The terminal that is not coupled to the signal line DTL, of one of the source and the drain of the switching transistor Tr2, may be coupled to the gate of the drive transistor Tr1. The source or the drain of the drive transistor Tr1 may be coupled to the power supply line DSL. The terminal that is not coupled to the power supply line DSL, of one of the source and the drain of the drive transistor Tr1, may be coupled to an anode 221 of the light emission element 212-2. An end of the storage capacitor Cs may be coupled to the gate of the drive transistor Tr1. The other end of the storage capacitor Cs may be coupled to the terminal of one of the source and the drain of the drive transistor Tr1, which is on the light emission element 212-2 side.

[Driver 230]

The driver 230 may include, for example, the horizontal selector 231 and the write scanner 232. The horizontal selector 231 may apply an analog signal voltage Vsig to each of the signal lines DTL in response to an input of a control signal in a synchronous manner, for example. The analog signal voltage Vsig may be transmitted from the controller 220. The write scanner 232 may scan the multiple subpixels 212 on a predetermined unit basis.

[Controller 220]

The controller 220 are described below. The controller 220 may correct a digital image signal Din received from an external device, in accordance with a predetermined condition and may generate a signal voltage Vsig on the basis of the corrected image signal. The controller 220 may output the generated signal voltage Vsig to the horizontal selector 231, for example. The controller 220 may output a control signal to each circuit in the driver 230 in response to the synchronous signal Tin received from an external device, in a synchronous manner, for example.

Figure 16:
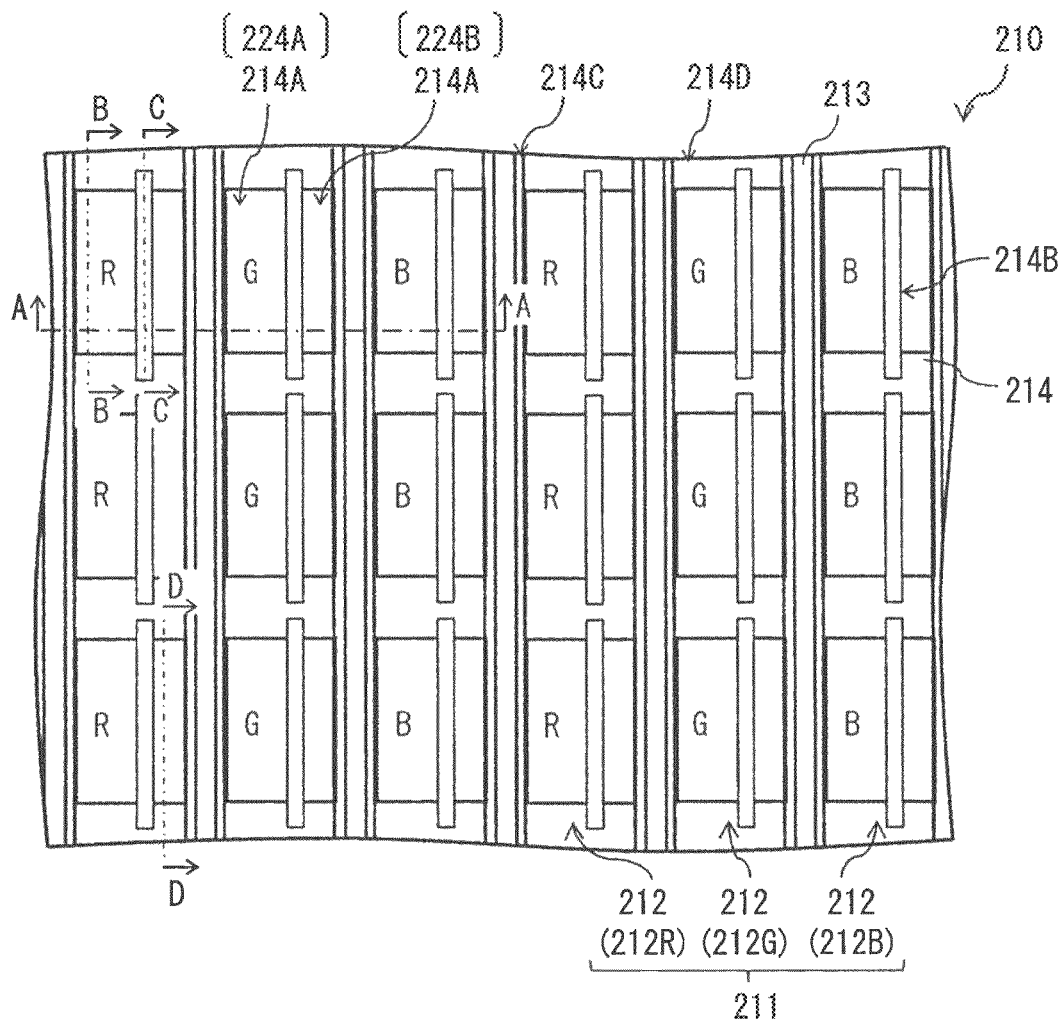
FIG. 16 illustrates an example outline structure of a light emission panel illustrated in FIG. 14.
Figure 17:
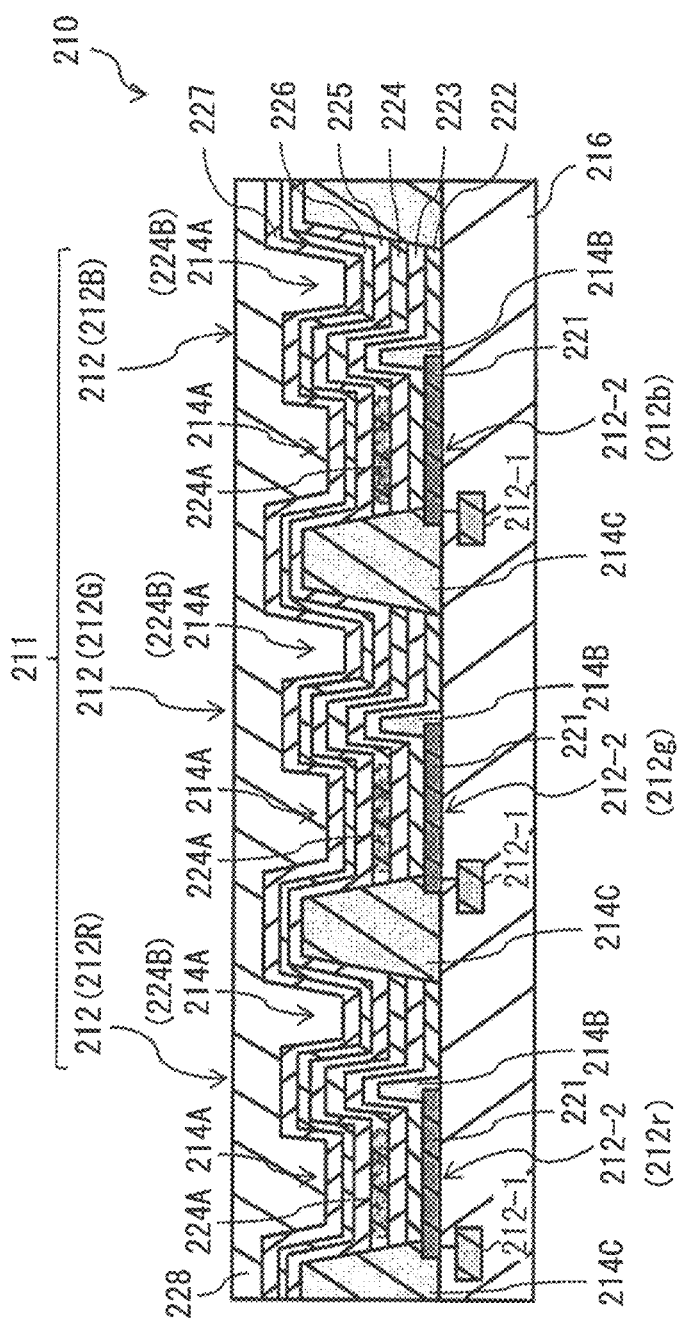
FIG. 17 illustrates an example cross-sectional structure of the light emission panel taken along a line A-A illustrated in FIG. 16.
Figure 18:
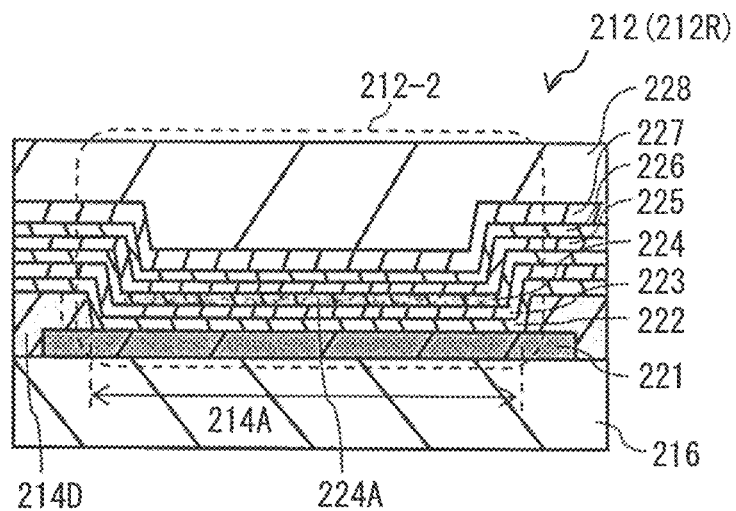
FIG. 18 illustrates an example cross-sectional structure of the light emission panel taken along a line B-B illustrated in FIG. 16.
Figure 19:
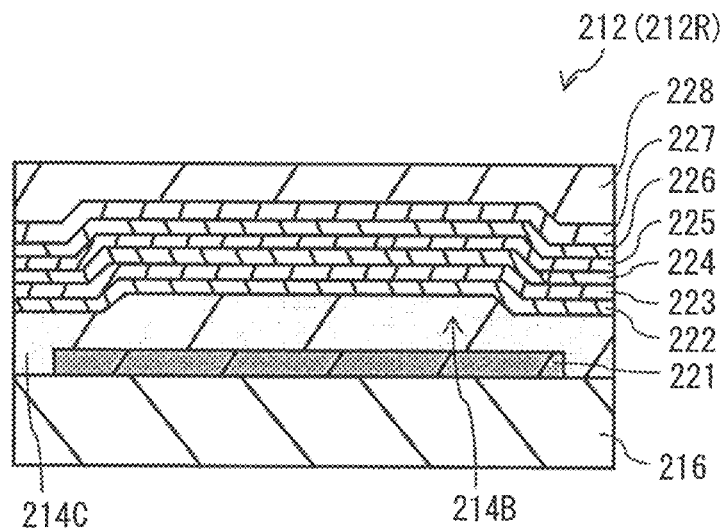
FIG. 19 illustrates an example cross-sectional structure of the light emission panel taken along a line C-C illustrated in FIG. 16.
Figure 20:
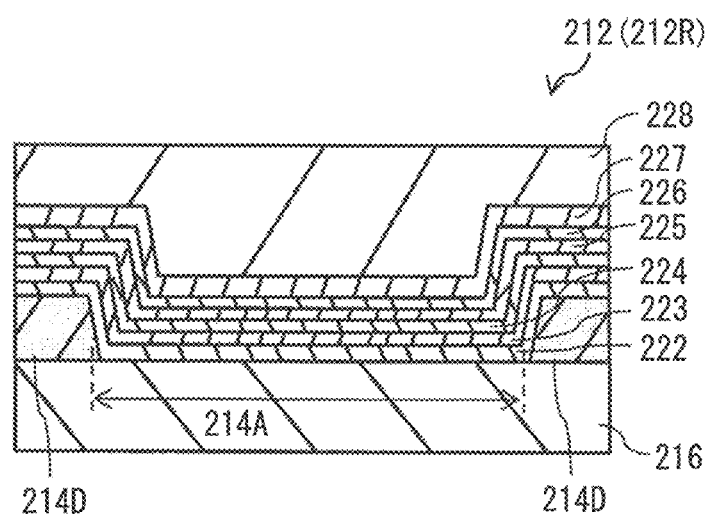
FIG. 20 illustrates an example cross-sectional structure of the light emission panel taken along a line D-D illustrated in FIG. 16.

The light emission element 212-2 is described below with reference to FIGS. 16 to 20. FIG. 16 illustrates an example outline structure of the light emission panel 210. FIG. 17 illustrates an example cross-sectional structure of the light emission panel 210 taken along a line A-A illustrated in FIG. 16, which is an example cross-sectional structure in the row direction of the pixels 211. FIG. 18 illustrates an example cross-sectional structure of the light emission panel 210 taken along a line B-B illustrated in FIG. 16, that is, an example cross-sectional structure in the column direction of the subpixel 212 (212R). FIG. 19 illustrates an example cross-sectional structure of the light emission panel 210 taken along a line C-C illustrated in FIG. 16, which is another example of the cross-sectional structure in the column direction of the subpixel 212 (212R). FIG. 20 illustrates an example cross-sectional structure of the light emission panel 210 taken along a line D-D illustrated in FIG.

16, which is yet another example of the cross-sectional structure in the column direction of the subpixel 212 (212R). The example of the cross-sectional structure illustrated in FIG. 18 may be at a part that avoids a cross piece 214B but has an anode 221 at a lower side. This anode 221 may be exposed to a hole injection layer 222 described below. The cross piece 214B is described below. The example of the cross-sectional structure illustrated in FIG. 19 may be at a part that includes the cross piece 214B. The example of the cross-sectional structure illustrated in FIG. 20 may be at a part that avoids the cross piece 214B and that does not have the anode 221 at a lower part. The cross piece 214B is described below.

The light emission panel 210 may include the multiple pixels 211 that are arranged in a matrix. Each of the pixels 211 may include, for example, a subpixel 212 that emits red light, a subpixel 212 that emits green light, and a subpixel 212 that emits blue light, as described above. In this case, the subpixels 212 that emit red light, green light, and blue light may be a subpixel 212R, a subpixel 212G, and a subpixel 212B, respectively.

The subpixel 212R may include a light emission element 212-2 (212r) that emits red light. The subpixel 212G may include a light emission element 212-2 (212g) that emits green light. The subpixel 212B may include a light emission element 212-2 (212b) that emits blue light. The subpixels 212R, 212G, and 212B may be arrayed in a stripe form, for example. In an example embodiment, the subpixels 212R, 212G, and 212B may be arranged in the row direction in each of the pixels 211. Moreover, for example, multiple subpixels 212 that emit light of the same color may be arranged in the column direction in each pixel row.

The light emission panel 210 may include a substrate 216. The substrate 216 may include, for example, a base and a wiring layer that is provided on the base. The base may support each of the light emission elements 212-2, an insulation layer 214, each of column limiting sections 214C, each of row limiting sections 214D, and other components. The column limiting section 214C and the row limiting section 214D are described below. The base of the substrate 216 may include a material having visible-light transmissivity. In an example embodiment, the base of the substrate 216 may include alkalifree glass, soda glass, nonfluorescent glass, phosphate glass, borate glass or quartz. In another example embodiment, the base of the substrate 216 may include an acrylic resin, a styrene resin, a polycarbonate resin, an epoxy resin, a polyethylene, polyester, a silicone resin, or an alumina. The pixel circuit 212-1 of each of the pixels 211 may be formed on the wiring layer of the substrate 216, for example. A part of the substrate 216 that faces a light transmission region 224B may have light transmissivity. In an example embodiment, the other part of the substrate 216 may also have light transmissivity. The light transmission region 224B is described below.

In the light emission panel 210, the insulation layer 214 may be provided on the substrate 216. The insulation layer 214 may be provided to partition the subpixels 212. The upper limit of the thickness of the insulation layer 214 may be preferably in a range that enables controlling the shape of the insulation layer 214 in manufacturing from a point of view of variation in film thickness and control of a bottom line width. In an example embodiment, the thickness of the insulation layer 214 may be preferably 10 μm or smaller. More preferably, the upper limit of the thickness of the insulation layer 214 may be in a range that enables suppressing an increase in tact time due to an increase in exposure time in a light exposure process as well as suppressing a decrease in productivity in a mass-production process. In an example embodiment, the thickness of the insulation layer 214 may be more preferably 7 μm or smaller. The lower limit of the thickness of the insulation layer 214 may be determined by resolution limits of an exposure apparatus and its material because the bottom line width should be increased to approximately the same degree as the film thickness as the film thickness decreases. The lower limit of the thickness of the insulation layer 214 may be preferably thin from a point of view of flatness of the film, and, in an example embodiment, it may be preferably 0.5 μm or greater in consideration of productivity. In short, the thickness of the insulation layer 214 may be preferably 0.5 μm or greater and 10 μm or smaller, more preferably, 0.5 μm or greater and 7 μm or smaller.

The insulation layer 214 may include multiple column limiting sections 214C and multiple row limiting sections 214D that partition the subpixels 212. The column limiting section 214C may correspond to a specific but non-limiting example of the "first wall" of the disclosure. The row limiting section 214D may correspond to a specific but non-limiting example of the "second wall" of the disclosure.

Each of the column limiting sections 214C may extend in a predetermined direction (i.e., the column direction), whereas each of the row limiting sections 214D may extend in a direction (i.e., the row direction) perpendicular to the column direction of the column limiting sections 214C. The multiple column limiting sections 214C may extend in the column direction and may be parallel to each other in the row direction at predetermined intervals. The multiple row limiting sections 214D may extend in the row direction and may be parallel to each other in the column direction at a predetermined distance. The multiple column limiting sections 214C and the multiple row limiting sections 214D may intersect each other, for example, may be perpendicular to each other, forming a grid layout. Each of the subpixels 212 may be surrounded by two adjacent column limiting sections 214C and two adjacent row limiting sections 214D. Thus, the two adjacent column limiting sections 214C and the two adjacent row limiting sections 214D may partition the subpixels 212.

The insulation layer 214 may include a cross piece 214B that extends in the column direction, in each of the subpixels 212. Moreover, the insulation layer 214 may include multiple slit openings 214A in a region that is surrounded by the two adjacent column limiting sections 214C and the two adjacent row limiting sections 214D, where the cross piece 214B is not formed. For example, two openings 214A may be provided. Each of the subpixels 212 may have the anode 221 that is exposed to the hole injection layer 222 at a lower part of one of the openings 214A. The anode 221 is described below. Thus, the anode 221 that is exposed to the hole injection layer 222 at the lower part of the opening 214A may provide positive holes, and the positive holes may recombine with electrons supplied from a cathode 227, in the light emission layer 224, thereby generating light at the light emission layer 224. The cathode 227 and the light emission layer 224 are described below. That is, a region of the light emission layer 224 that faces the opening 214A where the anode 221 is exposed to the hole injection layer 222 at the lower part, may serve as a light emission region 224A.

Each of the subpixels 212 may not be provided with the anode 221 at a lower part of a region that faces the other opening 214A. The region that faces the other opening 214A in each of the subpixels 212 may have visible-light transmissivity. Thus, the region that faces the other opening 214A in each of the subpixels 212 may serve as a light transmission region 224B having visible-light transmissivity. The light transmission region 224B in each of the subpixels 212 may be provided in the periphery of the light emission region 224A. In an example embodiment, the light transmission region 224B in each of the subpixels 212 may be located relative to the light emission region 224A in a predetermined array direction of the multiple pixels 211. In the embodiment of the technology, the predetermined array direction may correspond to a first array direction of the disclosure. In an example embodiment, the "predetermined array direction" may be perpendicular to the extending direction of the column limiting section 214C.

For example, the height of the row limiting section 214D from the substrate 216 may be lower than the height of the column limiting section 214C from the substrate 216, as illustrated in FIGS. 17 to 20. In an example embodiment, the height of the row limiting section 214D from the substrate 216 may be 80% or smaller of the distance between the anode 221 and the cathode 227 of the light emission element 212-2. For example, the height of the row limiting section 214D may be 0.8 μm in a case where the distance between the anode 221 and the cathode 227 is 1.2 μm. Under these conditions, the multiple subpixels 212 that are lined in the column direction may be disposed in a belt-shaped groove. The belt-shaped groove may be formed by two column limiting sections 214C, which are respectively on the left and right sides of these subpixels 212. For example, these multiple subpixels 212 may share the light emission layer 224. That is, the light emission layer 224 may cross over the row limiting section 214D from one subpixel 212 to the adjacent subpixel 212. In other words, the light emission layer 224 may be shared by two adjacent subpixels 212 with the row limiting section 214D therebetween.

Each of the openings 214A may have, for example, an inverted trapezoidal cross section in the row direction as illustrated in FIG. 17. Also, each of the openings 214A may have, for example, an inverted trapezoidal cross section in the column direction as illustrated in FIG. 18. A side surface of each of the openings 214A may have a reflector structure that rises light emitted from the light emission layer 224. A refractive index of a sealing layer 228 (described below) and a refractive index of the insulation layer 214 may satisfy the following formulas (1) and (2):

$$1.1 \leq n_1 \leq 1.8 \quad (1)$$

$$|n_1 - n_2| \geq 0.20 \quad (2)$$

where $n_1$ represents the refractive index of the sealing layer 228, and $n_2$ represents the refractive index of the insulation layer 214.

In an example embodiment of the technology, $n_2$ is 1.4 or greater and 1.6 or smaller. These conditions improve an efficiency in extracting light emitted from the light emission layer 224, to the outside.

Furthermore, in an example embodiment of the technology, a depth D of each of the openings 214A, which is the thickness of the insulation layer 214, an upper surface side open width Wh of the insulation layer 214, and a lower surface side open width WL, may satisfy the following formulas (3) and (4).

$$0.5 \leq WL/Wh \leq 0.8 \quad (3)$$

$$0.5 \leq D/WL \leq 2.0 \quad (4)$$

The shape according to the formulas (3) and (4) and the refractive index condition according to the formulas (1) and (2) make the insulation layer 214 have an opening 214A with a reflector structure, which improves the efficiency in extracting light from the light emission layer 224. As a result, according to the investigation performed by the inventors, luminance per subpixel 212 is increased to about 1.2 to 1.5 times of that in a case of not providing a reflector structure.

The insulation layer 214 may, for example, include an insulative organic material. Non-limiting examples of the insulative organic material may include an acrylic resin, a polyimide resin, a novolak phenol resin, a silicone resin, and a fluorine resin. In an example embodiment of the technology, the insulation layer 214 may include an insulative resin having heat resistivity and solvent resistivity, for example. The column limiting section 214C and the row limiting section 214D may be formed by processing an insulative resin into a desired pattern by photolithography and developing. The column limiting section 214C may have, for example, a forward tapered cross section, as illustrated in FIG. 19. The row limiting section 214D may have, for example, a forward tapered cross section, as illustrated in FIG. 20.

The light emission panel 210 may include, for example, multiple line banks 213 on the insulation layer 214. Each of the line banks 213 may extend in the column direction and may be in contact with an upper surface of the column limiting section 214C. Each of the line banks 213 may have liquid repellency. Thus, each of the line banks 213 prevents an ink of a subpixel 212 from flowing into another subpixel 212 for other color during the formation of the light emission element 212-2 on the substrate 216.

Each of the light emission elements 212-2 may include, for example, the anode 221, the hole injection layer 222, a hole transport layer 223, the light emission layer 224, an electron transport layer 225, an electron injection layer 226, and the cathode 227, on the substrate 216, in this order from the substrate 216. In the embodiment of the technology, the light emission layer 224 may correspond to an organic light emission layer of the disclosure.

In an example embodiment, the light emission element 212-2 may include the light emission layer 224 and include the anode 221 and the cathode 227 that have the light emission layer 224 therebetween. In this example, the light emission element 212-2 may further include the hole injection layer 222 and the hole transport layer 223, in this order from the anode 221, between the anode 221 and the light emission layer 224. One or both of the hole injection layer 222 and the hole transport layer 223 may not be provided. In this example embodiment, the light emission element 212-2 may also include the electron transport layer 225 and the electron injection layer 226, in this order from the light emission layer 224, between the light emission layer 224 and the cathode 227. One or both of the electron transport layer 225 and the electron injection layer 226 may not be provided. The light emission element 212-2 may have an element structure that includes the anode 221, the hole injection layer 222, the hole transport layer 223, the light emission layer 224, the electron transport layer 225, the electron injection layer 226, and the cathode 227, in this order from the substrate 216. The light emission element 212-2 may further include other functional layer.

The hole injection layer 222 may be provided to increase an injection efficiency of holes. The hole transport layer 223 may be provided to transport holes that are injected from the anode 221, to the light emission layer 224. The light emission layer 224 may emit light of a predetermined color by means of recombination between electrons and holes.

The electron transport layer 225 may be provided to transport electrons that are injected from the cathode 227, to the light emission layer 224. The electron injection layer 226 may be provided to increase an injection efficiency of electrons. One or both of the hole injection layer 222 and the electron injection layer 226 may not be provided. Each of the light emission element 212-2 may further include a layer in addition to the components described above.

The anode 221 may be, for example, formed on the substrate 216. The anode 221 may be a reflective electrode having reflectivity and include aluminum (Al), silver (Ag), an alloy of aluminum and silver, or other material. The anode 221 may be a component including a reflective electrode and a transparent electrode that are stacked. Non-limiting examples of the material of the transparent electrode may include a transparent electrically-conductive material of indium-tin oxide (ITO) or of indium-zinc oxide (IZO). An edge of the anode 221 may be embedded in the insulation layer 214, for example. In the case where the edge of the anode 221 is embedded in the insulation layer 214, it is possible to adjust the area of the subpixel 212 and the area of the light emission region 224A by varying the dimensions of each of the openings 214A. In an example embodiment, the dimensions of the bottom of each of the openings 214A may be varied.

The cathode 227 may be, for example, a transparent electrode of an ITO film, an IZO film, or other material. In one embodiment of the technology, in a case where the anode 221 has reflectivity while the cathode 227 has light transmissivity, the light emission element 212-2 may have a top-emission structure in which light is emitted from the cathode 227 side. The embodiment of the technology may use the substrate 216 that has visible-light transmissivity, and therefore, it is possible for a user to visually recognize an object behind the light emission panel 210. That is, the light emission panel 210 may be a visible-light transmissive panel.

The hole injection layer 222 may promote injection of holes from the anode 221 to the light emission layer 224. The hole injection layer 222 may include an oxide of silver (Ag), molybdenum (Mo), chromium (Cr), vanadium (V), tungsten (W), nickel (Ni), or iridium (Ir), or a conductive polymer material such as polyethylenedioxythiophene (PE-DOT), which is a mixture of polythiophene and polystyrene sulfonate. The hole injection layer 222 may include a single layer or multiple layers that are stacked.

The hole transport layer 223 may transport holes that are injected from the anode 221, to the light emission layer 224. The hole transport layer 223 may include, for example, a material that transports holes injected from the anode 221 to the light emission layer 224. This material may be hereinafter referred as a "hole transport material 223M". The hole transport layer 223 may mainly include the hole transport material 223M.

Non-limiting examples of the hole transport material 223M for the material of the hole transport material 223 may include an arylamine derivative, a triazole derivative, an oxadiazole derivative, an imidazole derivative, a polyaryl alkane derivative, a pyrazoline derivative, a pyrazolone derivative, a phenylenediamine derivative, an amino substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, a tetraphenyl benzine derivative, and a combination thereof. For example, the materials of the hole injection layer 222 and the hole transport layer 223 may have a difference in a highest occupied molecular orbital (HOMO) level of 0.5 eV or smaller in consideration of an injection property of holes.

The light emission layer 224 may emit light in response to generation of excitons by means of recombination of holes that are injected from the anode 221, and electrons that are injected from the cathode 227, in the light emission layer 224. The light emission layer 224 may be, for example, a coated film. The light emission layer 224 may be formed by coating and drying solution. The solution may have a solute mainly including an organic material that generates excitons due to recombination of holes and electrons and thereby emits light. This organic material may be hereinafter referred as an "organic luminescent material 224M". The light emission layer 224 may mainly include the organic luminescent material 224M. The light emission element 212r of the subpixel 212R may use an organic luminescent material 224M that includes a red organic luminescent material. The light emission element 212g of the subpixel 212G may use an organic luminescent material 224M that includes a green organic luminescent material. The light emission element 212b of the subpixel 212B may use an organic luminescent material 224M that includes a blue organic luminescent material.

The light emission layer 224 may include a single layer of an organic light emission layer or multiple organic light emission layers that are stacked. In a case where the light emission layer 224 includes multiple organic light emission layers that are stacked, the light emission layer 224 may be a stacked layer of multiple organic light emission layers that have the same main component. In this case, the multiple organic light emission layers all may be coated films. The multiple organic light emission layers all may be formed by coating and drying solution that has a solute made primarily of the organic luminescent material 224M.

In an example embodiment of the technology, the organic luminescent material 224M of the light emission layer 224 may include only a dopant. In another example embodiment of the technology, the organic luminescent material 224M may include a combination of a host and a dopant. That is, the light emission layer 224 may include a host and a dopant as the organic luminescent material 224M. The host may mainly serve to transport electrons or electric charges of holes, whereas the dopant may serve to cause light emission. The kind of each of the host and the dopant is not limited to one, but a combination of two or more kinds of hosts or dopants may be used. In an example embodiment, the amount of the dopant may be 0.01 weight % or greater and 30 weight % or smaller, with respect to the host. In another example embodiment, the amount of the dopant may be 0.01 weight % or greater and 10 weight % or smaller, with respect to the host.

The host for the light emission layer 224 may be, for example, an amine compound, a condensed polycyclic aromatic compound, or a heterocyclic compound. Non-limiting examples of the amine compound may include a monoamine derivative, a diamine derivative, a triamine derivative, and a tetraamine derivative. Non-limiting examples of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Non-limiting examples of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

The dopant for the light emission layer 224 may be, for example, a pyrene derivative, a fluoranthene derivative, an arylacetylene derivative, a fluorene derivative, a perylene derivative, an oxadiazole derivative, an anthracene derivative, or a chrysene derivative. Alternatively, the dopant for the light emission layer 224 may be a metal complex. Non-limiting examples of the metal complex may include a material having a ligand and an atom of metal such as iridium (Ir), platinum (Pt), osmium (Os), gold (Au), rhenium (Re), or ruthenium (Ru).

The electron transport layer 225 may transport electrons that are injected from the cathode 227, to the light emission layer 224. The electron transport layer 225 may mainly include an organic material having an electron transporting property. This organic material may be hereinafter referred as an "electron transport material 225M". The electron transport layer 225 may include, for example, a vapor-deposited film or a sputtered film. In an example embodiment of the technology, the electron transport layer 225 may have an electric-charge blocking property of suppressing passing through of electric charges (holes in the embodiment) from the light emission layer 224 to the cathode 227. Additionally, the electron transport layer 225 may preferably have a property of suppressing light extinction in an exited state of the light emission layer 224.

The electron transport material 225M for the material of the electron transport layer 225 may be, for example, an aromatic heterocyclic compound including one or more heteroatoms in the molecule. Non-limiting examples of the aromatic heterocyclic compound may include a compound having a pyridine ring, a pyrimidine ring, a triazine ring, a benzimidazole ring, a phenanthroline ring, or a quinazoline ring, in the skeleton. The electron transport layer 225 may contain a metal having an electron transporting property. The electron transport layer 225 containing a metal having the electron transporting property has an improved electron transporting property. Non-limiting examples of the metal contained the electron transport layer 225 may include barium (Ba), lithium (Li), calcium (Ca), potassium (K), cesium (Cs), sodium (Na), rubidium (Rb), and ytterbium (Yb).

The electron injection layer 226 may inject electrons injected from the cathode 227, to the electron transport layer 225 and the light emission layer 224. The electron injection layer 226 may include, for example, a material that promotes injection of electrons from the cathode 227 to the electron transport layer 225 and the light emission layer 224. This material may be referred as an "electron injection material" in the embodiment of the technology. The electron injection material may be, for example, an organic material having an injection property of electrons, to which a metal having an injection property of electrons is doped. The doped metal that is contained in the electron injection layer 226 may be the same as the metal contained in the electron transport layer 225, for example. The electron injection layer 226 may include, for example, a vapor-deposited film or a sputtered film.

In the embodiment of the technology, each of the layers constituting the light emission element 212-2, such as the hole injection layer 222, the hole transport layer 223, and the light emission layer 224, may be shared by the subpixels 212 that are provided in the region of the groove surrounded by the two adjacent column limiting sections 214C. That is, each of the layers constituting the light emission element 212-2, such as the hole injection layer 222, the hole transport layer 223, and the light emission layer 224, may extend in the column direction in the groove 217 so as to be continuously provided over the subpixels 212 across the row limiting section 214D, as illustrated in FIGS. 18 to 20, for example.

In the embodiment of the technology, some of the layers in the light emission element 212-2, such as the hole injection layer 222, the hole transport layer 223, and the light emission layer 224, may not be shared by the subpixels 212 of one pixel 211, but may be formed separately with respect to each of the subpixels 212 of one pixel 211. That is, some of the layers in the light emission element 212-2, such as the hole injection layer 222, the hole transport layer 223, and the light emission layer 224, may be formed to avoid the column limiting section 214C, as illustrated in FIG. 17, for example. In an example embodiment of the technology, some of the layers in the light emission element 212-2, such as the electron transport layer 225 and the electron injection layer 226, may be shared by the subpixels 212 of one pixel 211. That is, some of the layers in the light emission element 212-2, such as the electron transport layer 225 and the electron injection layer 226, may be formed across the column limiting section 214C, as illustrated in FIG. 17, for example.

In the embodiment of the technology, the cathode 227 may be formed over an entire surface of the light emission panel 210. In an example embodiment, the cathode 227 may be continuously formed over the entire surface of the electron injection layer 226, the column limiting section 214C, the row limiting section 214D, and the line bank 213.

The light emission element 212-2 may further include, for example, a layer for protecting and sealing the light emission element 212-2 (i.e., the sealing layer 228) as illustrated in FIGS. 17 to 20. The sealing layer 228 may include a resin material such as an epoxy resin or a vinyl resin.

[Effects]

Effects of the light emission panel 210 of an example embodiment of the technology and the light emission unit 200 having the same are described below.

Figure 21:
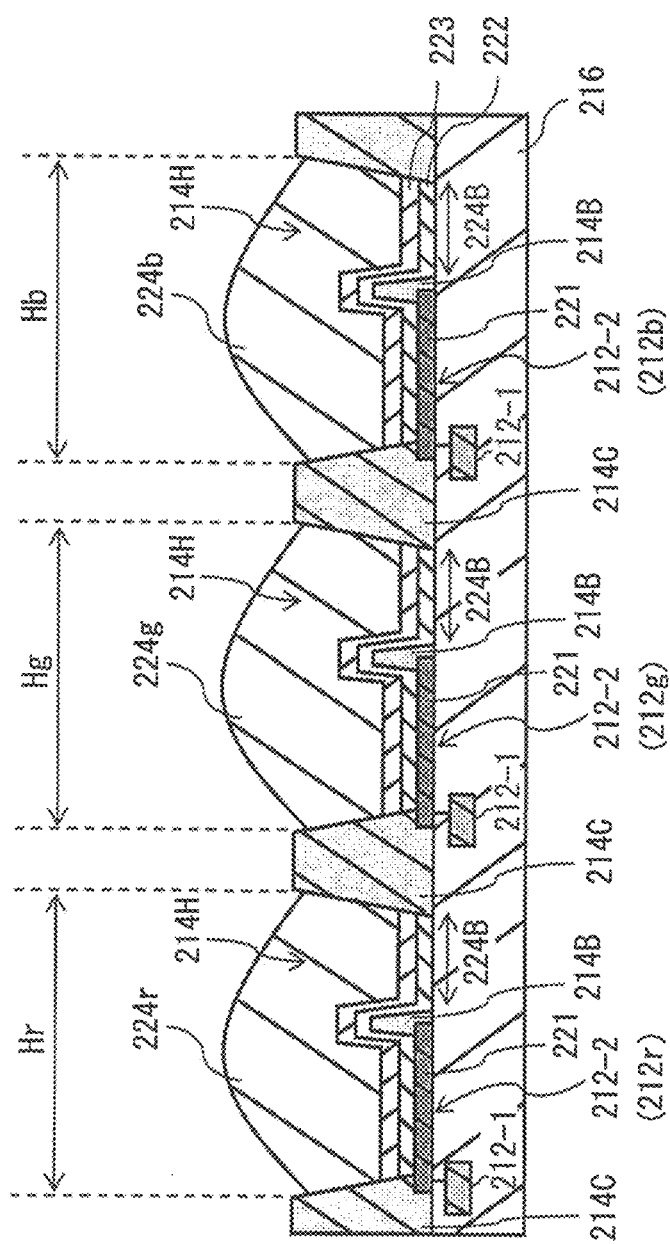
FIG. 21 is a cross-sectional view for explaining a manufacturing method of the light emission panel illustrated in FIG. 16.

In the example embodiment, the light emission region 224A and the light transmission region 224B that transmits visible light are provided to each of the subpixels 212, and the light emission region 224A and the light transmission region 24B share the light emission layer 224. The light transmission region 224B in each of the subpixels 212 is located relative to the light emission region 224A in the row direction of the multiple pixels 211. In the embodiment of the technology, the row direction may correspond to the first array direction of the disclosure. Compared with a case of providing a subpixel 212 having a light transmission region that does not share the light emission layer 224 with the light emission region 224A, with respect to each of the pixels 211, this structure enables increasing dimensions of the subpixel 212 while providing the light transmission region 224B in the pixel 211 because the light transmission region 224B shares the light emission layer 224 with the light emission region 224A in the pixel 211. For example, as illustrated in FIG. 21, in a case of forming the light emission layer 224 of each of the subpixels 212 by applying an ink 224r, 224g, or 224b by means of dropping or other method, the dimensions of the opening 214H for each of the subpixels 212 are made greater than those in a case of providing a subpixel 212 having a light transmission region that does not share the light emission layer 224 with the light emission region 224A, with respect to each of the pixels 211. This structure enables more uniform film thickness of the organic light emission layer of each of the subpixels 212, thereby decreasing a possibility of mixing colors between adjacent subpixels 212, compared with a case of providing the subpixel 212 having a light transmission region that does not share the light emission layer 224 with the light emission region 224A, with respect to each of the pixels 211. As a result, display unevenness such as luminance unevenness and color reproduction unevenness is decreased.

In the embodiment of the technology, the multiple subpixels 212 are provided with the multiple column limiting sections 214C that partition in the row direction of the multiple pixels 211. In the embodiment of the technology, the row direction may correspond to the first array direction of the disclosure, and the column limiting section 214C may correspond to the first wall of the disclosure. In this case, each of the multiple row limiting sections 214D partitions two adjacent subpixels 212 in the region of the groove, which is interposed between two adjacent column limiting sections 214C. The row limiting section 214D is lower than the column limiting section 214C. In the embodiment of the technology, the row limiting section 214D may correspond to the second wall of the disclosure. Thus, the two adjacent subpixels 212 share the light emission layer 224 with the row limiting section 214D therebetween. As a result, for example, as illustrated in FIG. 21, in a case of forming the light emission layer 224 of each of the subpixels 212 by applying an ink 224r, 224g, or 224b by means of dropping or other method, each of the inks 224r, 224g, and 224b spreads throughout the entire groove. This structure enables more uniform film thickness of the light emission layer 224 of the subpixels 212 for the same color, compared with a case of independently providing the light emission layer 224 in each of the subpixels 212 for the same color. Consequently, luminance unevenness is decreased.

In the embodiment of the technology, the substrate 216 is a visible-light transmissive substrate. Under these conditions, light that enters an object behind the light emission panel 210 through the light transmission region 224B of each of the subpixels 212 reflects back to a front surface of the light emission panel 210 through the light emission panel 210. As a result, it is possible for a user to visually recognize the object behind the light emission panel 210 through the light emission panel 210.

5. Modification Example of Second Example Embodiment

A modification example of the light emission panel 210 according to the second example embodiment is described below.

Modification Example A

Figure 22:
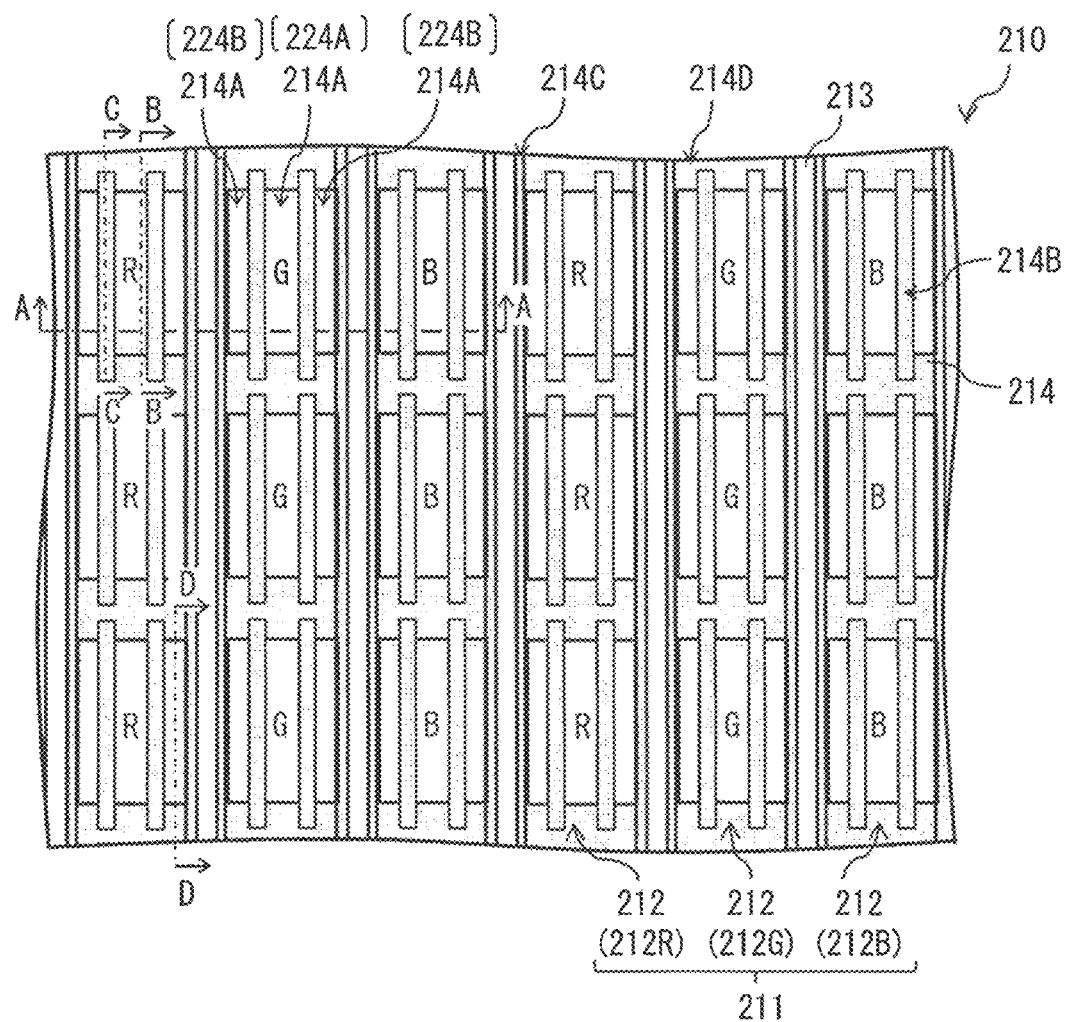
FIG. 22 illustrates a modification example of the outline structure of the light emission panel illustrated in FIG. 14.
Figure 23:
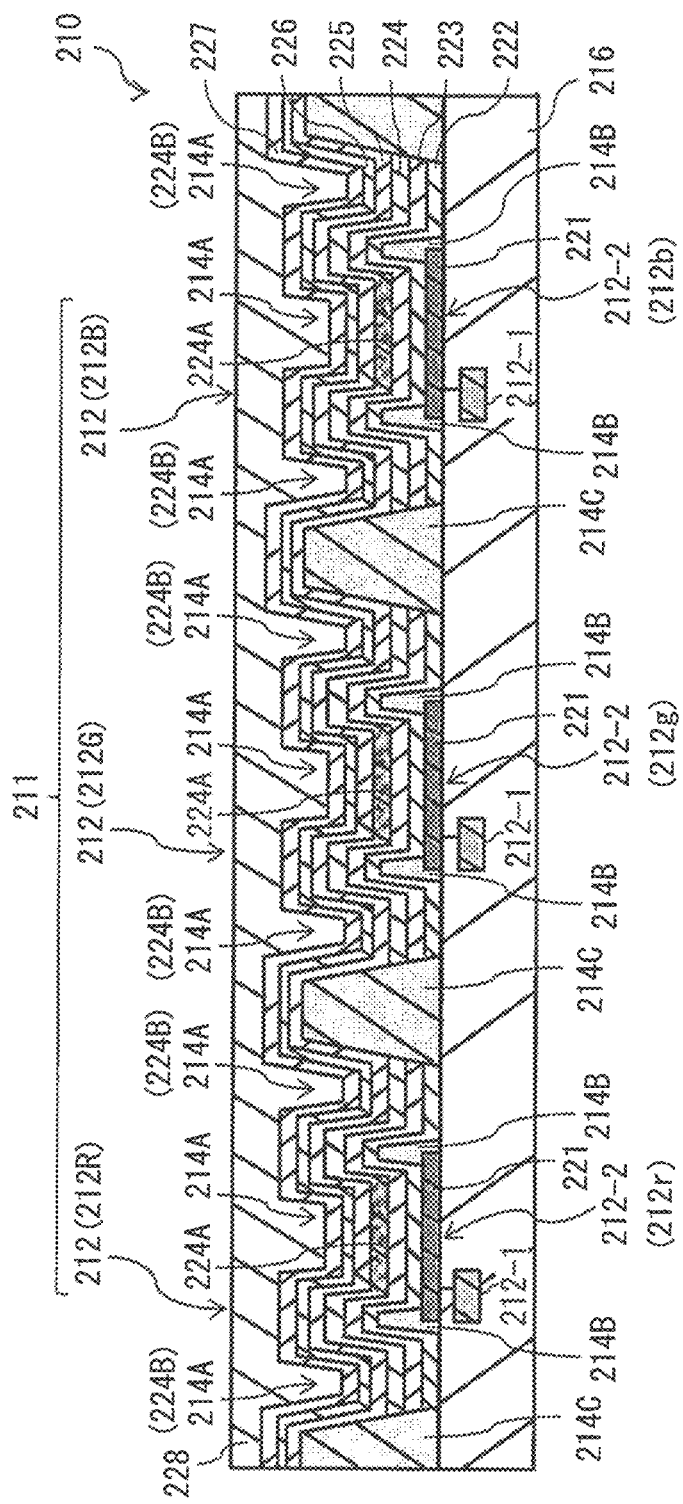
FIG. 23 illustrates an example cross-sectional structure of the light emission panel taken along a line A-A illustrated in FIG. 22.

FIG. 22 illustrates a modification example of the outline structure of the light emission panel 210 according to the second example embodiment. FIG. 23 illustrates an example cross-sectional structure of the light emission panel 210 taken along a line A-A illustrated in FIG. 22, which is an example cross-sectional structure of the pixel 211 in the row direction. An example cross-sectional structure that is taken along a line B-B in FIG. 22 may correspond to the cross-sectional structure in FIG. 18, for example. An example cross-sectional structure that is taken along a line C-C in FIG. 22 may correspond to the cross-sectional structure in FIG. 19, for example. An example cross-sectional structure that is taken along a line D-D in FIG. 22 may correspond to the cross-sectional structure in FIG. 20, for example.

Figure 24:
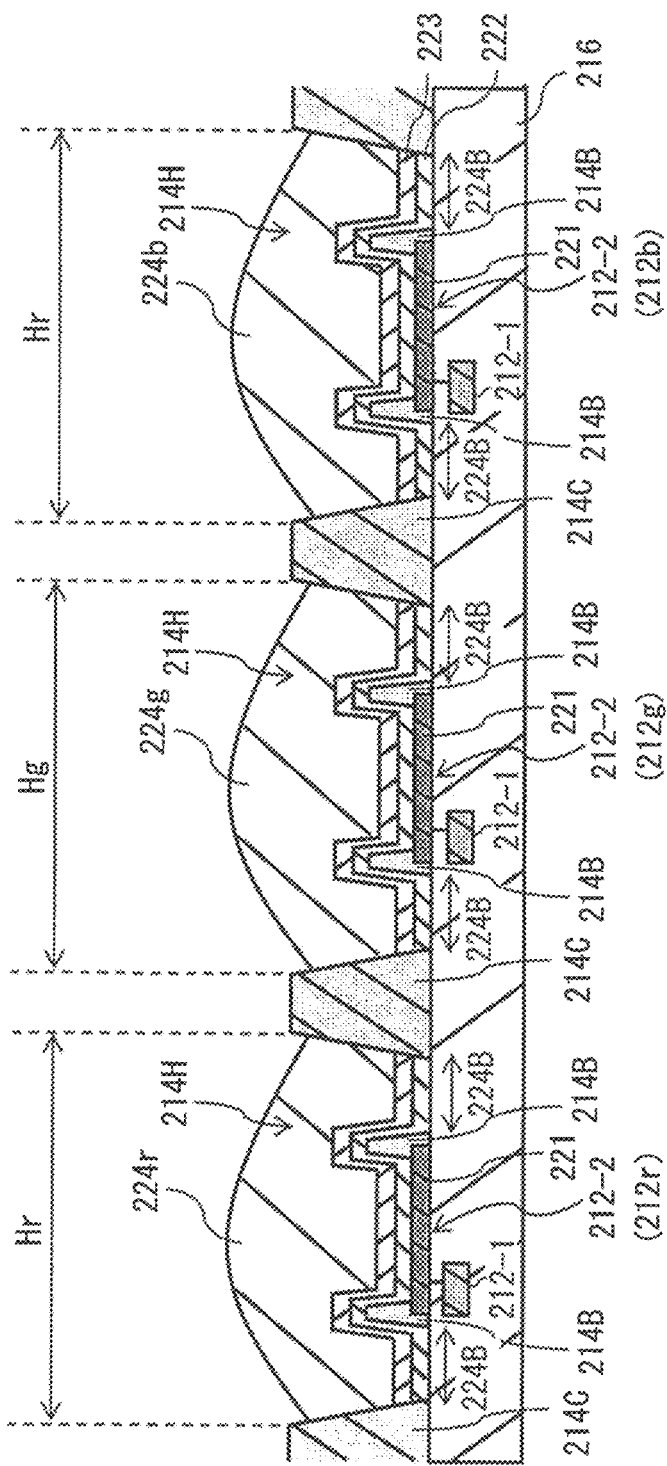
FIG. 24 is a cross-sectional view for explaining a manufacturing method of the light emission panel illustrated in FIG. 23.

In each of the subpixels 212 of the light emission panel 210 according to the second example embodiment, for example, the light transmission region 224B may be provided at each side of the light emission region 224A in the row direction of the multiple pixels 211, as illustrated in FIGS. 22 and 23. In the embodiment of the technology, the row direction may correspond to the first array direction of the disclosure. Compared with a case of providing the subpixel 212 having a light transmission region that does not share the light emission layer 224 with the light emission region 224A, with respect to each of the pixels 211, this structure also enables increasing dimensions of the subpixel 212 while providing the light transmission region 224B in the pixel 211 because the light transmission region 224B shares the light emission layer 224 with the light emission region 224A in the pixel 211. For example, as illustrated in FIG. 24, in a case of forming the light emission layer 224 of each of the subpixels 212 by applying an ink 224r, 224g, or 224b by means of dropping or other method, the dimensions of the opening 214A for each of the subpixels 212 may be greater than those in a case of providing a subpixel 212 having a light transmission region that does not share the light emission layer 224 with the light emission region 224A, with respect to each of the pixels 211. This structure enables more uniform film thickness of the organic light emission layer of each of the subpixels 212, thereby decreasing a possibility of mixing colors between adjacent subpixels 212, compared with a case of providing the subpixel 212 having a light transmission region that does not share the light emission layer 224 with the light emission region 224A, with respect to each of the pixels 211. As a result, display unevenness such as luminance unevenness and color reproduction unevenness is decreased.

Modification Example B

Figure 25:
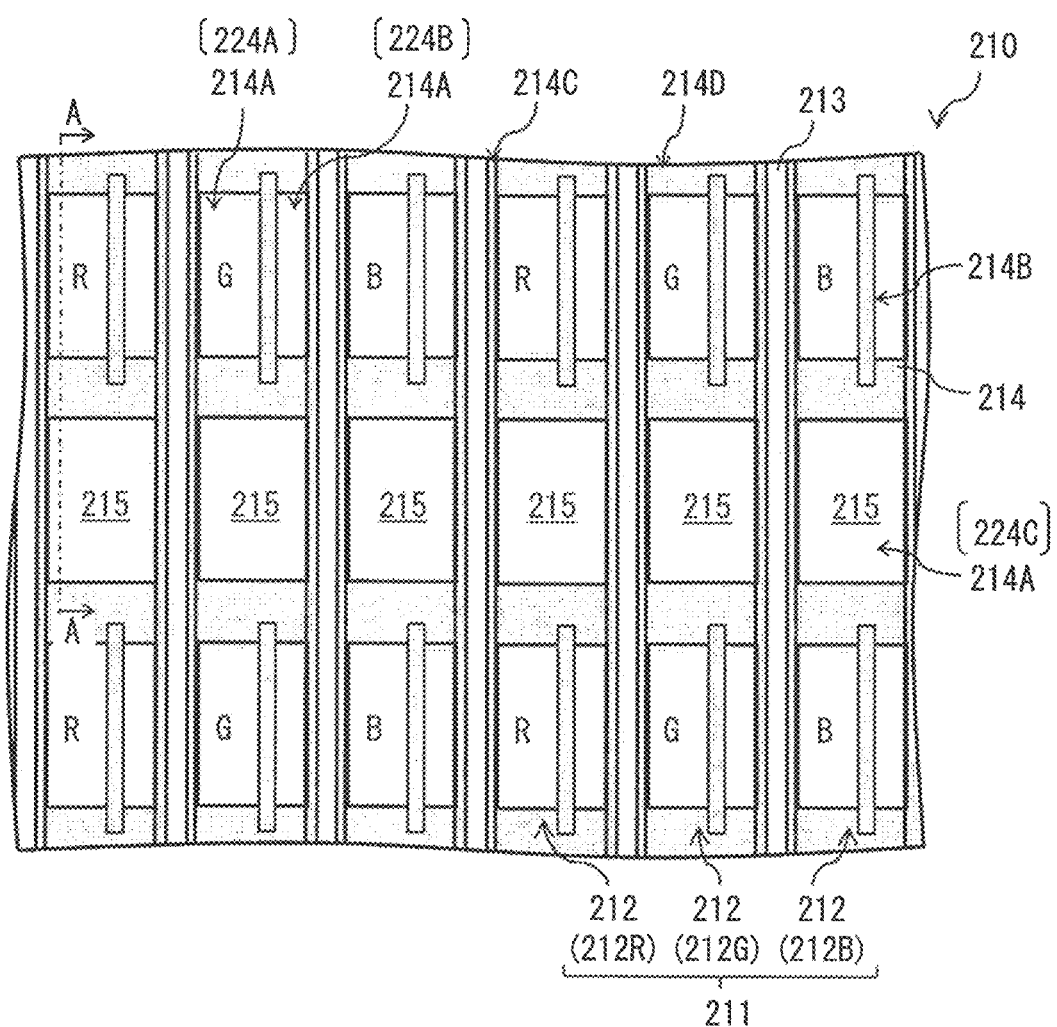
FIG. 25 illustrates a modification example of the outline structure of the light emission panel illustrated in FIG. 14.
Figure 26:
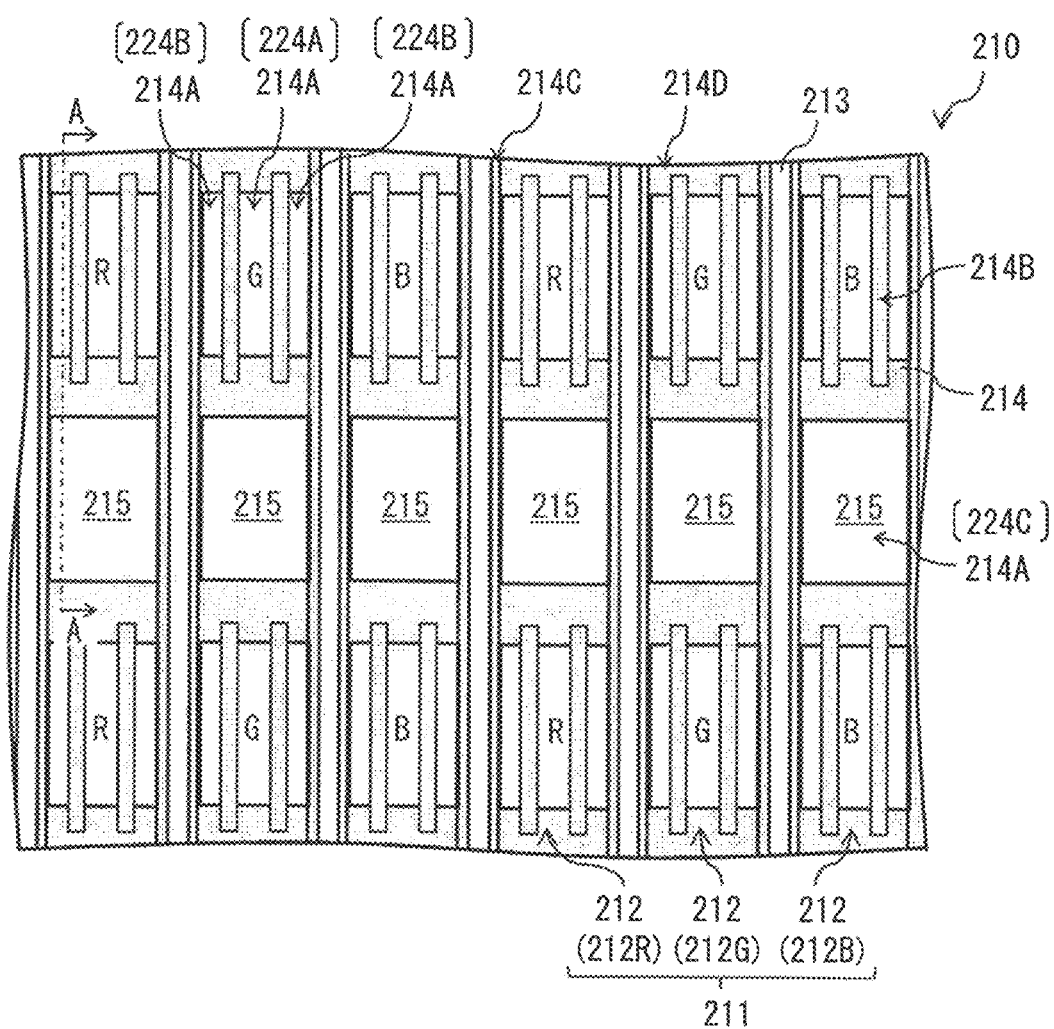
FIG. 26 illustrates a modification example of the outline structure of the light emission panel illustrated in FIG. 22.
Figure 27:
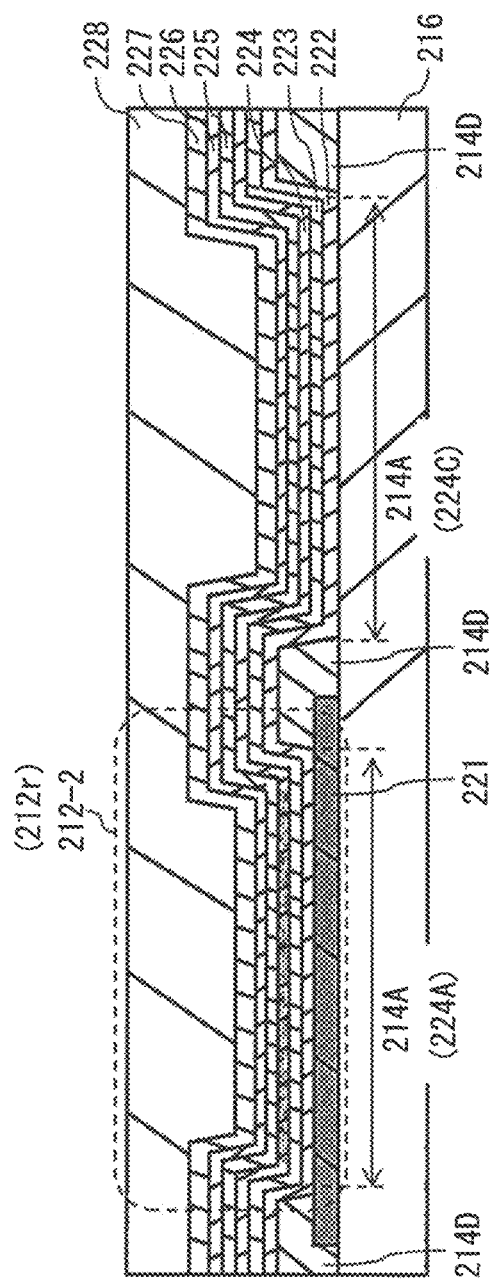
FIG. 27 illustrates an example cross-sectional structure of the light emission panel taken along a line A-A illustrated in FIGS. 25 and 26.

FIG. 25 illustrates a modification example of the outline structure of the light emission panel 210 according to the second example embodiment. FIG. 26 illustrates a modification example of the outline structure of the light emission panel 210 according to Modification Example A. For example, the light emission panel 210 may include multiple light transmissive non-display pixels 215 that are arranged in a matrix on the substrate 216, as illustrated in FIGS. 25 and 26. The insulation layer 214 of each of the non-display pixels 215 may include an opening 214A. In an example embodiment, each of the non-display pixels 215 may not have the anode 221 at the lower part of the opening 214A, as illustrated in FIG. 27. In this case, light entering an object behind the light emission panel 210 through the non-display pixel 215 may reflect back to the front surface of the light emission panel 210 through the light emission panel 210. As a result, it is possible for a user to visually recognize the object behind the light emission panel 210 through the light emission panel 210.

The multiple non-display pixels 215 and the multiple pixels 211 may be alternately arranged in a direction perpendicular to a predetermined array direction of the multiple pixels 211. In the embodiment of the technology, the predetermined array direction may correspond to the first array direction of the disclosure, and the direction perpendicular to the predetermined array direction may correspond to the second array direction of the disclosure. For example, "the direction perpendicular to the predetermined array direction of the multiple pixels 211" may be the column direction. That is, the multiple non-display pixels 215 and the multiple pixels 211 may be alternately arranged in the column direction. Thus, it is possible to enlarge each of the non-display pixels 215, thereby decreasing a diffraction angle of light that passes through each of the non-display pixels 215 to the front surface of the light emission panel 210. As a result, it is possible for a user to visually recognize the object behind the light emission panel 210 more clearly.

This modification example may be provided with a row limiting section 214D that partitions the subpixel 212 and the non-display pixel 215 in the column direction and that is lower than the column limiting section 214C. This structure enables the subpixel 212 and the adjacent non-display pixel 215 to share the light emission layer 224 with the row limiting section 214D therebetween. As a result, for example, in a case of forming the light emission layer 224 of each of the subpixels 212 and forming the light emission layer 224 of each of the non-display pixels 215 by applying an ink by means of dropping or other method, the ink spreads throughout the entire groove. Compared with a case of separately providing the light emission layer 224 in each of the subpixels 212 and in each of the non-display pixels 215, This structure enables more uniform film thickness of the light emission layer 224 of each of the subpixels 212 and of each of the non-display pixels 215. Consequently, luminance unevenness is decreased.

6. Application Example

First Application Example

Described below is an application example of the light emission unit 200 according to the second example embodiment and the modification examples of the second example embodiment. The light emission unit 200 according to the second example embodiment and the modification examples of the second example embodiment may be included in a display unit of an electronic apparatus in every field, which displays an image or a picture by using an image signal received from an external device or generated therein, such as a television, a digital camera, a notebook personal computer, a sheet-like personal computer, a portable terminal device such as a mobile phone, or a video camera.

Figure 28:
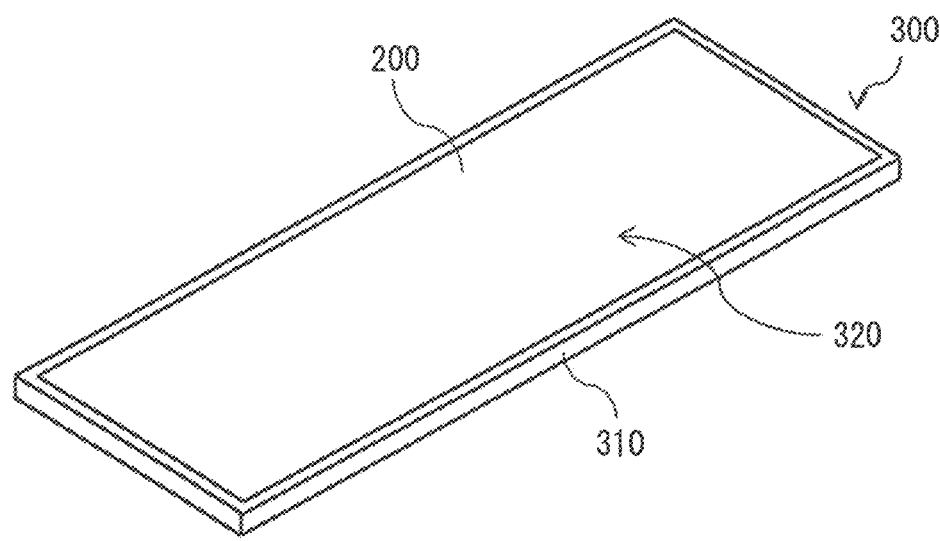
FIG. 28 illustrates a perspective view of an example appearance of an electronic apparatus having a light emission unit according to one embodiment of the disclosure.

FIG. 28 illustrates a perspective view of an appearance of an electronic apparatus 300 according to this application example. The electronic apparatus 300 may be, for example, a sheet-like personal computer having a display surface 320 at a main surface of a casing 310. The electronic apparatus 300 may have the light emission unit 200 according to the second example embodiment and the modification examples of the second example embodiment, at the display surface 320 thereof. The light emission unit 200 according to the second example embodiment and the modification examples of the second example embodiment may be disposed so that the light emission panel 210 faces the outside. In this application example, the light emission unit 200 according to the second example embodiment and the modification examples of the second example embodiment is provided at the display surface 320, and therefore, the electronic apparatus 300 has high display quality.

Second Application Example

Described below is an application example of the light emission unit 200 according to the second example embodiment and the modification examples of the second example embodiment. The light emission unit 200 according to the second example embodiment and the modification examples of the second example embodiment may be used as a light source of a lighting apparatus in any field, such as a desktop lighting apparatus, a floor lighting apparatus, or an indoor lighting apparatus.

Figure 29:
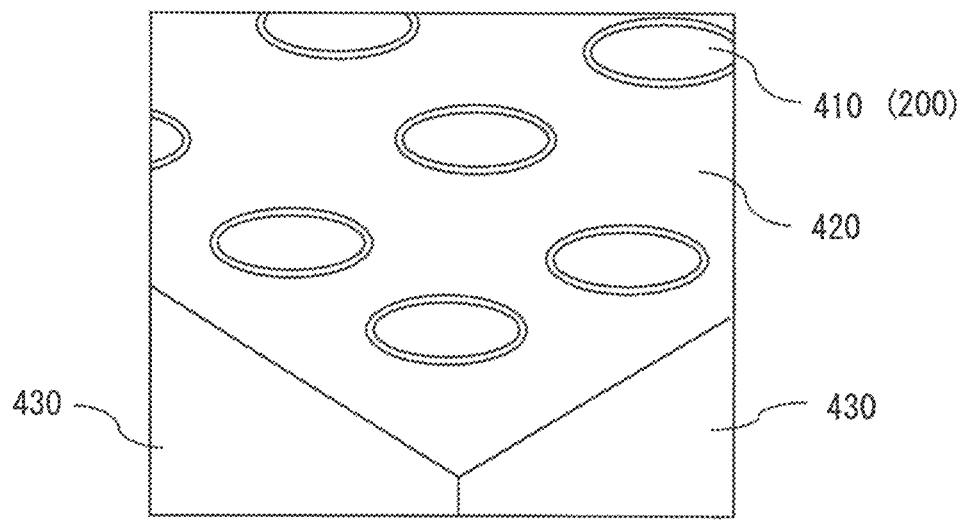
FIG. 29 illustrates a perspective view of an example appearance of a lighting apparatus having a light emission unit according to one embodiment of the disclosure.

FIG. 29 illustrates an appearance of an indoor lighting apparatus that uses the light emission unit 200 according to the second example embodiment and the modification examples of the second example embodiment. This lighting apparatus may, for example, include a lighting unit 410 that has the light emission unit 200 according to the second example embodiment and the modification examples of the second example embodiment. An appropriate number of the lighting units 410 may be arranged with an appropriate distance on a ceiling 420 in a building. The lighting unit 410 may also be placed at any site such as a wall 430 or an unillustrated floor according to the purpose of use, in addition to or instead of the ceiling 420.

Such a lighting apparatus may perform lighting using light from the light emission unit 200 according to the second example embodiment and the modification examples of the second example embodiment. Thus, a lighting apparatus having high lighting quality is achieved.

Although description has been given hereinabove with reference to the second example embodiment and the modification examples of the second example embodiment, the technology is not limited thereto, but may be modified in a wide variety of ways.

7. Third Example Embodiment

[Configuration]

Figure 30:
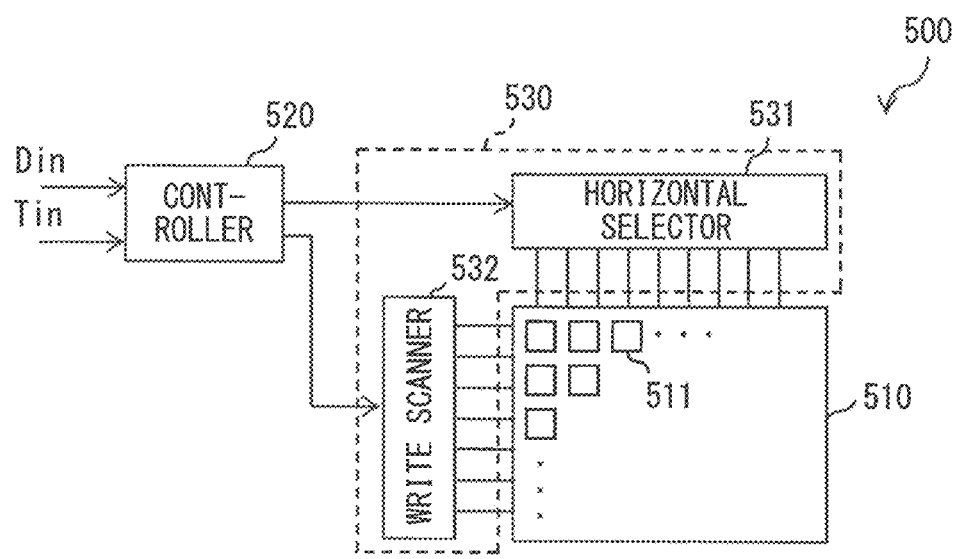
FIG. 30 illustrates an example outline configuration of an organic electro luminescence unit according to one embodiment of the disclosure.
Figure 31:
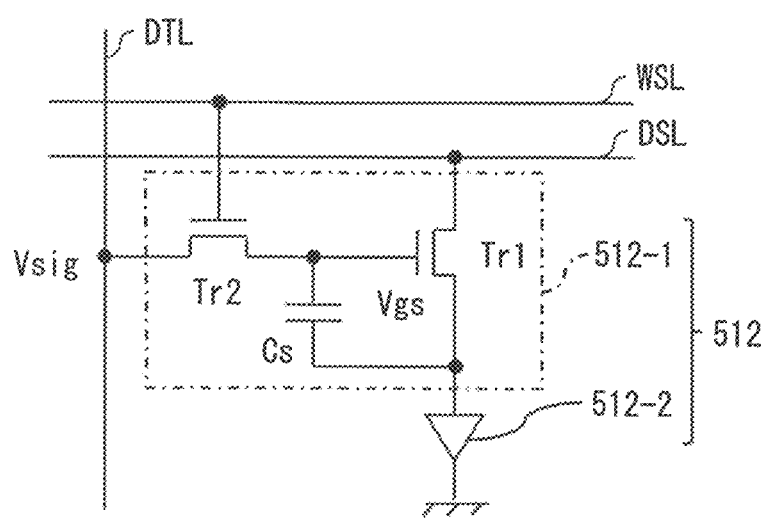
FIG. 31 illustrates an example circuit configuration of a subpixel included in each pixel illustrated in FIG. 30.

FIG. 30 illustrates an example outline configuration of a light emission unit 500 according to the third example embodiment of the disclosure. FIG. 31 illustrates an example circuit configuration of a subpixel 512 included in each pixel 511 that is provided to the light emission unit 500. The light emission unit 500 may include, for example, a light emission panel 510, a controller 520, and a driver 530. The driver 530 may be mounted, for example, at an outer periphery of the light emission panel 510. The light emission panel 510 may include multiple pixels 511 that are arranged in a matrix. The controller 520 and the driver 530 may drive the light emission panel 510 (i.e., the multiple pixels 511) on the basis of an image signal Din and a synchronous signal Tin that are received from an external device.

[Light Emission Panel 510]

In response to active matrix driving of each of the pixels 511 by the controller 520 and the driver 530, the light emission panel 510 may display an image on the basis of the image signal Din and the synchronous signal Tin received from an external device. The light emission panel 510 may include multiple scanning lines WSL each extending in a row direction, multiple signal lines DTL each extending in a column direction, multiple power supply lines DSL each extending in the row direction, and the multiple pixels 511 arranged in the matrix.

The scanning line WSL may be provided to select each of the pixels 511 and may supply a selection pulse to each of the pixels 511. The selection pulse may be used to select each of the pixels 511 on a predetermined unit basis, for example, on a pixel row basis. The signal line DTL may be provided to supply, to each of the pixels 511, a signal voltage Vsig in response to the image signal Din and may supply a data pulse including the signal voltage Vsig to each of the pixels 511. The power supply line DSL may be provided to supply electric power to each of the pixels 511.

Each of the pixels 511 may include, for example, a subpixel 512 that emits red light, a subpixel 512 that emits green light, and a subpixel 512 that emits blue light. That is, the multiple subpixels 512 may be grouped into multiple color pixels, that is, the pixels 511, by a predetermined number. Each of the pixels 511 may further include, for example, a subpixel 512 that emits other color, such as white color or yellow color. Each of the pixels 511 may also include multiple non-light emission pixels 515, which are described below. Each of the pixels 511 may include the multiple subpixels 512 that are lined in a predetermined direction, for example, a row direction.

Each of the signal lines DTL may be coupled to an output terminal of a horizontal selector 531 described below. For example, the multiple signal lines DTL may be respectively allocated to the pixel columns, one by one. Each of the scanning lines WSL may be coupled to an output terminal of a write scanner 532 described below. For example, the multiple scanning lines WSL may be respectively allocated to the pixel rows, one by one. Each of the power supply line may be coupled to an output terminal of a power supply. For example, the multiple power supply lines DSL may be respectively allocated to the pixel rows, one by one.

Each of the subpixels 512 may include a pixel circuit 512-1 and a light emission element 512-2. Details of the light emission element 512-2 are described below.

The pixel circuit 512-1 may control light emission and light extinction of the light emission element 512-2. The pixel circuit 512-1 may hold a voltage that is written in each of the subpixels 512 by means of write scanning described below. The pixel circuit 512-1 may include, for example, a drive transistor Tr1, a switching transistor Tr2, and a storage capacitor Cs.

The switching transistor Tr2 may control application of a signal voltage Vsig corresponding to the image signal Din, to a gate of the drive transistor Tr1. In an example embodiment, the switching transistor Tr2 may sample a voltage of the signal line DTL and may write the sampled voltage into a gate of the drive transistor Tr1. The drive transistor Tr1 may be serially coupled to the light emission element 512-2. The drive transistor Tr1 may drive the light emission element 512-2. The drive transistor Tr1 may control a current that flows in the light emission element 512-2 in accordance with the magnitude of the voltage sampled by the switching transistor Tr2. The storage capacitor Cs may hold a predetermined voltage between the gate and a source of the drive transistor Tr1. The storage capacitor Cs may hold the voltage Vgs constant between the gate and the source of the drive transistor Tr1 during a predetermined period. The pixel circuit 512-1 may have a circuit configuration further including various types of capacitors and transistors that are added to the 2Tr1C circuit or may have a circuit configuration different from that of the 2Tr1C circuit.

Each of the signal lines DTL may be coupled to the output terminal of the horizontal selector 531 and a source or a drain of the switching transistor Tr2. The horizontal selector 531 is described below. Each of the scanning lines WSL may be coupled to an output terminal of the write scanner 532 and a gate of the switching transistor Tr2. The write scanner 532 is described below. Each of the power supply lines DSL may be coupled to a power supply circuit and a source or the drain of the drive transistor Tr1.

The gate of the switching transistor Tr2 may be coupled to the scanning line WSL. The source or the drain of the switching transistor Tr2 may be coupled to the signal line DTL. The terminal that is not coupled to the signal line DTL, of one of the source and the drain of the switching transistor Tr2, may be coupled to the gate of the drive transistor Tr1. The source or the drain of the drive transistor Tr1 may be coupled to the power supply line DSL. The terminal that is not coupled to the power supply line DSL, of one of the source and the drain of the drive transistor Tr1, may be coupled to an anode 521 of the light emission element 512-2. An end of the storage capacitor Cs may be coupled to the gate of the drive transistor Tr1. The other end of the storage capacitor Cs may be coupled to the terminal of one of the source and the drain of the drive transistor Tr1, which is on the light emission element 512-2 side.

[Driver 530]

The driver 530 may include, for example, the horizontal selector 531 and the write scanner 532. The horizontal selector 531 may apply an analog signal voltage Vsig to each of the signal lines DTL in response to an input of a control signal in a synchronous manner, for example. The analog signal voltage Vsig may be transmitted from the controller 520. The write scanner 532 may scan the multiple subpixels 512 on a predetermined unit basis.

[Controller 520]

The controller 520 is described below. The controller 520 may correct a digital image signal Din received from an external device, in accordance with a predetermined condition and may generate a signal voltage Vsig on the basis of the corrected image signal. The controller 520 may output the generated signal voltage Vsig to the horizontal selector 531, for example. The controller 520 may output a control signal to each circuit in the driver 530 in response to the synchronous signal Tin received from an external device, in a synchronous manner, for example.

Figure 32:
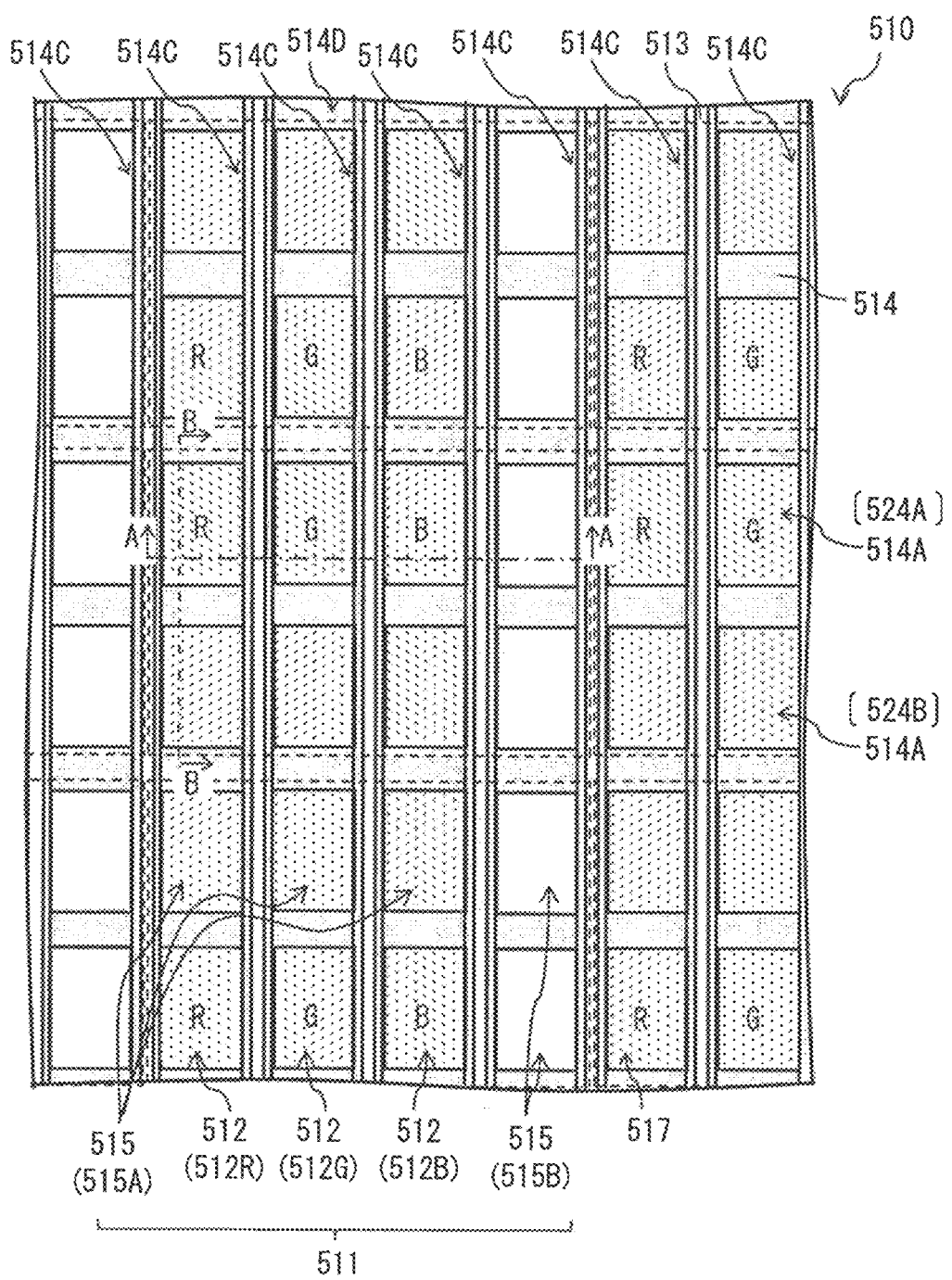
FIG. 32 illustrates an example outline structure of a light emission panel illustrated in FIG. 30.
Figure 33:
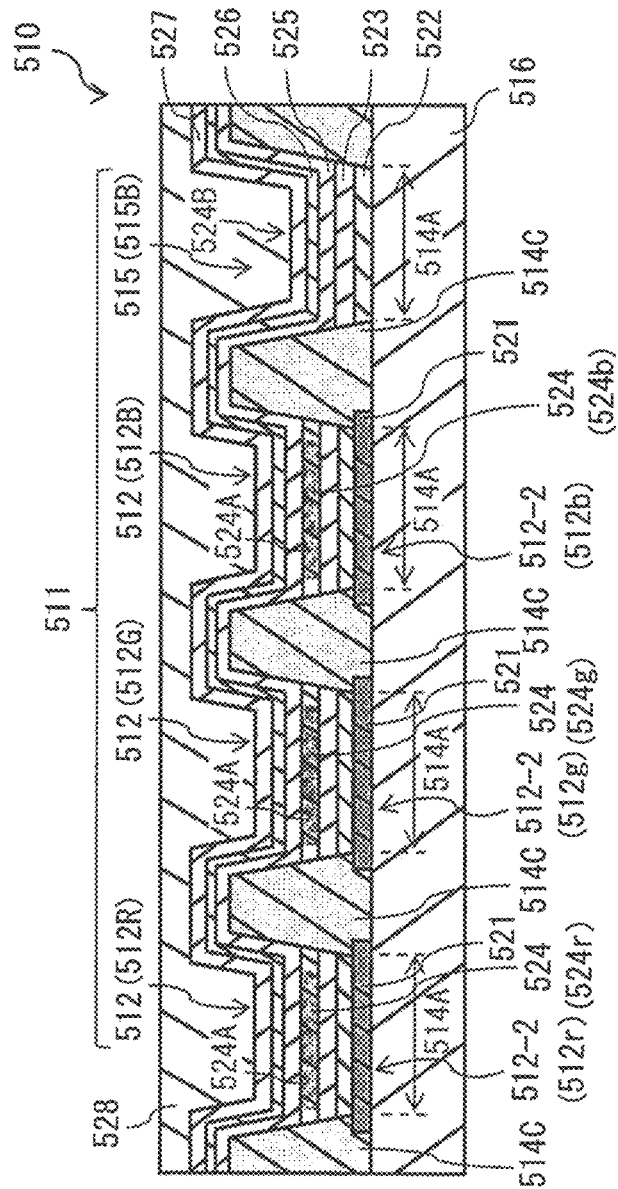
FIG. 33 illustrates an example cross-sectional structure of the light emission panel taken along a line A-A illustrated in FIG. 32.
Figure 34:
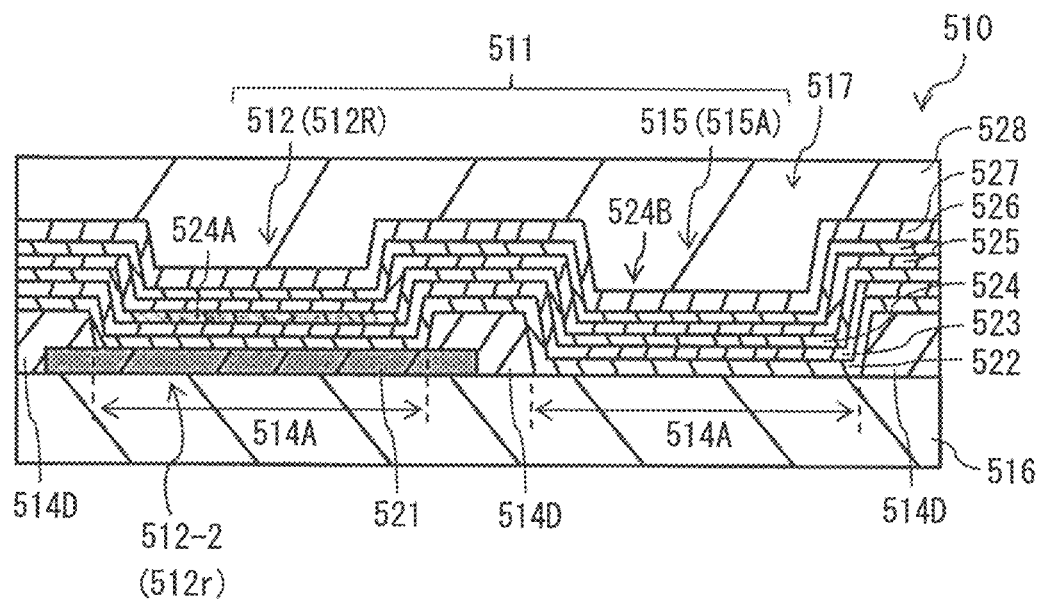
FIG. 34 illustrates an example cross-sectional structure of the light emission panel taken along a line B-B illustrated in FIG. 32.

The light emission element 512-2 and a non-light emission pixel 515 are described below with reference to FIGS. 32 to 34. FIG. 32 illustrates an example outline structure of the light emission panel 510. FIG. 33 illustrates an example cross-sectional structure of the light emission panel 510 taken along a line A-A illustrated in FIG. 32, which is an example cross-sectional structure in the row direction of the pixels 511. FIG. 34 illustrates an example cross-sectional structure of the light emission panel 510 taken along a line B-B illustrated in FIG. 32, which is an example cross-sectional structure in the column direction of the pixels 511.

FIG. 32 illustrates dotted regions to which light emission layers 524 are respectively provided. The light emission layer 524 is described below. In addition, a region that is indicated by the symbol "R" may be provided with a subpixel 512 that emits red light, a region that is indicated by the symbol "G" may be provided with a subpixel 512 that emits green light, and a region that is indicated by the symbol "B" may be provided with a subpixel 512 that emits blue light. In this case, the subpixels 512 that emit red light, green light, and blue light may also be referred as subpixel 512R, subpixel 512G, and subpixel 512B, respectively. A region with no indication may be provided with the non-light emission pixel 515. FIG. 32 exemplifies a case in which the pixel 511 includes three subpixels 512, that is, subpixels 512R, 512G, and 512B, and five non-light emission pixels 515.

The light emission panel 510 may include the multiple pixels 511 that are arranged in a matrix. Each of the pixels 511 may include, for example, the subpixel 512 that emits red light, the subpixel 512 that emits green light, and the subpixel 512 that emits blue light, as described above. In this case, the subpixels 512 that emit red light, green light, and blue light may also be referred as the subpixel 512R, the subpixel 512G, and the subpixel 512B, respectively. The light emission panel 510 may further include multiple non-light emission pixels 515 each including a light transmission region 524B having visible-light transmissivity.

The subpixel 512R may include a light emission element 512-2 (512r) that emits red light. The subpixel 512G may include a light emission element 512-2 (512g) that emits green light. The subpixel 512B may include a light emission element 512-2 (512b) that emits blue light. The subpixels 512R, 512G, and 512B may be arrayed in a stripe form, for example. In an example embodiment, the subpixels 512R, 512G, and 512B may be arranged in the row direction in each of the pixels 511. Moreover, for example, multiple subpixels 512 that emit light of the same color may be arranged in the column direction.

The non-light emission pixel 515 may have a region through which light in a visible region transmits from a back surface of the light emission panel 510 to a front surface of the light emission panel 510. In an example embodiment, the light in the visible region may enter from a substrate 516. One or more of the subpixels 512 and one or more of the non-light emission pixels 515 may be alternately arranged on a pixel 511 basis in a first array direction of the multiple pixels 511. In the embodiment of the technology, the first array direction may be the row direction. FIG. 32 illustrates three subpixels 512, which are the subpixels 512R. 512G, and 512B, and one non-light emission pixel 515 that are alternately arranged on a pixel 511 basis in the row direction. Moreover, one or more of the subpixels 512 and one or more of the non-light emission pixels 515 may be alternately arranged in a unit of two pixels 511 in a second array direction of the multiple pixels 511. In the embodiment of the technology, the second array direction may be the column direction. FIG. 32 illustrates two subpixels 512, which are two subpixels 512R, 512G, or 512B, and two non-light emission pixels 515 that are alternately arranged in a unit of two pixels 511 in the column direction.

The light emission panel 510 may include the substrate 516. The substrate 516 may include, for example, a base and a wiring layer that is provided on the base. The base may support each of light emission elements 512-2, an insulation layer 514, each of column limiting sections 514C, each of row limiting sections 514D, and other components. The column limiting section 514C and the row limiting section 514D are described below. The base of the substrate 516 may include a material having visible-light transmissivity. In an example embodiment, the base of the substrate 516 may include alkalifree glass, soda glass, nonfluorescent glass, phosphate glass, borate glass or quartz. In another example, the base of the substrate 516 may include an acrylic resin, a styrene resin, a polycarbonate resin, an epoxy resin, a polyethylene, polyester, a silicone resin, or an alumina. The wiring layer of the substrate 516 may include, for example, the pixel circuit 512-1 of each of the pixels 511, which is formed thereon. A part of the substrate 516 that faces the light transmission region 524B may have light transmissivity. In an example embodiment, the other part of the substrate 516 may also have light transmissivity. The light transmission region 524B is described below.

In the light emission panel 510, an insulation layer 514 may be provided on the substrate 516. The insulation layer 514 may be provided to partition the subpixels 512. In an example embodiment, the upper limit of the thickness of the insulation layer 514 may be in a range that enables controlling the shape of the insulation layer 514 during its manufacturing process, from a point of view of variation in film thickness and control of a bottom line width. For example, the thickness of the insulation layer 514 may be 10 μm or smaller. In another example embodiment, the upper limit of the thickness of the insulation layer 514 may be in a range that enables suppressing an increase in tact time due to an increase in exposure time during a light exposure process as well as suppressing a decrease in productivity during a mass-production process. For example, the thickness of the insulation layer 514 may be 7 μm or smaller. In an example embodiment, the lower limit of the thickness of the insulation layer 514 may be determined by resolution limits of an exposure apparatus and its material because the bottom line width should be increased to approximately the same degree as the film thickness as the film thickness decreases. The lower limit of the thickness of the insulation layer 514 may be 1 μm or greater in an example case of using a semiconductor stepper, and may be 2 μm or greater in an example case of using a stepper and a scanner for a flat panel. In short, the thickness of the insulation layer 514 may be 1 μm or greater and 10 μm or smaller, or may be 2 μm or greater and 7 μm or smaller.

The insulation layer 514 may include multiple column limiting sections 514C and multiple row limiting sections 514D that partition the subpixels 512. The column limiting section 514C may correspond to a specific but non-limiting example of the "first wall" of the disclosure. The row limiting section 514D may correspond to a specific but non-limiting example of the "second wall" of the disclosure.

Each of the column limiting sections 514C may extend in a predetermined direction (i.e., the column direction), whereas each of the row limiting sections 514D may extend in a direction (i.e., the row direction) perpendicular to the column direction of the column limiting sections 514C. The multiple column limiting sections 514C may extend in the column direction and may be parallel to each other in the row direction at predetermined intervals. The multiple row limiting sections 514D may extend in the row direction and may be parallel to each other in the column direction at predetermined intervals. The multiple column limiting sections 514C and the multiple row limiting sections 514D may intersect each other, for example, may be perpendicular to each other, forming a grid layout. Each of the subpixels 512 and each of the non-light emission pixels 515 may be respectively surrounded by two adjacent column limiting sections 514C and two adjacent row limiting sections 514D. Thus, the two adjacent column limiting sections 514C and the two adjacent row limiting sections 514D may partition the subpixels 512 and the non-light emission pixels 515.

The insulation layer 514 may include an opening 514A in a region that is surrounded by the two adjacent column limiting sections 514C and the two adjacent row limiting sections 514D. Each of the subpixels 512 may have the anode 521 that is exposed to a hole injection layer 522 at a lower part of the opening 514A. The anode 521 and the hole injection layer 522 are described below. Thus, the anode 521 that is exposed to the hole injection layer 522 at the lower part of the opening 514A may provide positive holes, and the positive holes may recombine with electrons supplied from a cathode 527 described below, in the light emission layer 524, thereby generating light at the light emission layer 524. That is, a region of the light emission layer 524 that faces the opening 514A where the anode 521 is exposed to the hole injection layer 522 at the lower part, may serve as a light emission region 524A.

In each of the non-light emission pixels 515, the anode 521 may not be provided at the lower part of the opening 514A, and the surface of the substrate 516 is exposed to the hole injection layer 522, for example. Each of the non-light emission pixels 515 may have a region facing the opening 514A and having visible-light transmissivity. Thus, the region that faces the opening 514A in each of the non-light emission pixels 515 may serve as a light transmission region 524B having visible-light transmissivity. The light transmission region 524B of each of the non-light emission pixels 515 may be provided in a region interposed between two adjacent light emission regions 524A, for example. In an example embodiment, the light transmission region 524B of the light emission panel 510 may be located relative to the light emission region 524A in the first array direction and the second array direction of the multiple pixels 511. In the embodiment of the technology, the first array direction may correspond to the row direction, and the second array direction may correspond to the column direction.

For example, the height of the row limiting section 514D from the substrate 516 may be lower than the height of the column limiting section 514C from the substrate 516, as illustrated in FIGS. 33 and 34. In an example embodiment, the height of the row limiting section 514D from the substrate 516 may be half or smaller of the distance between the anode 521 and the cathode 527 of the light emission element 512-2. Under these conditions, the multiple subpixels 512 that are lined in the column direction may be disposed in a belt-shaped groove 517. The belt-shaped groove 517 may be formed by two column limiting sections 514C, which are respectively on the left and right sides of these subpixels 512. For example, these multiple subpixels 512 may share the light emission layer 524. The subpixel 512 and the non-light emission pixel 515 that are lined in the column direction also may be disposed in the belt-shaped groove 517. The belt-shaped groove 517 may be formed by two column limiting sections 514C, which are respectively on the left and right sides of this subpixel 512 and this non-light emission pixel 515. For example, this subpixel 512 and this non-light emission pixel 515 may share the light emission layer 524. That is, the light emission layer 524 may cross over the row limiting section 514D between two adjacent subpixels 512 and may also cross over the row limiting section 514D between the subpixel 512 and the adjacent non-light emission pixel 515. In other words, the light emission layer 524 may be shared by two adjacent subpixels 512 with the row limiting section 514D therebetween and may also be shared by the subpixel 512 and the adjacent non-light emission pixel 515 with the row limiting section 514D therebetween. In FIG. 32, the non-light emission pixel 515 having the light emission layer 524 may be indicated by the reference sign "515A", whereas the non-light emission pixel 515 without the light emission layer 524 may be indicated by the reference sign "515B".

Each of the openings 514A may have, for example, an inverted trapezoidal cross section in the row direction as illustrated in FIG. 33. Also, each of the openings 514A may have, for example, an inverted trapezoidal cross section in the column direction as illustrated in FIG. 34. That is, a side surface of each of the openings 514A may have a reflector structure that rises light emitted from the light emission layer 524. A refractive index of a sealing layer 528 and a refractive index of the insulation layer 514 may satisfy the following formulas (1) and (2):

$$1.15 \leq n_1 \leq 1.8 \tag{1}$$

$$|n_1 - n_2| \geq 0.20 \tag{2}$$

where $n_1$ represents refractive index of the sealing layer 528, and $n_2$ represents the refractive index of the insulation layer 514.

In an example embodiment of the technology, $n_2$ is 1.4 or greater and 1.6 or smaller. These conditions improve an efficiency in extracting light emitted from the light emission layer 524, to the outside.

Furthermore, a depth D of each of the openings 514A, which is the thickness of the insulation layer 514, an upper surface side open width Wh of the insulation layer 514, and a lower surface side open width WL, may preferably satisfy the following formulas (3) and (4).

$$0.5 \leq WL/Wh \leq 0.8 \tag{3}$$

$$0.5 \leq D/WL \leq 2.0 \tag{4}$$

The shape according to the formulas (3) and (4) and the refractive index condition according to the formulas (1) and (2) make the insulation layer 514 have an opening 514A with a reflector structure, which improves the efficiency in extracting light from the light emission layer 524. As a result, according to the investigation performed by the inventors, luminance per subpixel 512 is increased to about 1.2 to 1.5 times of that in a case of not providing a reflector structure.

The insulation layer 514 may, for example, include an insulative organic material. Non-limiting examples of the insulative organic material may include an acrylic resin, a polyimide resin, and a novolak phenol resin. The insulation layer 514 may preferably include an insulative resin having heat resistivity and solvent resistivity, for example. The column limiting section 514C and the row limiting section 514D may be formed by processing an insulative resin into a desired pattern by photolithography and developing. The column limiting section 514C may have, for example, a forward tapered cross section, as illustrated in FIG. 33. The row limiting section 514D may have, for example, a forward tapered cross section, as illustrated in FIG. 34.

The light emission panel 510 may include, for example, multiple column banks 513 on the insulation layer 514. Each of the column banks 513 may extend in the column direction and may be in contact with an upper surface of the column limiting section 514C. Each of the column banks 513 may have liquid repellency. Thus, each of the column banks 513 prevents an ink of a subpixel 512 from flowing into another subpixel 512 for other color during the formation of the light emission element 512-2 on the substrate 516.

Each of the light emission elements 512-2 may include, for example, the anode 521, the hole injection layer 522, a hole transport layer 523, the light emission layer 524, an electron transport layer 525, an electron injection layer 526, and the cathode 527, on the substrate 516, in this order from the substrate 516. In the embodiment of the technology, the light emission layer 524 may correspond to an organic light emission layer of the disclosure.

In an example embodiment, the light emission element 512-2 may include the light emission layer 524 and include the anode 521 and the cathode 527 that have the light emission layer 524 therebetween. In this example, the light emission element 512-2 may further include the hole injection layer 522 and the hole transport layer 523, in this order from the anode 521, between the anode 521 and the light emission layer 524. One or both of the hole injection layer 522 and the hole transport layer 523 may not be provided. In this example embodiment, the light emission element 512-2 may also include the electron transport layer 525 and the electron injection layer 526, in this order from the light emission layer 524, between the light emission layer 524 and the cathode 527. One or both of the electron transport layer 525 and the electron injection layer 526 may not be provided. The light emission element 512-2 may have an element structure that includes the anode 521, the hole injection layer 522, the hole transport layer 523, the light emission layer 524, the electron transport layer 525, the electron injection layer 526, and the cathode 527, in this order from the substrate 516. The light emission element 512-2 may further include other functional layer.

The hole injection layer 522 may be provided to increase an injection efficiency of holes. The hole transport layer 523 may be provided to transport holes that are injected from the anode 521, to the light emission layer 524. The light emission layer 524 may emit light of a predetermined color by means of recombination between electrons and holes. The electron transport layer 525 may be provided to transport electrons that are injected from the cathode 527, to the light emission layer 524. The electron injection layer 526 may be provided to increase an injection efficiency of electrons. One or both of the hole injection layer 522 and the electron injection layer 526 may not be provided. Each of the light emission element 512-2 may further include a layer in addition to the components described above.

The anode 521 may be, for example, formed on the substrate 516. The anode 521 may include be a reflective electrode having reflectivity, and include aluminum (Al), silver (Ag), an alloy of aluminum and silver, or other material. The anode 521 may be a component including a reflective electrode and a transparent electrode that are stacked. Non-limiting examples of the material of the transparent electrode may include a transparent electrically-conductive material of indium-tin oxide (ITO) or of indium-zinc oxide (IZO). An edge of the anode 521 may be embedded in the insulation layer 514, for example. In the case where the edge of the anode 521 is embedded in the insulation layer 514, it is possible to adjust the area of the subpixel 512 and the area of the light emission region 524A by varying the dimensions of each of the openings 514A. In an example embodiment, the dimensions of the bottom of each of the openings 514A may be varied.

The cathode 527 may be, for example, a transparent electrode of an ITO film, an IZO film, or other material. In one embodiment of the technology, in a case where the anode 521 has reflectivity while the cathode 527 has light transmissivity, the light emission element 512-2 may have a top-emission structure in which light is emitted from the cathode 527 side. The embodiment of the technology may use the substrate 516 that has visible-light transmissivity, and therefore, it is possible for a user to visually recognize an object behind the light emission panel 510. That is, the light emission panel 510 may be a visible-light transmissive panel.

The hole injection layer 522 may promote injection of holes from the anode 521 to the light emission layer 524. The hole injection layer 522 may include an oxide of silver (Ag), molybdenum (Mo), chromium (Cr), vanadium (V), tungsten (W), nickel (Ni), or iridium (Ir), or a conductive polymer material such as polyethylenedioxythiophene (PEDOT), which is a mixture of polythiophene and polystyrene sulfonate. The hole injection layer 522 may include a single layer or multiple layers that are stacked.

The hole transport layer 523 may transport holes that are injected from the anode 521, to the light emission layer 524. The hole transport layer 523 may include, for example, a material that transports holes injected from the anode 521 to the light emission layer 524. This material may be hereinafter referred as a "hole transport material 523M". The hole transport layer 523 may mainly include the hole transport material 523M.

Non-limiting examples of the hole transport material 523M for the material of the hole transport material 523 may include an arylamine derivative, a triazole derivative, an oxadiazole derivative, an imidazole derivative, a polyaryl alkane derivative, a pyrazoline derivative, a pyrazolone derivative, a phenylenediamine derivative, an amino substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, a tetraphenyl benzine derivative, and a combination thereof. For example, the materials of the hole injection layer 522 and the hole transport layer 523 may have a difference in a highest occupied molecular orbital (HOMO) level of 0.5 eV or smaller in consideration of an injection property of holes.

The light emission layer 524 may emit light in response to generation of excitons by means of recombination of holes that are injected from the anode 521, and electrons that are injected from the cathode 527, in the light emission layer 524. The light emission layer 524 may be, for example, a coated film. The light emission layer 524 may be formed by coating and drying solution. The solution may have a solute mainly including an organic material that generates excitons due to recombination of holes and electrons and thereby emits light. This organic material may be hereinafter referred as an "organic luminescent material 524M". The light emission layer 524 may mainly include the organic luminescent material 524M. The light emission element 512r of the subpixel 512R may use an organic luminescent material 524M that includes a red organic luminescent material. The light emission element 512g of the subpixel 512G may use an organic luminescent material 524M that includes a green organic luminescent material. The light emission element 512b of the subpixel 512B may use an organic luminescent material 524M that includes a blue organic luminescent material.

The light emission layer 524 may include a single layer of an organic light emission layer or multiple organic light emission layers that are stacked. In a case where the light emission layer 524 includes multiple organic light emission layers that are stacked, the light emission layer 524 may be a stacked layer of multiple organic light emission layers that have the same main component. In this case, the multiple organic light emission layers all may be coated films. The multiple organic light emission layers all may be formed by coating and drying solution that has a solute made primarily of the organic luminescent material 524M.

In an example embodiment of the technology, the organic luminescent material 524M for the material of the light emission layer 524 may include only a dopant. In another example embodiment of the technology, the organic luminescent material 524M may include a combination of a host and a dopant. That is, the light emission layer 524 may include a host and a dopant as the organic luminescent material 524M. The host may mainly serve to transport electrons or electric charges of holes, whereas the dopant may serve to cause light emission. The kind of each of the host and the dopant is not limited to one, but a combination of two or more kinds of hosts or dopants may be used. In an example embodiment, the amount of the dopant may be 0.01 weight % or greater and 30 weight % or smaller, with respect to the host. In another example embodiment, the amount of the dopant may be 0.01 weight % or greater and 10 weight % or smaller, with respect to the host.

The host for the light emission layer 524 may be, for example, an amine compound, a condensed polycyclic aromatic compound, or a heterocyclic compound. Non-limiting examples of the amine compound may include a monoamine derivative, a diamine derivative, a triamine derivative, and a tetraamine derivative. Non-limiting examples of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Non-limiting examples of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

The dopant for the light emission layer 524 may be, for example, a pyrene derivative, a fluoranthene derivative, an arylacetylene derivative, a fluorene derivative, a perylene derivative, an oxadiazole derivative, an anthracene derivative, or a chrysene derivative. Alternatively, the dopant for the light emission layer 524 may be a metal complex. Non-limiting examples of the metal complex may include a material having a ligand and an atom of metal such as iridium (Ir), platinum (Pt), osmium (Os), gold (Au), rhenium (Re), or ruthenium (Ru).

The electron transport layer 525 may transport electrons that are injected from the cathode 527, to the light emission layer 524. The electron transport layer 525 may mainly include an organic material having an electron transporting property. This organic material may be hereinafter referred as an "electron transport material 525M". The electron transport layer 525 may include, for example, a vapor-deposited film or a sputtered film. In an example embodiment of the technology, the electron transport layer 525 may have an electric-charge blocking property of suppressing passing through of electric charges (holes in the embodiment), from the light emission layer 524 to the cathode 527. Additionally, the electron transport layer 525 may preferably have a property of suppressing light extinction in an exited state of the light emission layer 524.

The electron transport material 525M for the material of the electron transport layer 525 may be, for example, an aromatic heterocyclic compound including one or more heteroatoms in the molecule. Non-limiting examples of the aromatic heterocyclic compound may include a compound having a pyridine ring, a pyrimidine ring, a triazine ring, a benzimidazole ring, a phenanthroline ring, or a quinazoline ring, in the skeleton. The electron transport layer 525 may contain a metal having an electron transporting property. The electron transport layer 525 containing a metal having the electron transporting property has an improved electron transporting property. Non-limiting examples of the metal contained the electron transport layer 525 may include barium (Ba), lithium (Li), calcium (Ca), potassium (K), cesium (Cs), sodium (Na), rubidium (Rb), and ytterbium (Yb).

The electron injection layer 526 may inject electrons injected from the cathode 527, to the electron transport layer 525 and the light emission layer 524. The electron injection layer 526 may include, for example, a material that promotes injection of electrons from the cathode 527 to the electron transport layer 525 and the light emission layer 524. This material may be referred as an "electron injection material" in the embodiment of the technology. The electron injection material may be, for example, an organic material having an injection property of electrons, to which a metal having an injection property of electrons is doped. The doped metal that is contained in the electron injection layer 526 may be the same as the metal contained in the electron transport layer 525, for example. The electron injection layer 526 may include, for example, a vapor-deposited film or a sputtered film.

In the embodiment of the technology, each of the layers constituting the light emission element 512-2, such as the hole injection layer 522, the hole transport layer 523, and the light emission layer 524, may be shared by the subpixels 512 that are provided in the region of the groove 517 surrounded by the two adjacent column limiting sections 514C. That is, each of the layers constituting the light emission element 512-2, such as the hole injection layer 522, the hole transport layer 523, and the light emission layer 524, may extend in the column direction in the groove 517 so as to be continuously provided between the subpixels 512, between the non-light emission pixels 515, or between the subpixel 512 and the non-light emission pixel 515, across the row limiting section 514D, as illustrated in FIGS. 32 to 34, for example.

In the embodiment of the technology, some of the layers in the light emission element 512-2, such as the hole injection layer 522, the hole transport layer 523, and the light emission layer 524, may not be shared by the subpixels 512 of one pixel 511, but may be formed separately with respect to each of the subpixels 512 of one pixel 511. That is, some of the layers in the light emission element 512-2, such as the hole injection layer 522, the hole transport layer 523, and the light emission layer 524, may be formed to avoid the column limiting section 514C, as illustrated in FIG. 33, for example. In an example embodiment of the technology, some of the layers in the light emission element 512-2, such as the electron transport layer 525 and the electron injection layer 526, may be shared by the subpixels 512 of one pixel 511. That is, some of the layers in the light emission element 512-2, such as the electron transport layer 525 and the electron injection layer 526, may be formed across the column limiting section 514C, as illustrated in FIG. 33, for example.

In the embodiment of the technology, the cathode 527 may be formed over an entire surface of the light emission panel 510. In an example embodiment, the cathode 527 may be continuously formed over the entire surface of the electron injection layer 526, the column limiting section 514C, the row limiting section 514D, and the column bank 513.

The light emission element 512-2 may further include, for example, a layer for protecting and sealing the light emission element 512-2 (i.e., the sealing layer 528) as illustrated in FIGS. 33 and 34. The sealing layer 528 may include a resin material such as an epoxy resin or a vinyl resin.

[Effects]

Effects of the light emission panel 510 of an example embodiment of the technology and the light emission unit 500 having the same are described below.

In the example embodiment of the technology, one or more of the subpixels 512 and one or more of the non-light emission pixels 515 are alternately arranged on a pixel 511 basis in the first array direction, and one or more of the subpixels 512 and one or more of the non-light emission pixels 515 are alternately arranged in a unit of two pixels 511 in the second array direction. In the embodiment of the technology, the first array direction may correspond to the row direction, and the second array direction may correspond to the column direction. That is, one or more of the subpixels 512 and one or more of the non-light emission pixels 515 are alternately arranged in each of the first array direction and the second array direction. In the embodiment of the technology, the first array direction may be the row direction, and the second array direction may be the column direction. This structure enables providing a light transmission region 524B with a sufficient width in each of the first array direction and the second array direction. In the embodiment of the technology, the first array direction may be the row direction, and the second array direction may be the column direction. As a result, generation of optical diffraction failure is decreased.

Figure 35:
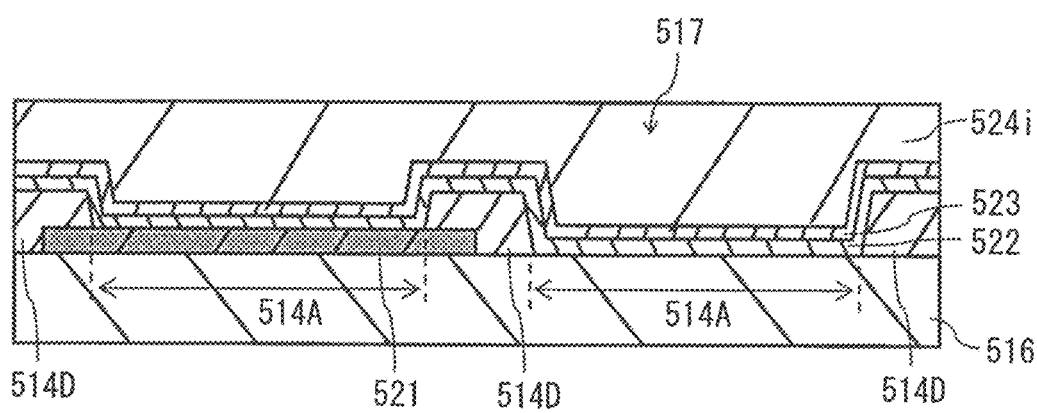
FIG. 35 illustrates a modification example of the outline structure of the light emission panel illustrated in FIG. 30.

In the embodiment of the technology, the non-light emission pixel 515 and the adjacent subpixel 512 in the second array direction share the light emission layer 524. In the embodiment of the technology, the second array direction may be the column direction. In this case, each of the multiple row limiting sections 514D partitions two adjacent ones of the subpixels 512 and also partitions two adjacent ones of the non-light emission pixels 515 in the region of the groove 517, which is interposed between two adjacent column limiting sections 514C. The row limiting section 514D is lower than the column limiting section 514C. Thus, for example, as illustrated in FIG. 35, in a case of forming the light emission layer 524 of each of the subpixels 512 by applying an ink 524i by means of dropping or other method, the ink 524i spreads throughout the entire groove 517. As described above, in the embodiment of the technology, the light emission layer 524 crosses over the row limiting section 514D between two adjacent subpixels 512 and also crosses over the row limiting section 514D between the subpixel 512 and the adjacent non-light emission pixel 515. This structure enables more uniform film thickness of the light emission layer 524 of the subpixels 512 for the same color, compared with a case of independently providing the light emission layer 524 in each of the subpixels 512 for the same color. Consequently, luminance unevenness is decreased.

In this embodiment, the substrate 516 is a visible-light transmissive substrate. Under these conditions, light that enters an object behind the light emission panel 510 through the light transmission region 524B of each of the subpixels 512 reflects back to a front surface of the light emission panel 510 through the light emission panel 510. As a result, it is possible for a user to visually recognize the object behind the light emission panel 510 through the light emission panel 510.

8. Modification Example of Third Example Embodiment

A modification example of the light emission panel 510 according to the third example embodiment is described below.

Modification Example A

Figure 36:
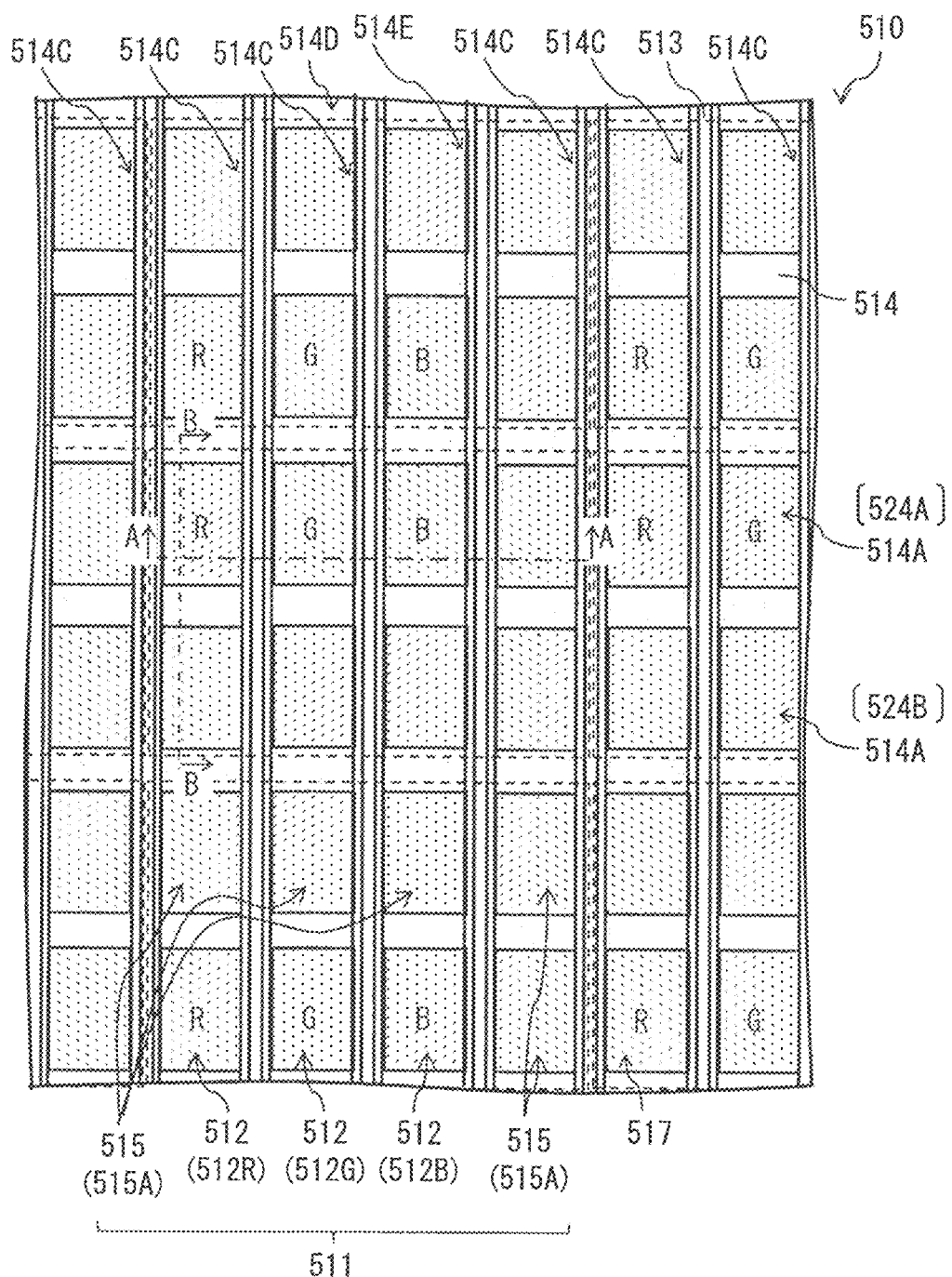
FIG. 36 illustrates a modification example of the outline structure of the light emission panel illustrated in FIG. 30.
Figure 37:
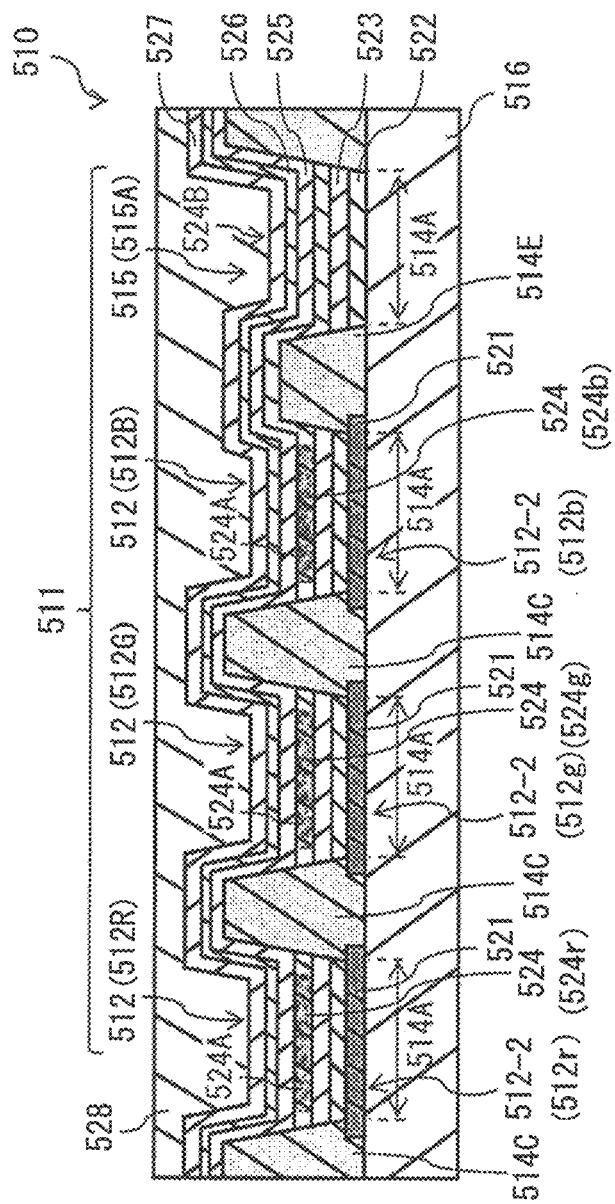
FIG. 37 illustrates an example cross-sectional structure of the light emission panel taken along a line A-A illustrated in FIG. 36.

FIG. 36 illustrates a modification example of the outline structure of the light emission panel 510 according to the third example embodiment. FIG. 37 illustrates an example cross-sectional structure of the light emission panel 510 taken along a line A-A illustrated in FIG. 36, which is an example cross-sectional structure of the pixel 511 in the row direction. An example cross-sectional structure that is taken along a line B-B in FIG. 36 may correspond to the cross-sectional structure in FIG. 34, for example.

In the light emission panel 510 according to the third example embodiment, the non-light emission pixel 515 and the subpixel 512 that are adjacent to each other in the first array direction may share the light emission layer 524. In an example embodiment, the subpixel 512 may be the subpixel 512B. In the embodiment of the technology, the first array direction may be the row direction. In this case, a column limiting section 514E may be provided between the non-light emission pixel 515 and the adjacent subpixel 512B that share the light emission layer 524, to partition them. The column limiting section 514E may be lower than the column limiting section 514C. For example, the column limiting section 514E may have the same height as the row limiting section 514D and may include a material similar to that of the row limiting section 514D.

Figure 38:
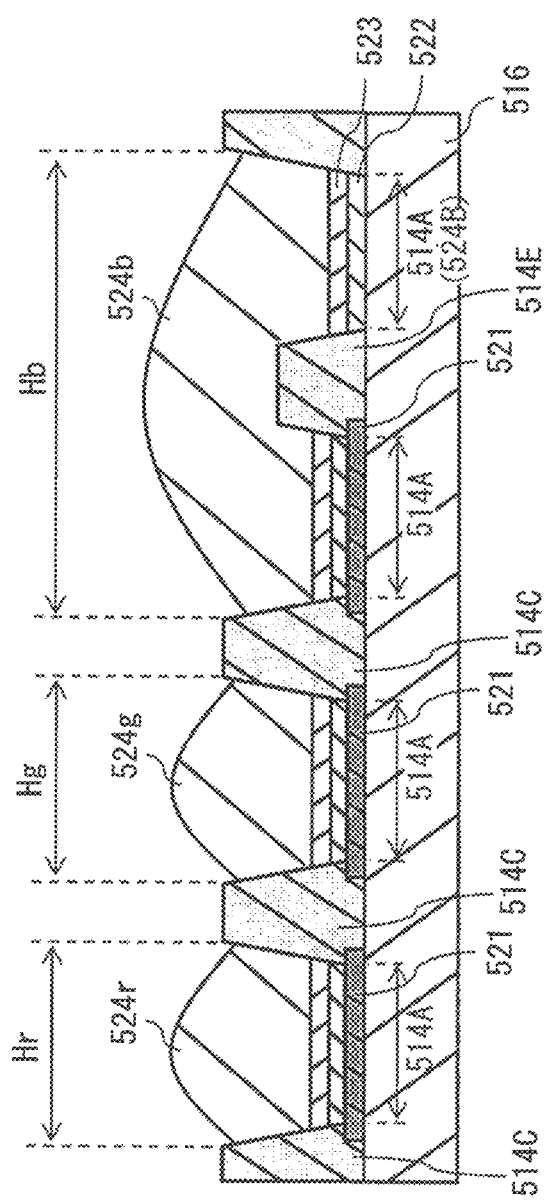
FIG. 38 illustrates an example manufacturing process of the light emission panel illustrated in FIG. 37.

Thus, for example, in a case of forming the light emission layer 524 of each of the subpixels 512 by applying an ink 524i, which is an ink 524r, 524g, or 524b, by means of dropping or other method, as illustrated in FIG. 35, the ink 524i spreads throughout the entire groove 517. Moreover, for example, in a case of forming the light emission layer 524 of each of the subpixels 512B by applying an ink 524b by means of dropping or other method, as illustrated in FIG. 38, it may be sufficient to drop the ink 524b in a groove with a width that is approximately twice the width of the groove 517. In the embodiment of the technology, the ink 524b may be dropped in the groove with an open width Hb that is approximately twice an open width Hr or Hg of the groove 517. This structure enables more uniform film thickness of the light emission layer 524 in each of the subpixels 512B, compared with a case of independently providing the light emission layer 524 in each of the subpixels 512B. Consequently, luminance unevenness is decreased. In forming each of the subpixels 512B, it may be sufficient to drop the ink 524b in the groove with the width that is approximately twice the width of the groove 517. For example, the ink 524b may be dropped in the groove with the open width Hb that is approximately twice the open width Hr or Hg of the groove 517. This decreases a required dropping accuracy of the ink 524b to be lower than both the required dropping accuracy of the ink 524r, which is dropped in the groove 517 with the open width Hr, and the required dropping accuracy of the ink 524g, which is dropped in the groove 517 with the open width Hg.

Modification Example B

Figure 39:
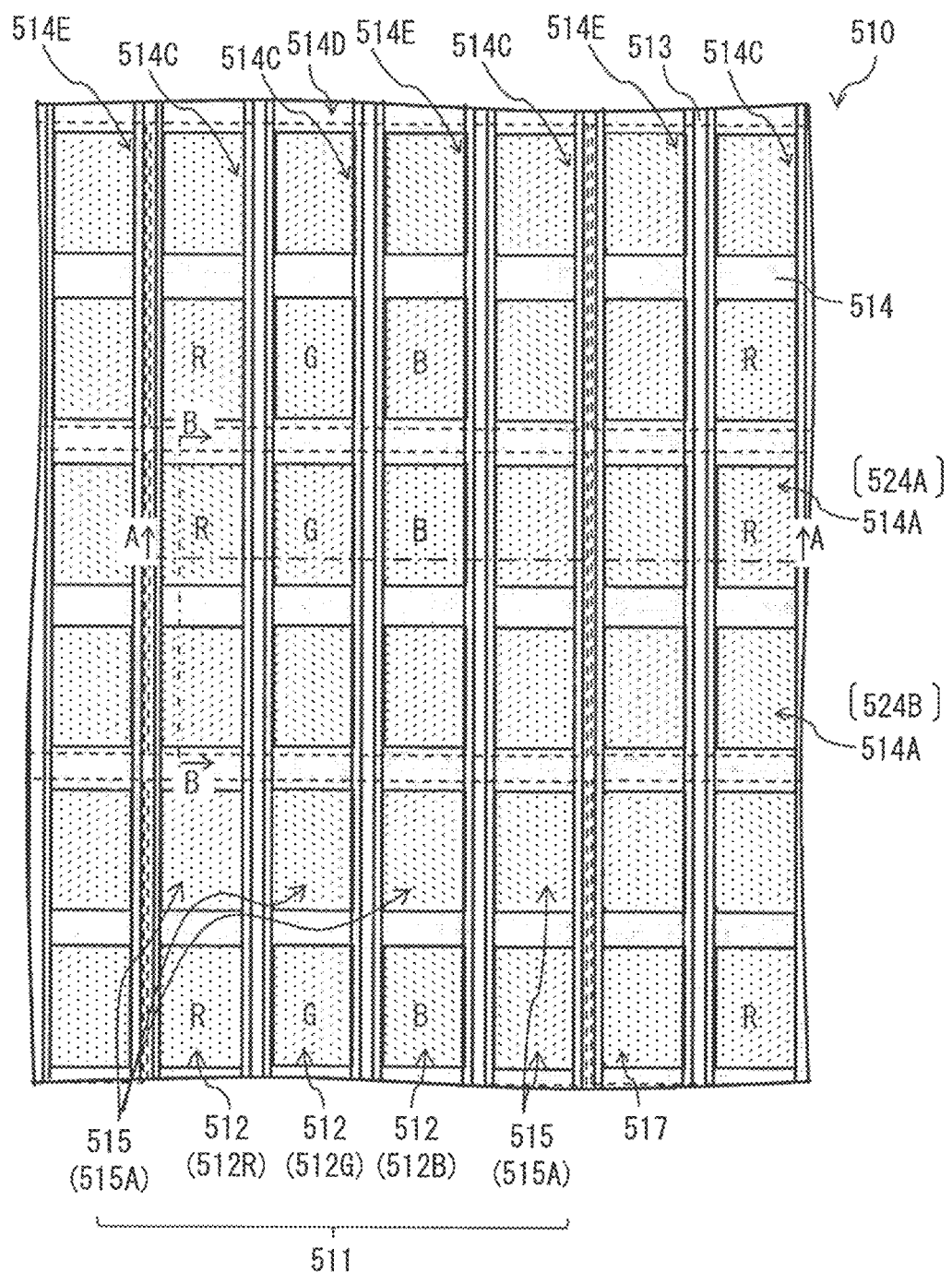
FIG. 39 illustrates a modification example of the outline structure of the light emission panel illustrated in FIG. 30.
Figure 40:
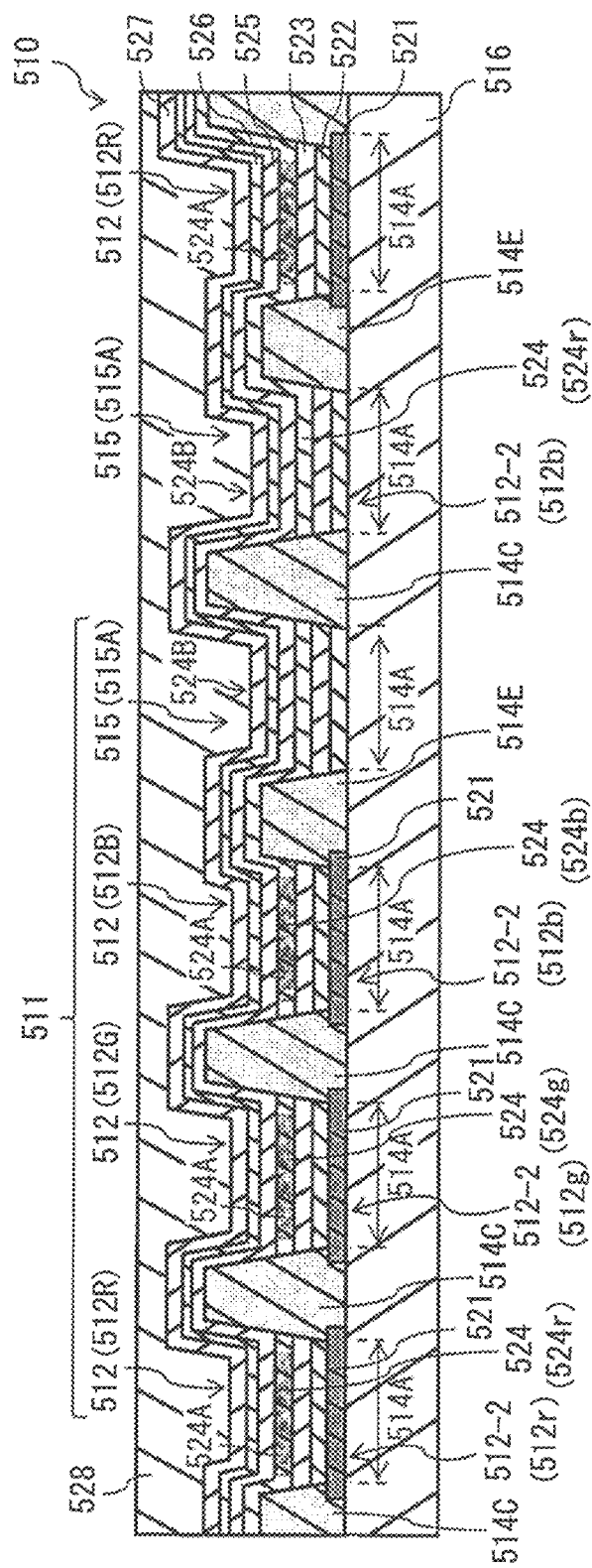
FIG. 40 illustrates an example cross-sectional structure of the light emission panel taken along a line A-A illustrated in FIG. 39.

FIG. 39 illustrates a modification example of the outline structure of the light emission panel 510 according to the third example embodiment. FIG. 40 illustrates an example cross-sectional structure of the light emission panel 510 taken along a line A-A illustrated in FIG. 39, which is an example cross-sectional structure of the pixel 511 in the row direction. An example cross-sectional structure that is taken along a line B-B in FIG. 39 may correspond to the cross-sectional structure in FIG. 34, for example.

The light emission panel 510 of this modification example may differ from the light emission panel 510 according to Modification Example A in that a first non-light emission pixel of one pixel 511 and a second non-light emission pixel of another pixel 511 are immediately adjacent to each other in the two adjacent pixels 511 in the first array direction. In an example embodiment of the technology, the first array direction may be the row direction, the first non-light emission pixel may be the non-light emission pixel 515 in the one pixel 511, and the second non-light emission pixel may be the non-light emission pixel 515 in another pixel 511. Moreover, in the light emission panel 510 of this modification example, the first non-light emission pixel and the adjacent subpixel 512 may share the light emission layer 524, and the second non-light emission pixel and the adjacent subpixel 512 may share the light emission layer 524. In the example embodiment, the non-light emission pixel 515 and the adjacent subpixel 512B may share the light emission layer 524, and the non-light emission pixel 515 and the adjacent subpixel 512R may share the light emission layer 524.

Figure 41:
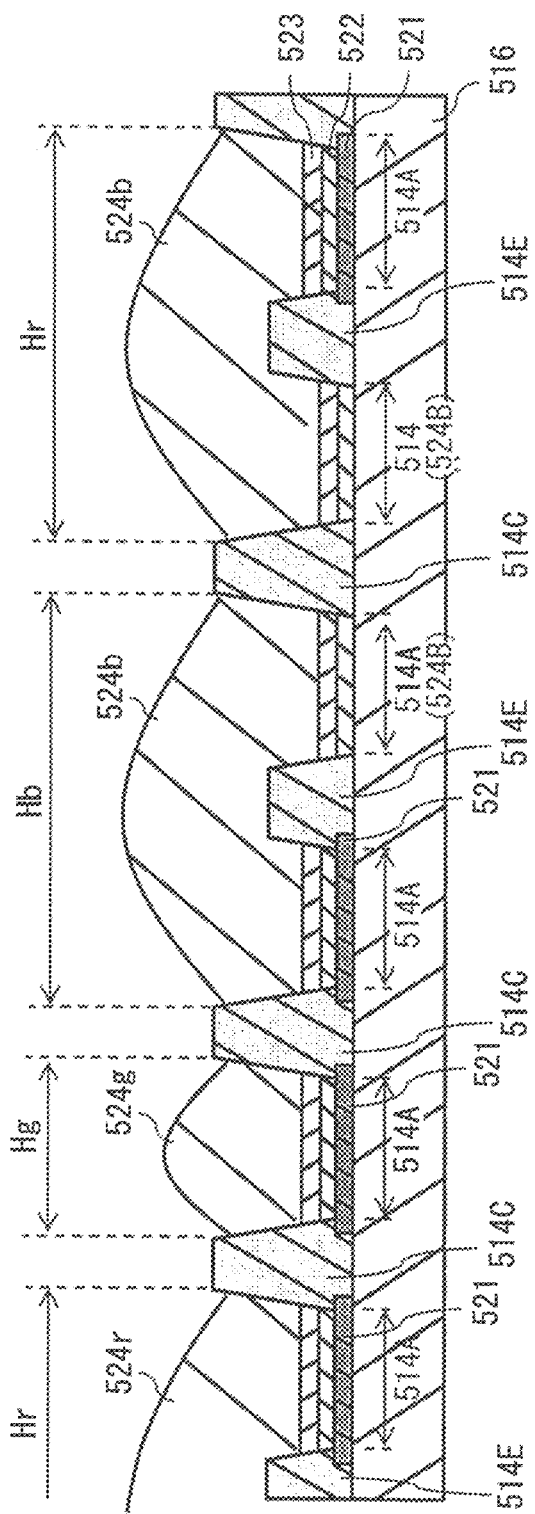
FIG. 41 illustrates an example manufacturing process of the light emission panel illustrated in FIG. 40.

Thus, for example, in a case of forming the light emission layer 524 of each of the subpixels 512 by applying an ink 524i by means of dropping or other method, as illustrated in FIG. 35, the ink 524i spreads throughout the entire groove 517. Moreover, for example, in a case of forming the light emission layer 524 of each of the subpixels 512B by applying an ink 524b by means of dropping or other method, as illustrated in FIG. 41, it may be sufficient to drop the ink 524b in a groove with a width that is approximately twice the width of the groove 517. In the embodiment of the technology, the ink 524b may be dropped in the groove with the open width Hb that is approximately twice the open width Hg of the groove 517. This structure enables more uniform film thickness of the light emission layer 524 in each of the subpixels 512B, compared with a case of independently providing the light emission layer 524 in each of the subpixels 512B. Also, in a case of forming the light emission layer 524 of each of the subpixels 512R by applying an ink 524r by means of dropping or other method, it may be sufficient to drop the ink 524r in a groove with a width that is approximately twice the width of the groove 517. In the embodiment of the technology, the ink 524r may be dropped in the groove with the open width Hr that is approximately twice the open width Hg of the groove 517. This structure enables more uniform film thickness of the light emission layer 524 in each of the subpixels 512R, compared with a case of independently providing the light emission layer 524 in each of the subpixels 512R. Consequently, luminance unevenness is decreased.

In forming each of the subpixels 512B, it may be sufficient to drop the ink 524b in the groove with the width that is approximately twice the width of the groove 517. For example, the ink 524b may be dropped in the groove with the open width Hb that is approximately twice the open width Hg of the groove 517. This decreases a required dropping accuracy of the ink 524b to be lower than the required dropping accuracy of the ink 524g, which is dropped in the groove 517 with the open width Hg. Also, in forming each of the subpixels 512R, it may be sufficient to drop the ink 524r in the groove with the width that is approximately twice the width of the groove 517. For example, the ink 524r may be dropped in the groove with the open width Hr that is approximately twice the open width Hg of the groove 517. This decreases a required dropping accuracy of the ink 524r to be lower than the required dropping accuracy of the ink 524g, which is dropped in the groove 517 with the open width Hg.

Modification Example C

Figure 42:
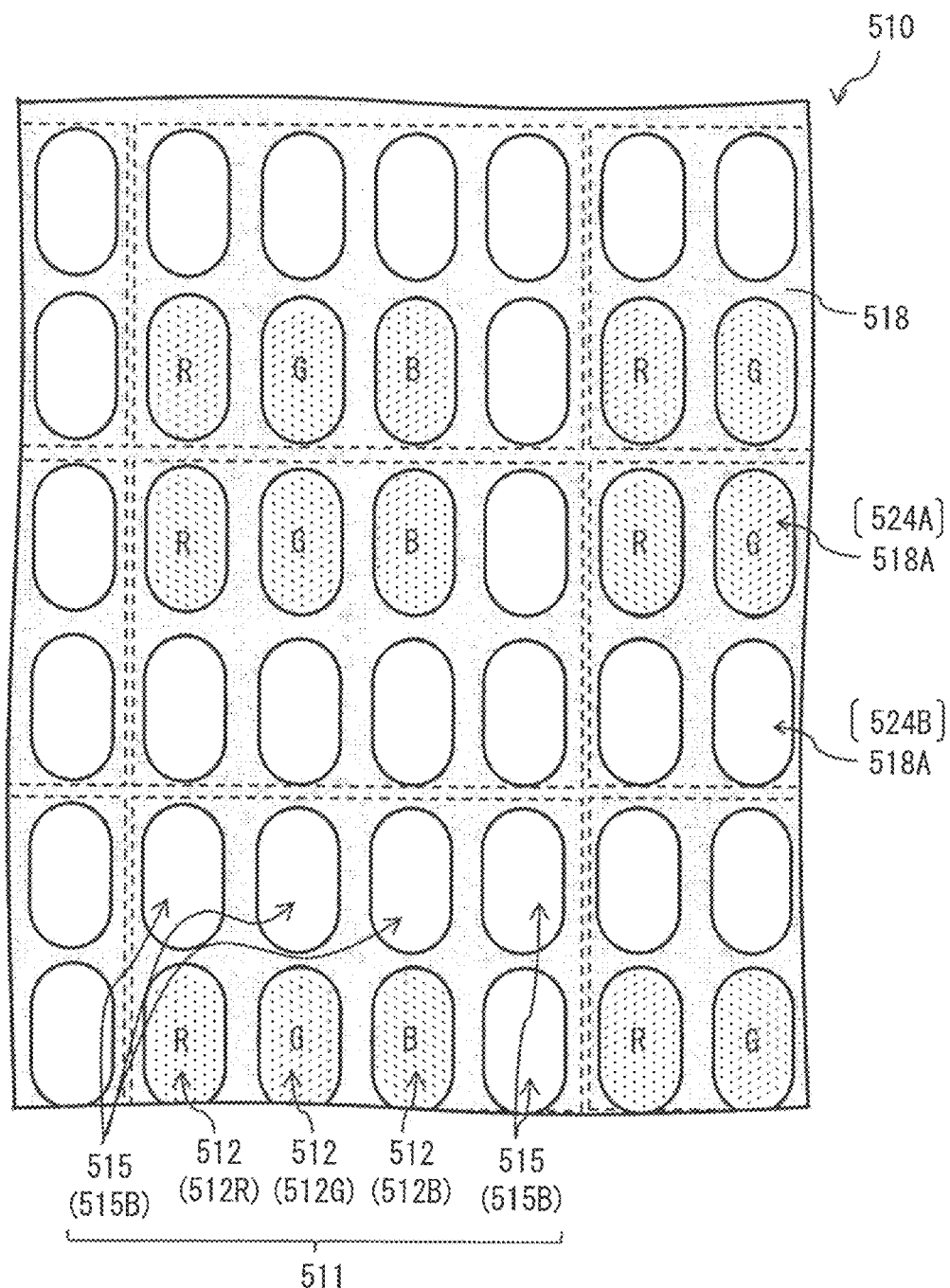
FIG. 42 illustrates a modification example of the outline structure of the light emission panel illustrated in FIG. 32.
Figure 43:
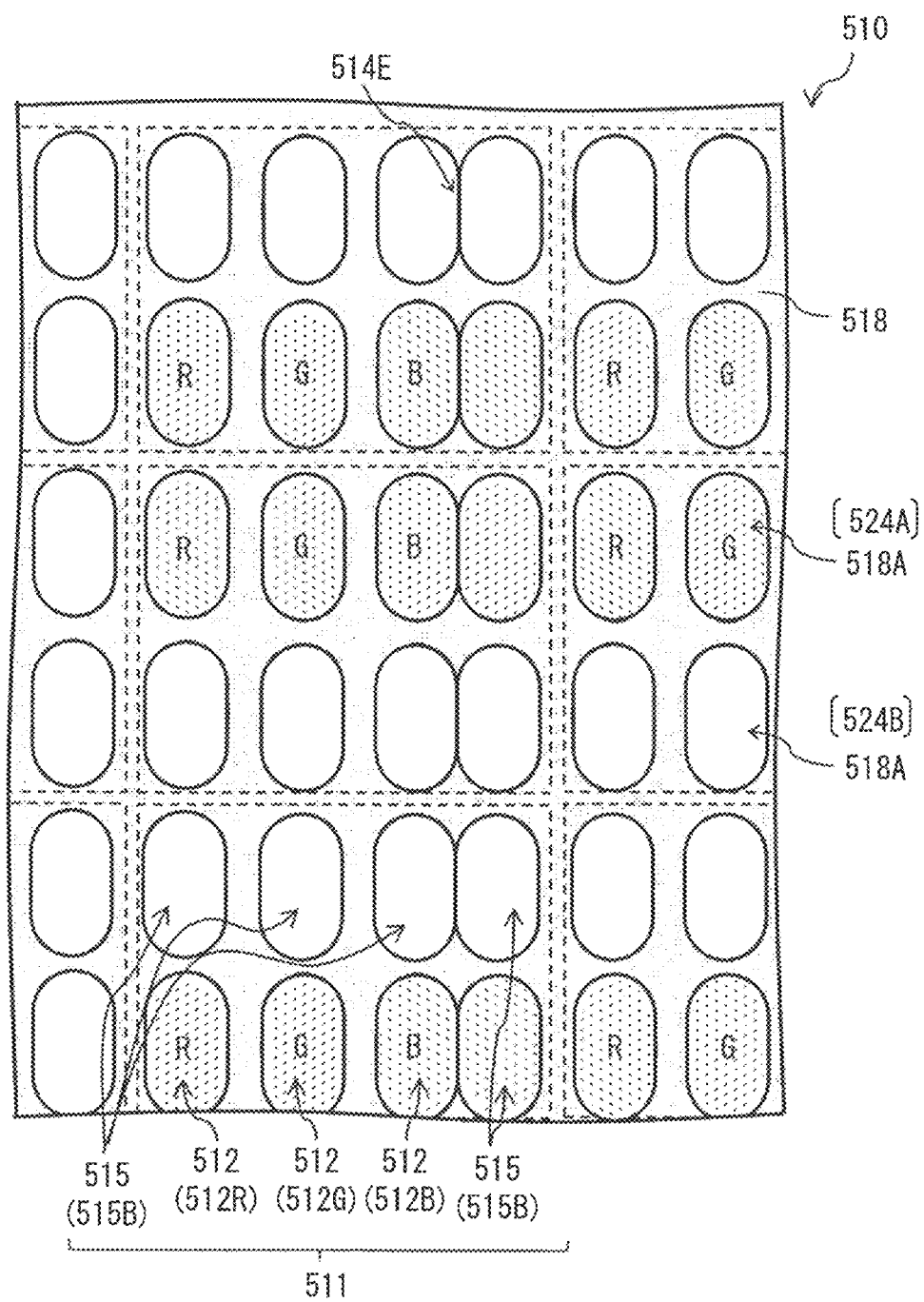
FIG. 43 illustrates a modification example of the outline structure of the light emission panel illustrated in FIG. 36.
Figure 44:
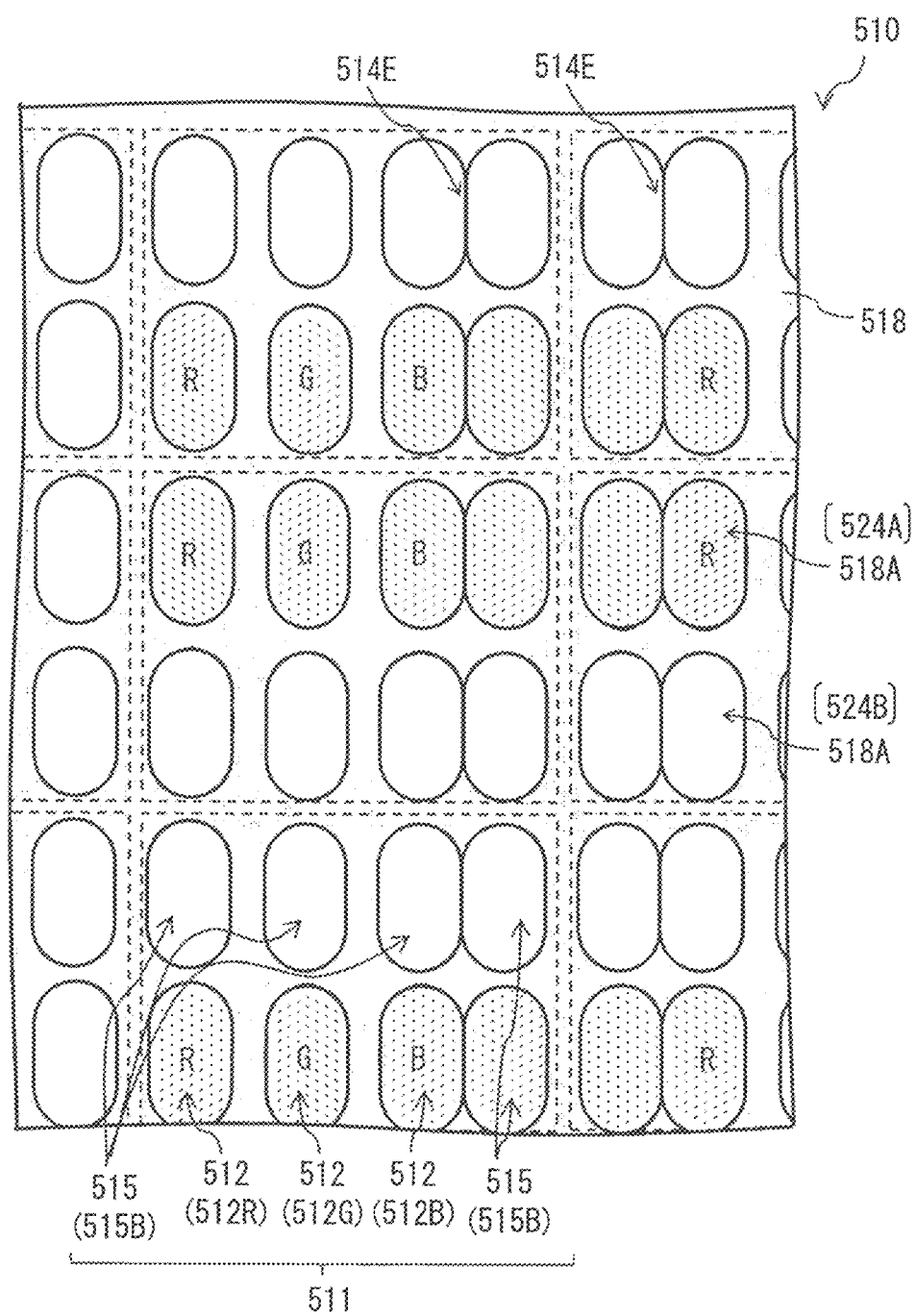
FIG. 44 illustrates a modification example of the outline structure of the light emission panel illustrated in FIG. 39.

FIG. 42 illustrates a modification example of the outline structure of the light emission panel 510 illustrated in FIG. 32. FIG. 43 illustrates a modification example of the outline structure of the light emission panel 510 illustrated in FIG. 36. FIG. 44 illustrates a modification example of the outline structure of the light emission panel 510 illustrated in FIG. 39.

This modification example may use an insulation layer 518 instead of the insulation layer 514. The insulation layer 518 may include multiple openings 518A that are provided in a matrix, and the insulation layer 518 may serve as pixel banks. The region that is surrounded by each of the openings 518A may be used for the subpixel 512 or the non-light emission pixel 515. Each of the subpixels 512 may have one light emission element 512-2. That is, each of the subpixels 512 may have one light emission element 512-2 in the opening 518A. On the other hand, each of the non-light emission pixels 515 may include a light transmission region 524B having visible transmissivity, in the opening 518A.

In this modification example, one or more of the subpixels 512 and one or more of the non-light emission pixels 515 may be alternately arranged on a pixel 511 basis in the first array direction, and one or more of the subpixels 512 and one or more of the non-light emission pixels 515 may be alternately arranged in a unit of two pixels 511 in the second array direction. In the embodiment of the technology, the first array direction may be the row direction, and the second array direction may be the column direction. That is, one or more of the subpixels 512 and one or more of the non-light emission pixels 515 may be alternately arranged in each of the first array direction and the second array direction. In the embodiment of the technology, the first array direction may be the row direction, and the second array direction may be the column direction. This structure enables providing a light transmission region 524B with a sufficient width in each of the first array direction and the second array direction. In the embodiment of the technology, the first array direction may be the row direction, and the second array direction may be the column direction. As a result, generation of optical diffraction failure is decreased.

In the light emission panel 510 illustrated in FIG. 42, the non-light emission pixel 515 and the adjacent subpixel 512 in the first array direction may share the light emission layer 524. In the embodiment of the technology, the first array direction may be the row direction. In this case, each of the multiple row limiting sections 514D may be provided to partition the adjacent subpixels 512 and to partition the adjacent non-light emission pixels 515 in the region of the groove 517, which is interposed between two adjacent column limiting sections 514C. The row limiting section 514D may be lower than the column limiting section 514C. Thus, for example, in a case of forming the light emission layer 524 of each of the subpixels 512 by applying an ink 524i by means of dropping or other method, the ink 524i spreads throughout the entire groove 517. As described above, in the light emission panel 510 illustrated in FIG. 42, the light emission layer 524 crosses over the row limiting section 514D between two adjacent subpixels 512 and also crosses over the row limiting section 514D between the subpixel 512 and the adjacent non-light emission pixel 515. This structure enables more uniform film thickness of the light emission layer 524 of the subpixels 512, compared with a case of independently providing the light emission layer 524 in each of the subpixels 512. Consequently, luminance unevenness is decreased.

In the light emission panel 510 illustrated in FIG. 43, the non-light emission pixel 515 and the subpixel 512 that are adjacent to each other in the first array direction may share the light emission layer 524. In an example embodiment, the subpixel 512 may be the subpixel 512B. In the embodiment of the technology, the first array direction may be the row direction. In this case, a column section 514E may be provided between the non-light emission pixel 515 and the adjacent subpixel 512B that share the light emission layer 524, to partition them. The column section 514E may be lower than the column limiting section 514C. For example, the column 514E may have the same height as the row limiting section 514D and may include a material similar to that of the row limiting section 514D.

Thus, for example, in a case of forming the light emission layer 524 of each of the subpixels 512 by applying an ink 524i, which is an ink 524r, 524g, or 524b, by means of dropping or other method, the ink 524i spreads throughout the entire groove 517. Moreover, for example, in a case of forming the light emission layer 524 of each of the subpixels 512B by applying an ink 524b by means of dropping or other method, it may be sufficient to drop the ink 524b in a groove with a width that is approximately twice the width of the groove 517. In the embodiment of the technology, the ink 524b may be dropped in the groove with an open width Hb that is approximately twice an open width Hr or Hg of the groove 517. This structure enables more uniform film thickness of the light emission layer 524 in each of the subpixels 512B, compared with a case of independently providing the light emission layer 524 in each of the subpixels 512B. Consequently, luminance unevenness is decreased. In forming each of the subpixels 512B, it may be sufficient to drop the ink 524b in the groove with the width that is approximately twice the width of the groove 517. For example, the ink 524b may be dropped in the groove with the open width Hb that is approximately twice the open width Hr or Hg of the groove 517. This decreases a required dropping accuracy of the ink 524b to be lower than both the required dropping accuracy of the ink 524r, which is dropped in the groove 517 with the open width Hr, and the required dropping accuracy of the ink 524g, which is dropped in the groove 517 with the open width Hg.

In the light emission panel 510 illustrated in FIG. 44, a first non-light emission pixel of one pixel 511 and a second non-light emission pixel of another pixel 511 may be immediately adjacent to each other in the two adjacent pixels 511 in the first array direction. In the embodiment of the technology, the first array direction may be the row direction, the first non-light emission pixel may be the non-light emission pixel 515 in the one pixel 511, and the second non-light emission pixel may be the non-light emission pixel 515 in another pixel 511. Moreover, in the light emission panel 510 illustrated in FIG. 44, the first non-light emission pixel and the adjacent subpixel 512 may share the light emission layer 524, and the second non-light emission pixel and the adjacent subpixel 512 may share the light emission layer 524. In an example embodiment, the non-light emission pixel 515 and the adjacent subpixel 512B may share the light emission layer 524, and the non-light emission pixel 515 and the adjacent subpixel 512R may share the light emission layer 524.

Thus, for example, in a case of forming the light emission layer 524 of each of the subpixels 512 by applying an ink 524i by means of dropping or other method, the ink 524i spreads throughout the entire groove 517. Moreover, for example, in a case of forming the light emission layer 524 of each of the subpixels 512B by applying an ink 524b by means of dropping or other method, it may be sufficient to drop the ink 524b in a groove with a width that is approximately twice the width of the groove 517. In the embodiment of the technology, the ink 524b may be dropped in the groove with the open width Hb that is approximately twice the open width Hg of the groove 517. This structure enables more uniform film thickness of the light emission layer 524 in each of the subpixels 512B, compared with a case of independently providing the light emission layer 524 in each of the subpixels 512B. Also, in a case of forming the light emission layer 524 of each of the subpixels 512R by applying an ink 524r by means of dropping or other method, it may be sufficient to drop the ink 524r in a groove with a width that is approximately twice the width of the groove 517. In the embodiment of the technology, the ink 524r may be dropped in the groove with the open width Hr that is approximately twice the open width Hg of the groove 517. This structure enables more uniform film thickness of the light emission layer 524 in each of the subpixels 512R, compared with a case of independently providing the light emission layer 524 in each of the subpixels 512R. Consequently, luminance unevenness is decreased.

In forming each of the subpixels 512B, it may be sufficient to drop the ink 524b in the groove with the width that is approximately twice the width of the groove 517. For example, the ink 524b may be dropped in the groove with the open width Hb that is approximately twice the open width Hg of the groove 517. This decreases a required dropping accuracy of the ink 524b to be lower than the required dropping accuracy of the ink 524g, which is dropped in the groove 517 with the open width Hg. Also, in forming each of the subpixels 512R, it may be sufficient to drop the ink 524r in the groove with the width that is approximately twice the width of the groove 517. For example, the ink 524r may be dropped in the groove with the open width Hr that is approximately twice the open width Hg of the groove 517. This decreases a required dropping accuracy of the ink 524r to be lower than the required dropping accuracy of the ink 524g, which is dropped in the groove 517 with the open width Hg.

In this modification example, the substrate 516 may be a visible-light transmissive substrate. Under these conditions, light that enters an object behind the light emission panel 510 through the light transmission region 524B of each of the subpixels 512 reflects back to a front surface of the light emission panel 510 through the light emission panel 510. As a result, it is possible for a user to visually recognize the object behind the light emission panel 510 through the light emission panel 510.

Modification Example D

Figure 45:
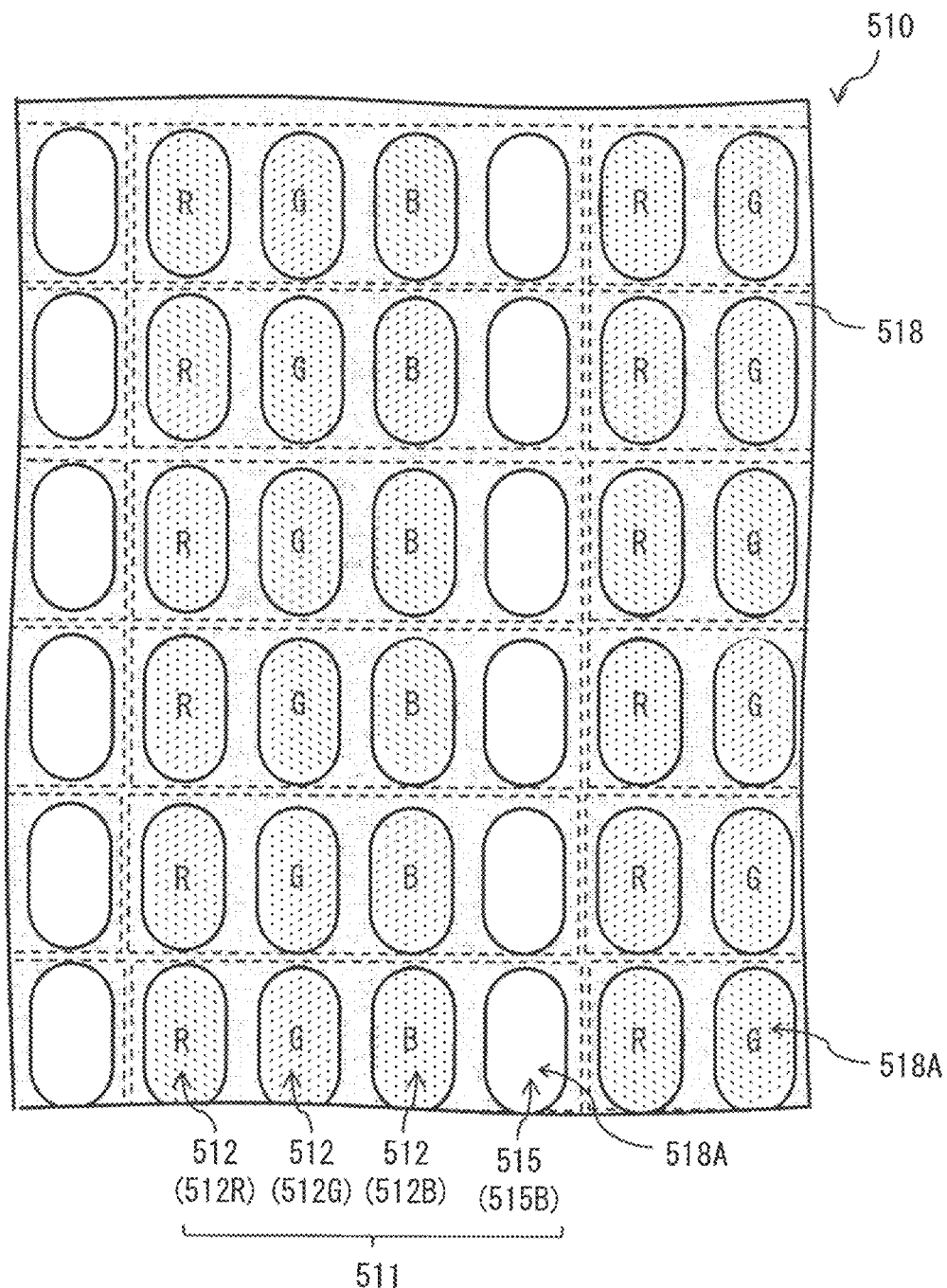
FIG. 45 illustrates a modification example of the outline structure of the light emission panel illustrated in FIG. 42.
Figure 46:
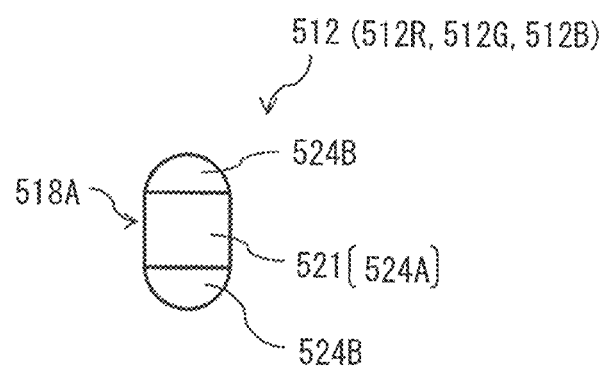
FIG. 46 illustrates an example outline structure of a subpixel of the light emission panel illustrated in FIGS. 41 to 44.

FIG. 45 illustrates a modification example of the outline structure of the light emission panel 510 illustrated in FIG. 42. FIG. 46 illustrates an example plane layout of each of the subpixels 512 illustrated in FIG. 45. In this modification example, the anode 521 of the light emission region 524A may be formed at a part of the opening 518A in each of the subpixels 512, and a region where the anode 521 of the light emission region 524A is not provided may be used as the light transmission region 524B. For example, the light transmission region 524B may be provided at each side in the column direction of the anode 521 of the light emission region 524A in the opening 518A. In another example, the light transmission region 524B may be provided at one of the sides in the column direction of the anode 521 of the light emission region 524A in the opening 518A. In such a case, the light transmission region 524B with a sufficient width is provided in the column direction without providing the non-light emission pixel 515 in the column direction. As a result, generation of optical diffraction failure is decreased.

Also, in each of the subpixels 512 of the light emission panel 510 according to Modification Example C, the anode 521 of the light emission region 524A may be formed at a part of the opening 518A in each of the subpixels 512, and a region where the anode 521 of the light emission region 524A is not provided may be used as the light transmission region 524B. Also in this case, the light transmission region 524B with a sufficient width is provided in the column direction. As a result, generation of optical diffraction failure is decreased.

Modification Example E

Figure 47:
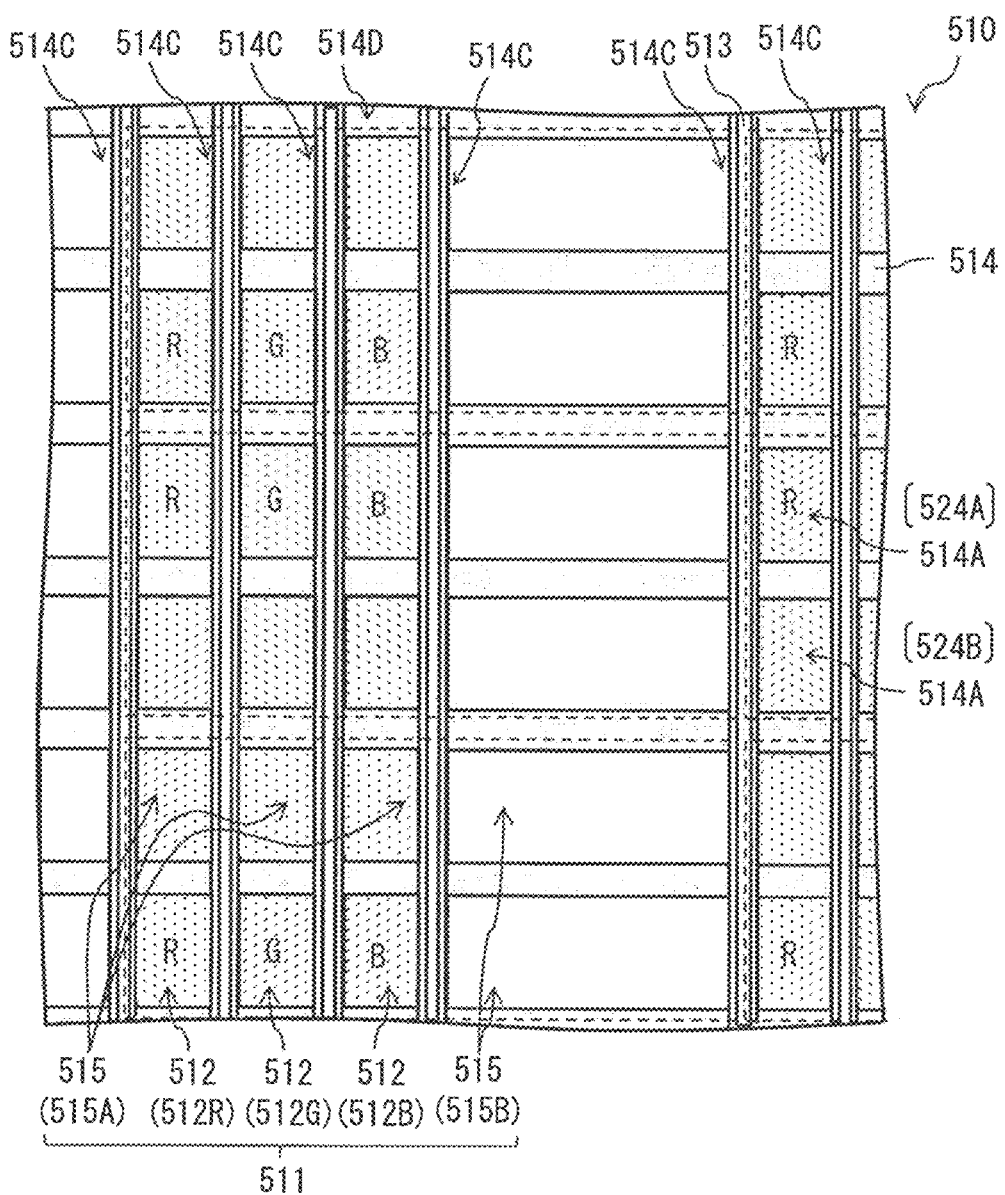
FIG. 47 illustrates a modification example of the outline structure of the light emission panel illustrated in FIG. 32.

FIG. 47 illustrates a modification example of the outline structure of the light emission panel 510 according to the third example embodiment. This modification example may use a non-light emission pixel 515B of which the length of the opening 514A is greater than that of the subpixel 512. For example, the length of the non-light emission pixel 515B may be approximately the same as the length of the pixel 511. In this case, the light transmission region 524B with a sufficient width is provided in the row direction. As a result, generation of optical diffraction failure is decreased.

Modification Example F

Figure 48:
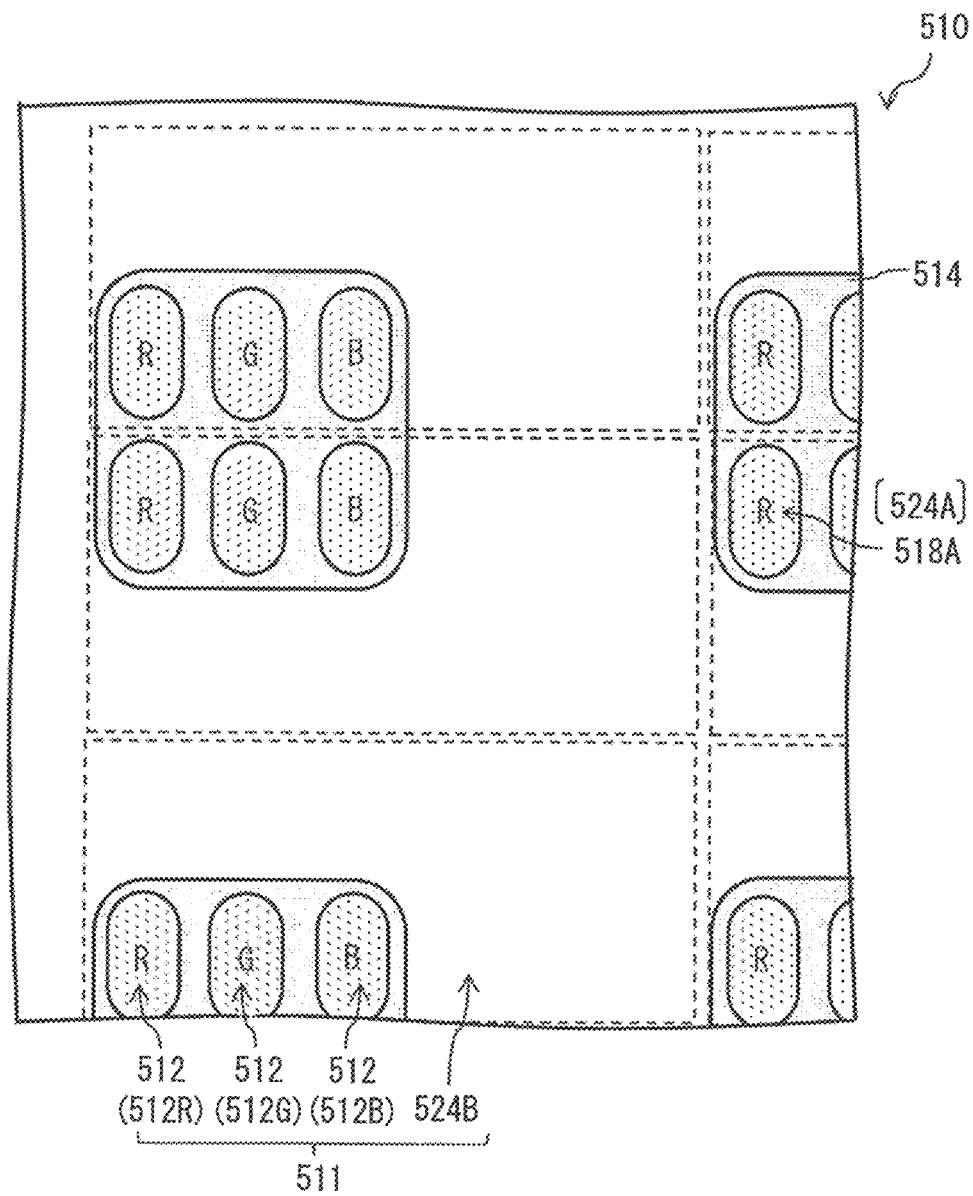
FIG. 48 illustrates a modification example of the outline structure of the light emission panel illustrated in FIG. 42.

FIG. 48 illustrates a modification example of the outline structure of the light emission panel 510 according to Modification Example C. This modification example may differ from the light emission panel 510 according to Modification Example C in that all of the regions where the non-light emission pixels 515B are formed are changed into the light transmission region 524B. That is, this modification example may include pixels 511 each of which is surrounded by the light transmission region 524B. In this case, the light transmission region 524B with a sufficient width is provided in the row direction and in the column direction. As a result, generation of optical diffraction failure is decreased.

9. Application Example

First Application Example

Described below is an application example of the light emission unit 500 according to the third example embodiment and the modification examples of the third example embodiment. The light emission unit 500 according to the third example embodiment and the modification examples of the third example embodiment may be used in a display unit of an electronic apparatus in every field, which displays an image or a picture by using an image signal received from an external device or generated therein, such as a television, a digital camera, a notebook personal computer, a sheet-like personal computer, a portable terminal device such as a mobile phone, or a video camera.

Figure 49:
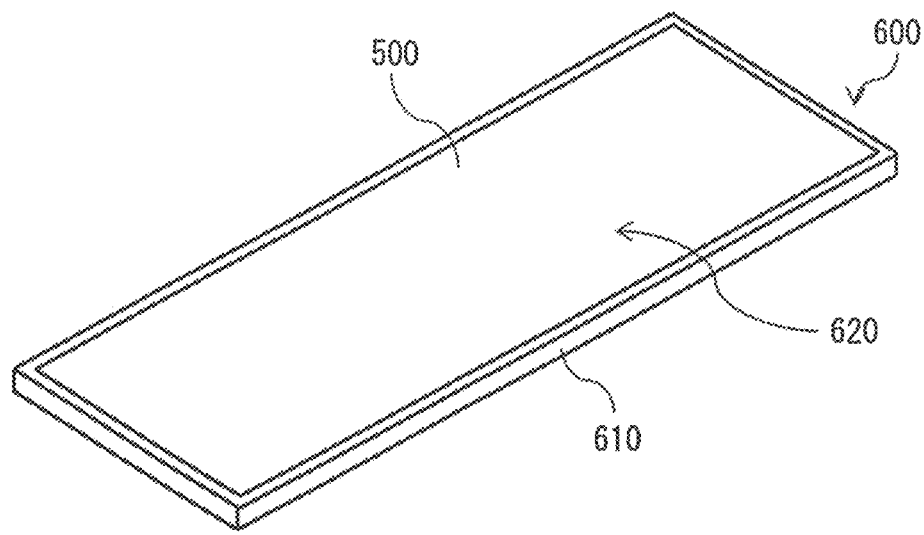
FIG. 49 illustrates a perspective view of an example appearance of an electronic apparatus having a light emission unit according to one embodiment of the disclosure.

FIG. 49 illustrates a perspective view of an appearance of an electronic apparatus 600 according to this application example. The electronic apparatus 600 may be, for example, a sheet-like personal computer having a display surface 620 at a main surface of a casing 610. The electronic apparatus 600 may have the light emission unit 500 according to the third example embodiment and the modification examples of the third example embodiment, at the display surface 620 thereof. The light emission unit 500 according to the third example embodiment and the modification examples of the third example embodiment may be disposed such that the light emission panel 510 faces the outside. In this application example, the light emission unit 500 according to the third example embodiment and the modification examples of the third example embodiment is provided at the display surface 620, and therefore, the electronic apparatus 600 has high display quality.

Second Application Example

Described below is an application example of the light emission unit 500 according to the third example embodiment and the modification examples of the third example embodiment. The light emission unit 500 according to the third example embodiment and the modification examples of the third example embodiment may be used as a light source of a lighting apparatus in any field, such as a desktop lighting apparatus, a floor lighting apparatus, or an indoor lighting apparatus.

Figure 50:
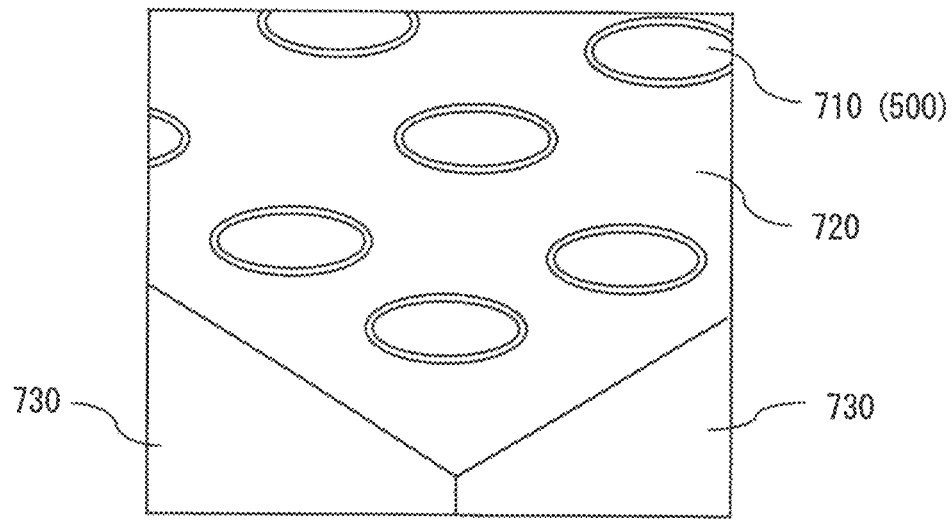
FIG. 50 illustrates a perspective view of an example appearance of a lighting apparatus having a light emission unit according to one embodiment of the disclosure.

FIG. 50 illustrates an appearance of an indoor lighting apparatus that uses the light emission unit 500 according to the third example embodiment and the modification examples of the third example embodiment. This lighting apparatus may, for example, include a lighting unit 710 that has the light emission unit 500 according to the third example embodiment and the modification examples of the third example embodiment. An appropriate number of the lighting units 710 may be arranged with an appropriate distance on a ceiling 720 in a building. The lighting unit 710 may also be placed at any site such as a wall 730 or an unillustrated floor according to the purpose of use, in addition to or instead of the ceiling 720.

Such a lighting apparatus may perform lighting using light from the light emission unit 500 according to the third example embodiment and the modification examples of the third example embodiment. Thus, a lighting apparatus having high lighting quality is achieved.

Although description has been given hereinabove with reference to the third example embodiment and the modification examples of the third example embodiment, the technology is not limited to the foregoing example embodiments, but may be modified in a wide variety of ways. The effects described in the foregoing example embodiments are mere examples. The effects of the disclosure are not limited to the effects described in the specification. The effects according to the example embodiments of the disclosure may be other effects, or may further include other effects in addition to the effects described hereinabove.

The disclosure may also have the following configurations.
(1) A display unit including:
multiple pixels each having a light emission region and a non-light emission region along a first direction;
a first electrode provided in the light emission region in each of the multiple pixels;
a partition wall provided between each two of the pixels that are adjacent to each other in a second direction, the second direction intersecting the first direction;
a light emission layer covering the first electrode and provided in the light emission region and the non-light emission region in a continuous manner; and
a second electrode facing the first electrode across the light emission layer.
(2) The display unit according to (1), further including:
a substrate;
a thin film transistor provided on the substrate; and
an insulation layer that covers the thin film transistor and has a contact hole connecting the thin film transistor and the first electrode,
the thin film transistor, the insulation layer, the first electrode, the light emission layer, and the second electrode being provided on the substrate, in this order from the substrate.
(3) The display unit according to (1) or (2), in which the partition wall extends in the first direction.
(4) The display unit according to any one of (1) to (3), in which the partition wall is provided in a stripe form.

(5) The display unit according to any one of (1) to (4), in which the light emission layer includes an organic luminescent material.
(6) The display unit according to any one of (1) to (5), in which the light emission layer includes a coated layer.
(7) The display unit according to any one of (1) to (6), further including a first electrode that has a different dimension from the first electrode in the first direction.
(8) The display unit according to any one of (1) to (7), further including a first electrode that has a different dimension from the first electrode in the second direction.
(9) The display unit according to (2), further including a short-circuit prevention layer disposed in a vicinity of a boundary between the light emission region and the non-light emission region in one or both of each of the pixels and a region between each two of the pixels adjacent to each other, the short-circuit prevention layer covering a surface and an end of the first electrode.
(10) The display unit according to (9), in which at least a part of the short-circuit prevention layer faces the contact hole of the insulation layer.
(11) The display unit according to (9) or (10), in which the short-circuit prevention layer is provided between the first electrode and the light emission layer.
(12) The display unit according to any one of (9) to (11), in which the short-circuit prevention layer includes an insulating material having visible-light transmissivity.
(13) The display unit according to any one of (9) to (12), in which the short-circuit prevention layer extends from the vicinity of the boundary between the light emission region and the non-light emission region to the non-light emission region.
(14) A method of manufacturing a display unit including:
  forming a first electrode in a light emission region in each of pixels that has the light emission region and a non-light emission region along a first direction;
  forming a partition wall between each two of the pixels that are adjacent to each other in a second direction, the second direction intersecting the first direction;
  forming a light emission layer in the light emission region and the non-light emission region in a continuous manner to cover the first electrode; and
  forming a second electrode that faces the first electrode across the light emission layer.
(15) The method of manufacturing the display unit according to (14), in which the light emission layer is formed by coating.
(16) A light emission unit including multiple display pixels arranged in a matrix on a substrate,
  each of the display pixels including multiple subpixels that emit light of colors different from one another,
  each of the subpixels having a light emission region facing a pixel electrode, a visible-light transmission region provided in a periphery of the light emission region, and a light emission layer extending across the light emission region and the visible-light transmission region,
  the visible-light transmission region in each of the subpixels being located relative to the light emission region in a first array direction of the multiple display pixels.
(17) The light emission unit according to (16), in which the visible-light transmission region in each of the subpixels is provided at each side of the light transmission region in the first array direction.
(18) The light emission unit according to (16) or (17), in which the organic light emission layer includes a coated film.
(19) The light emission unit according to any one of (16) to (18), further including multiple first walls that partition the multiple subpixels in the first array direction.
(20) The light emission unit according to (19), further including a second wall partitioning each two of the subpixels that are adjacent to each other in a region interposed between two of the first walls adjacent to each other, the second wall being lower than the first wall,
  the light emission layer being provided between each two of the subpixels that are adjacent to each other across the second wall.
(21) The light emission unit according to (19), further including multiple non-display pixels that have light transmissivity and are arranged in a matrix on the substrate,
  the multiple non-display pixels and the multiple display pixels being alternately arranged in a second array direction, the second array direction being perpendicular to the first array direction.
(22) The light emission unit according to (21), further including a third wall that partitions the subpixels and the non-display pixels in the second array direction, and is lower than the first wall,
  the organic light emission layer extending across the third wall from each of the subpixels to corresponding one of the non-display pixels.
(23) The light emission unit according to any one of (16) to (22), in which the substrate includes a visible-light transmissive substrate.
(24) An electronic apparatus including:
  a light emission unit; and
  a drive circuit that drives the light emission unit,
  the light emission unit including multiple display pixels that are arranged in a matrix on a substrate,
  each of the display pixels including multiple subpixels that emit light of colors different from one another,
  each of the subpixels having a light emission region that includes a pixel electrode, a light transmission region that is provided in a periphery of the light emission region, and an organic light emission layer that is provided across the light emission region and the light transmission region,
  the light transmission region being located relative to the light emission region in a first array direction of the multiple display pixels, in each of the subpixels.
(25) A light emission unit including multiple color pixels arranged in a matrix on a substrate,
  each of the color pixels including multiple subpixels and multiple non-light emission pixels, the multiple subpixels emitting light of colors different from one another, the multiple non-light emission pixels each having a visible-light transmission region,
  one or more of the subpixels and one or more of the non-light emission pixels being alternately arranged on a color pixel basis in a first array direction of the multiple color pixels,
  one or more of the subpixels and one or more of the non-light emission pixels being alternately arranged in a unit of two color pixels in a second array direction of the multiple color pixels.
(26) The light emission unit according to (25), in which
  each of the subpixels includes an organic light emission layer,
  each of the non-light emission pixels and corresponding one of the subpixels are adjacent to each other in the first array direction, and
  each of the non-light emission pixels and corresponding one of the subpixels share the organic light emission layer.

(27) The light emission unit according to (26), in which
a first non-light emission pixel is included in one of the color pixels,
a second non-light emission pixel is included in another of the color pixels adjacent to the one color pixel in the first array direction, and
the first non-light emission pixel and the second non-light emission pixel are adjacent to each other.
(28) The light emission unit according to (27), in which the first non-light emission pixel and corresponding one of the subpixels that is adjacent to the first non-light emission pixel share the organic light emission layer, and
the second non-light emission pixel and corresponding one of the subpixels that is adjacent to the second non-light emission pixel share the organic light emission layer.
(29) The light emission unit according to (25), in which
each of the subpixels includes an organic light emission layer,
each of the non-light emission pixels and corresponding one of the subpixels are adjacent in the second direction, and
each of the non-light emission pixels and corresponding one of the subpixels share the organic light emission layer.
(30) The light emission unit according to any one of (26) to (28), in which
each of the non-light emission pixels and corresponding one of the subpixels are adjacent in the second direction, and
each of the non-light emission pixels and corresponding one of the subpixels share the organic light emission layer.
(31) The light emission unit according to any one of (26) to (30), in which the organic light emission layer includes a coated film.
(32) The light emission unit according to any one of (26) to (31), further including multiple first walls that partition the multiple subpixels in the first array direction.
(33) The light emission unit according to (32), further including a second wall that partitions each two of the subpixels that are adjacent to each other in a region interposed between two of the first walls adjacent to each other, and is lower than the first wall,
the organic light emission layer being provided across the second wall between each two of the subpixels that are adjacent to each other, and being provided across the second wall between one of the subpixels and corresponding one of the non-light emission pixels that are adjacent to each other.
(34) The light emission unit according to any one of (25) to (33), in which the substrate includes a visible light transmissive substrate.
(35) An electronic apparatus including:
a light emission unit; and
a drive circuit that drives the light emission unit,
the light emission unit including multiple color pixels that are arranged in a matrix on a substrate,
each of the color pixels including multiple subpixels that emit light of colors different from one another, and multiple non-light emission pixels each having a visible-light transmission region,
one or more of the subpixels and one or more of the non-light emission pixels being alternately arranged on a color pixel basis in a first array direction of the multiple color pixels, and
one or more of the subpixels and one or more of the non-light emission pixels being alternately arranged in a unit of two color pixels in a second array direction of the multiple color pixels.
The display unit according to an example embodiment of the disclosure has the light emission layer that is continuously provided in the light emission region and the non-light emission region. This structure suppresses variation in the thickness of the light emission layer in each of the light emission regions.
The light emission unit according to an example embodiment of the disclosure has the light emission region and the visible-light transmission region that are provided to each of the subpixels and that share the organic light emission layer. The visible-light transmission region in each of the subpixels is provided relative to the light emission region in the first array direction of the multiple display pixels. Compared with a case of providing the subpixel having a light transmission region, with respect to each of the display pixels, this structure enables increasing dimensions of the subpixel while providing the visible-light transmission region in the display pixel.
In the light emission unit according to an example embodiment of the disclosure, one or more of the subpixels and one or more of the non-light emission pixels are alternately arranged on a color pixel basis in the first array direction. Furthermore, one or more of the subpixels and one or more of the non-light emission pixels are alternately arranged in a unit of two color pixels in the second array direction. That is, one or more of the subpixels and one or more of the non-light emission pixels are alternately arranged in each of the first array direction and the second array direction. This structure enables providing a light transmission region with a sufficient width in each of the first array direction and the second array direction.
In the display unit according to an example embodiment of the disclosure, the light emission layer is provided in the light emission region and the non-light emission region in a continuous manner, thereby suppressing a decrease in an effective light emission region, which occurs due to variation in the thickness of the light emission layer. Thus, a sufficient amount of light is extracted from the light emission region in each of the pixels.
In the light emission unit according to an example embodiment of the disclosure, dimensions of the subpixel are increased while providing the visible-light transmission region in the display pixel, compared with a case of providing the subpixel having a light transmission region, with respect to each of the display pixels. Thus, for example, in a case of forming the organic light emission layer by coating, the organic light emission layer in each of the subpixels is made to have a more uniform film thickness, thereby decreasing a possibility of mixing colors between adjacent subpixels. As a result, display unevenness such as luminance unevenness and color reproduction unevenness is decreased.
In the light emission unit according to an example embodiment of the disclosure, a light transmission region with a sufficient width is provided in each of the first array direction and the second array direction. This structure decreases generation of optical diffraction failure.
The effects of the embodiments of the disclosure are not limited to the effects described hereinabove and may have any of the effects described in the disclosure.
Although the disclosure has been described in terms of example embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc. are used to distinguish one element from another. The term "disposed on/provided on/formed on" and its variants as used herein shall refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. A display unit comprising:
multiple pixels each having a light emission region and a non-light emission region along a first direction;
a first electrode in the light emission region in each of the multiple pixels, wherein the non-light emission region in each of the multiple pixels is free of the first electrode;
a partition wall between each two of the pixels that are adjacent to each other in a second direction, the second direction intersecting the first direction;
a light emission layer covering the first electrode and in the light emission region and the non-light emission region in a continuous manner, wherein the light emission layer directly contacts a sidewall of the first electrode, and the sidewall is perpendicular to a top of a substrate; and
a second electrode facing the first electrode across the light emission layer.

2. The display unit according to claim 1, further comprising:
a substrate;
a thin film transistor provided on the substrate; and
an insulation layer that covers the thin film transistor and has a contact hole connecting the thin film transistor and the first electrode,
the thin film transistor, the insulation layer, the first electrode, the light emission layer, and the second electrode being provided on the substrate, in this order from the substrate.

3. The display unit according to claim 1, wherein the partition wall extends in the first direction.

4. The display unit according to claim 1, wherein the light emission layer includes an organic luminescent material.

5. The display unit according to claim 1, wherein the light emission layer comprises a coated layer.

6. The display unit according to claim 2, further comprising a short-circuit prevention layer disposed in a vicinity of a boundary between the light emission region and the non-light emission region in one or both of each of the pixels and a region between each two of the pixels adjacent to each other, the short-circuit prevention layer covering a surface and an end of the first electrode.

7. The display unit according to claim 6, wherein at least a part of the short-circuit prevention layer faces the contact hole of the insulation layer.

8. The display unit according to claim 6, wherein the short-circuit prevention layer is provided between the first electrode and the light emission layer.

9. The display unit according to claim 6, wherein the short-circuit prevention layer extends from the vicinity of the boundary between the light emission region and the non-light emission region to the non-light emission region.

10. A light emission unit comprising multiple display pixels arranged in a matrix on a substrate,
each of the display pixels including multiple subpixels that emit light of colors different from one another, each of the subpixels having a light emission region and a visible-light transmission region in a periphery of the light emission region, a light emission layer extending across the light emission region and the visible-light transmission region, an electrode over the light emission layer, and an entirety of the electrode extending across the light emission region and the visible-light transmission region,
the visible-light transmission region in each of the subpixels being located relative to the light emission region in a first array direction of the multiple display pixels.

11. The light emission unit according to claim 10, wherein the visible-light transmission region in each of the subpixels is provided at each side of the light transmission region in the first array direction.

12. The light emission unit according to claim 10, further comprising multiple first walls that partition the multiple subpixels in the first array direction.

13. The light emission unit according to claim 12, further comprising a second wall partitioning two of the subpixels that are adjacent to each other in a region interposed between two of the first walls adjacent to each other, the second wall being lower than the first wall,
the light emission layer being provided between each two of the subpixels that are adjacent to each other across the second wall.

14. The light emission unit according to claim 12, further comprising multiple non-display pixels that have light transmissivity and are arranged in a matrix on the substrate,
the multiple non-display pixels and the multiple display pixels being alternately arranged in a second array direction, the second array direction being perpendicular to the first array direction.

15. A light emission unit comprising multiple color pixels arranged in a matrix on a substrate,
each of the color pixels including multiple subpixels and multiple non-light emission pixels, the multiple subpixels emitting light of colors different from one another, the multiple non-light emission pixels each having a visible-light transmission region, wherein each of the multiple subpixels includes a first electrode, an organic light emission layer and a second electrode, the first electrode is closer to a substrate than the second electrode, and an entirety of the second electrode extends continuously in the multiple subpixels and in the multiple non-light emission pixels,
one or more of the subpixels and one or more of the non-light emission pixels being alternately arranged on a color pixel basis in a first array direction of the multiple color pixels,
one or more of the subpixels and one or more of the non-light emission pixels being alternately arranged in a unit of two color pixels in a second array direction of the multiple color pixels, and
each of the non-light emission pixels and corresponding one of the subpixels share the organic light emission layer.

16. The light emission unit according to claim 15, wherein each of the non-light emission pixels and corresponding one of the subpixels are adjacent to each other in the first array direction.

17. The light emission unit according to claim 16, wherein a first non-light emission pixel is included in one of the color pixels, a second non-light emission pixel is included in another of the color pixels adjacent to the one color pixel in the first array direction, and the first non-light emission pixel and the second non-light emission pixel are adjacent to each other.

18. The light emission unit according to claim 15, wherein each of the non-light emission pixels and corresponding one of the subpixels are adjacent in the second direction.

19. The light emission unit according to claim 16, wherein each of the non-light emission pixels and corresponding one of the subpixels are adjacent in the second direction.

20. The light emission unit according to claim 16, further comprising multiple first walls that partition the multiple subpixels in the first array direction.

* * * * *